(12) United States Patent
Hosoya et al.

(10) Patent No.: US 8,541,785 B2
(45) Date of Patent: Sep. 24, 2013

(54) DISPLAY DEVICE

(75) Inventors: Kunio Hosoya, Atsugi (JP); Saishi Fujikawa, Atsugi (JP); Yukie Suzuki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 651 days.

(21) Appl. No.: 12/366,067

(22) Filed: Feb. 5, 2009

(65) Prior Publication Data

US 2009/0206342 A1 Aug. 20, 2009

(30) Foreign Application Priority Data

Feb. 15, 2008 (JP) ................. 2008-034724

(51) Int. Cl.
*H01L 27/14* (2006.01)
(52) U.S. Cl.
USPC ............ 257/72; 257/E29.273; 257/356
(58) Field of Classification Search
USPC ............ 257/72, E29.273, 356–360
See application file for complete search history.

(56) References Cited

U.S. PATENT DOCUMENTS

| 4,409,134 | A |   | 10/1983 | Yamazaki |
| 5,141,898 | A | * | 8/1992  | Lapham ............... 438/598 |
| 5,313,319 | A | * | 5/1994  | Salisbury ............. 349/40 |
| 5,453,858 | A |   | 9/1995  | Yamazaki |
| 5,701,167 | A |   | 12/1997 | Yamazaki |
| 5,834,797 | A | * | 11/1998 | Yamanaka ........... 257/57 |
| 5,849,601 | A |   | 12/1998 | Yamazaki |
| 6,023,075 | A |   | 2/2000  | Yamazaki |
| 6,055,034 | A |   | 4/2000  | Zhang et al. |
| 6,124,604 | A |   | 9/2000  | Koyama et al. |
| 6,252,249 | B1 |  | 6/2001  | Yamazaki |
| 6,306,213 | B1 |  | 10/2001 | Yamazaki |
| 6,310,670 | B1 | * | 10/2001 | Lee ................. 349/43 |
| 6,411,351 | B1 |  | 6/2002  | Zhang et al. |
| 6,911,688 | B2 |  | 6/2005  | Yamazaki et al. |
| 7,067,844 | B2 |  | 6/2006  | Yamazaki |
| 7,067,845 | B2 |  | 6/2006  | Murakami et al. |
| 7,098,479 | B1 |  | 8/2006  | Yamazaki |
| 7,115,902 | B1 |  | 10/2006 | Yamazaki |
| 7,148,510 | B2 |  | 12/2006 | Yamazaki et al. |
| 7,158,194 | B2 |  | 1/2007  | Lo et al. |
| 7,314,774 | B2 |  | 1/2008  | Murakami et al. |
| 7,375,376 | B2 |  | 5/2008  | Yamazaki et al. |

(Continued)

FOREIGN PATENT DOCUMENTS

| JP | 59-072152 A | 4/1984 |
| JP | 04-242724   | 8/1992 |

(Continued)

OTHER PUBLICATIONS

Oughstun "Conservation of Charge," University of Vermont EE 141 Lecture Notes, 2009.*

*Primary Examiner* — Matthew Reames
(74) *Attorney, Agent, or Firm* — Eric J. Robinson; Robinson Intellectual Property Law Office, P.C.

(57) ABSTRACT

An object is to reduce an occupied area of a protection circuit. Another object is to increase the reliability of a display device including the protection circuit. The protection circuit includes a first wiring over a substrate, an insulating film over the first wiring, and a second wiring over the insulating film.

12 Claims, 25 Drawing Sheets

(56) References Cited

U.S. PATENT DOCUMENTS

| | | | |
|---|---|---|---|
| 7,843,519 B2 * | 11/2010 | He et al. | 349/38 |
| 8,048,735 B2 | 11/2011 | Takeda et al. | |
| 2004/0031986 A1 * | 2/2004 | Yamazaki et al. | 257/315 |
| 2007/0018165 A1 | 1/2007 | Yamazaki | |
| 2008/0164478 A1 | 7/2008 | Murakami et al. | |
| 2008/0230871 A1 | 9/2008 | Yamazaki et al. | |
| 2009/0159885 A1 | 6/2009 | Yamazaki et al. | |

FOREIGN PATENT DOCUMENTS

| | | |
|---|---|---|
| JP | 06-317810 A | 11/1994 |
| JP | 07-181509 | 7/1995 |
| JP | 08-027597 | 1/1996 |
| JP | 08-027597 | 3/1996 |
| JP | 10-282525 A | 10/1998 |
| JP | 2005-049832 | 2/2005 |
| JP | 2008-010609 A | 1/2008 |

* cited by examiner

DISPLAY DEVICE

BACKGROUND OF THE INVENTION

1. Field of the Invention

The present invention relates to a protection circuit and a display device having thereof.

2. Description of the Related Art

In recent years, technology that is used to form thin film transistors using semiconductor thin films (with thicknesses of from several nanometers to several hundreds of nanometers, approximately) that are formed over substrates having an insulating surface has been attracting attention. Thin film transistors are applied to a wide range of electronic devices such as ICs or electro-optical devices, and prompt development of thin film transistors that are to be used as switching elements in display devices, in particular, is being pushed.

As a switching element in a display device, a thin film transistor including an amorphous semiconductor film, a thin film transistor including a polycrystalline semiconductor film in which the diameter of the crystal grain is 100 nm or more, or the like is used. As a switching element in a display device, further, a thin film transistor including a microcrystalline semiconductor film is used (see Reference 1: Japanese Published Patent Application No. H4-242724 and Reference 2: Japanese Published Patent Application No. 2005-049832).

In a semiconductor element typified by a thin film transistor, it is one of important objects in a manufacturing process of a semiconductor device that how an electrification phenomenon (charging) which leads to deterioration in an element or a dielectric breakdown is suppressed.

Causes and circumstances of charging are extremely complicated and diverse. A protection circuit using an impedance element such as a diode (a protection diode) or a resistor is used to prevent deterioration or a dielectric breakdown due to charging. When a discharging path is provided by using the protection circuit, charge accumulated in an insulating film can be prevented from being discharged near a semiconductor element or at the intersection of wirings, so that a phenomenon where the semiconductor element deteriorates or is damaged by discharge energy (ESD: electrostatic discharge) can be prevented (Reference 3: Japanese Published Patent Application No. H8-027597).

Further, when the protection circuit is provided, even when noise as well as a signal and power supply voltage is input, a malfunction of a circuit of the next stage due to the noise can be prevented and deterioration or damage of the semiconductor element due to the noise can be prevented.

SUMMARY OF THE INVENTION

A thin film transistor having an amorphous semiconductor film in a channel formation region has lower field effect mobility than a thin film transistor having a microcrystalline semiconductor film or a crystalline semiconductor film in a channel formation region. That is, current drive capability is low. Therefore, when a protection circuit is formed using a thin film transistor formed using an amorphous semiconductor film, a large-size thin film transistor is forced to be formed as countermeasure against an electrostatic breakdown, which leads to hindrance to narrower frame parts of a display device, unfortunately. In addition, in an inverted staggered thin film transistor, a source electrode and a drain electrode are overlapped with and electrically connected to an amorphous semiconductor film that is formed over a gate electrode or a scan line, with a gate insulating film interposed therebetween. Further, when a large-size thin film transistor is formed, there is a problem in that an area where a gate electrode or a scan line electrically connected to the gate electrode overlaps a source electrode or a drain electrode, or a signal line electrically connected to the source electrode or the drain electrode is increased, and electric capacitance between the scan line and the signal line is increased, whereby power consumption is increased.

When a resistor is used for a protection circuit, there are problems in that, in a similar manner to the case of a protection circuit where the resistor is short-circuited over a plane, it is necessary to have a sufficient area of the protection circuit, the occupied area of the protection circuit is large in an element substrate, and an area of a display portion is small.

In order to manufacture a display device through a small number of steps with high yield, it is preferable that a switching element in a pixel and a protection circuit be formed at the same time.

In view of the foregoing problems, an object is to improve electric characteristics of a protection circuit and to reduce an occupied area of the protection circuit in a display device. Another object is to increase the reliability of a display device having a thin film transistor.

A protection circuit includes a first wiring formed over a substrate, a second wiring intersecting the first wiring, and an insulating film formed between the first wiring and the second wiring. One of the first wiring and the second wiring projects into a side of the other of the first wiring and the second wiring at an intersection of the first wiring and the second wiring. The insulating film formed between the first wiring and the second wiring is provided with one of a depressed portion and a separation portion at the intersection of the first wiring and the second wiring. In this region, one of the first wiring and the second wiring projects into the side of the other of the first wiring and the second wiring.

A plurality of first wirings extending in a first direction and being lined up in a second direction intersecting the first direction over a substrate, a second wiring extending in the second direction over the substrate, and an insulating film that insulates the first wiring and the second wiring are formed. One of the first wiring and the second wiring projects into a side of the other of the first wiring and the second wiring at an intersection of the first wiring and the second wiring.

A protection circuit includes a plurality of first wirings and a first common line each extending in a first direction and being lined up in a second direction intersecting the first direction over a substrate, a plurality of second wirings and a second common line each extending in the second direction and being lined up in the first direction over the substrate, and an insulating film formed between the first wiring and the first common line, and the second wiring and the second common line. One of the first common line and the second wiring projects into a side of the other of the first common line and the second wiring at an intersection of the first common line and the second wiring. One of the second common line and the first wiring projects into a side of the other of the second common line and the first wiring at an intersection of the second common line and the first wiring.

A protection circuit includes a plurality of first wirings and a first common line each extending in a first direction and being lined up in a second direction intersecting the first direction over a substrate; a film formed over at least the first wiring and the first common line; an insulating film formed over the film; and a plurality of second wirings and a second common line each extending in the second direction and being lined up in the first direction, formed over the insulating film. The film formed over at least the first wiring and the first common line is provided with one of a depressed portion and a separation portion at an intersection of the first common line and the second wiring. The film formed over at least the first wiring and the first common line is provided with one of a depressed portion and a separation portion at an intersection of the second common line and the first wiring.

A protection circuit includes a plurality of first wirings and a first common line each extending in a first direction and being lined up in a second direction intersecting the first direction over a substrate; a film formed over at least the first wiring and the first common line; and a plurality of second wirings and a second common line each extending in the second direction and being lined up in the first direction, formed over the film. The film formed over at least the first wiring and the first common line is provided with one of a depressed portion and a separation portion at an intersection of the first common line and the second wiring. The film formed over at least the first wiring and the first common line is provided with one of a depressed portion and a separation portion at an intersection of the second common line and the first wiring. Note that as the film formed over at least the first wiring and the first common line, there are an insulating film, a semiconductor film, and the like.

A display device includes a pixel portion and a peripheral portion provided at a periphery of the pixel portion over a substrate. A thin film transistor and a pixel electrode connected to the thin film transistor are included in the pixel portion. A first wiring formed over the substrate, a second wiring intersecting the first wiring, and an insulating film formed between the first wiring and the second wiring are included in the peripheral portion of the pixel portion. One of the first wiring and the second wiring projects into a side of the other of the first wiring and the second wiring at an intersection of the first wiring and the second wiring.

A display device includes a pixel portion and a peripheral portion provided at a periphery of the pixel portion over a substrate. A plurality of first wirings extending in a first direction and being lined up in a second direction intersecting the first direction over the substrate, a second wiring extending in the second direction over the substrate, and an insulating film formed between the first wiring and the second wiring are provided. A thin film transistor and a pixel electrode connected to the thin film transistor are included in the pixel portion. One of the first wiring and the second wiring projects into a side of the other of the first wiring and the second wiring at an intersection of the first wiring and the second wiring in the peripheral portion.

A display device includes a pixel portion and a peripheral portion provided at a periphery of the pixel portion over a substrate. A plurality of first wirings and a first common line each extending in a first direction and being lined up in a second direction intersecting the first direction over the substrate, a plurality of second wirings and a second common line each extending in the second direction and being lined up in the first direction over the substrate, and an insulating film formed between the first wiring and the first common line and the second wiring and the second common line are provided. A thin film transistor and a pixel electrode connected to the thin film transistor are included in the pixel portion. One of the first common line and the second wiring projects into a side of the other of the first common line and the second wiring at an intersection of the first common line and the second wiring in the peripheral portion. One of the second common line and the first wiring projects into a side of the other of the second common line and the first wiring at an intersection of the second common line and the first wiring in the peripheral portion of the pixel portion.

A display device includes a pixel portion and a peripheral portion provided at a periphery of the pixel portion over a substrate. A plurality of first wirings and a first common line each extending in a first direction and being lined up in a second direction intersecting the first direction over the substrate; an insulating film covering the first wiring and the first common line; a film formed over at least the insulating film covering the first wiring and the first common line; and a plurality of second wirings and a second common line each extending in the second direction and being lined up in the first direction, formed over at least the film are provided. A thin film transistor and a pixel electrode connected to the thin film transistor are included in the pixel portion. The film formed over at least the insulating film covering the first wiring and the first common line is provided with one of a depressed portion and a separation portion at the intersection of the first common line and the second wiring in the peripheral portion. The film formed over at least the insulating film covering the first wiring and the first common line is provided with one of a depressed portion and a separation portion at the intersection of the second common line and the first wiring in the peripheral portion of the pixel portion.

A display device includes a pixel portion and a peripheral portion provided at a periphery of the pixel portion over a substrate. A plurality of first wirings and a first common line each extending in a first direction and being lined up in a second direction intersecting the first direction over the substrate, a film formed over at least the first wiring and the first common line, an insulating film formed over the film, and a plurality of second wirings and a second common line which are formed over the insulating film and each extend in the second direction and are lined up in the first direction are provided. A thin film transistor and a pixel electrode connected to the thin film transistor are included in the pixel portion. The film formed over at least the first wiring and the first common line is provided with one of a depressed portion and a separation portion at the intersection of the first common line and the second wiring in the peripheral portion. The film formed over at least the first wiring and the first common line is provided with one of a depressed portion and a separation portion at the intersection of the second common line and the first wiring in the peripheral portion of the pixel portion.

Note that in the above structure, the film formed over at least the insulating film covering the first wiring and the first common line or the film formed over at least the first wiring and the first common line is an insulating film, a semiconductor film, or a stack of an insulating film and a semiconductor film.

One side of the first common line and the second wiring may be tapered toward the other of the first common line and the second wiring. One side of the second common line and the first wiring may be tapered toward the other of the second common line and the first wiring.

The first common line may include a plurality of opening portions at the intersection of the first common line and the second wiring. The first wiring may include a plurality of opening portions at the intersection of the first wiring and the second common line.

At the intersection of the first common line and the second wiring, the angle that is made by the first common line and the second wiring is not limited to the case where the first common line and the second wiring overlap at 90°. In addition, at an intersection of the second common line and the first wiring, the angle that is made by the second common line and the first wiring is not limited to the case where the second common line and the first wiring overlap at 90°.

The first common line and the second common line are wirings formed in the peripheral portion of the pixel portion and are also referred to as common potential wirings. The first common line and the second common line are wirings used to prevent a switching element, typically, a thin film transistor from being damaged when excess current flows into the switching element, typically, the thin film transistor due to discharge caused by static electricity or the like from the first wiring and the second wiring. A signal having constant potential is input from the outside to the first common line and the second common line. Alternatively, the first common line and the second common line are connected to ground potential and have fixed potential.

Here, 'to be lined up' means that a plurality of elements is arranged in a row.

Here, a depressed portion is a region that is depressed compared to a peripheral region. The bottom of the depressed portion is connected to the peripheral region. The bottom of the depressed portion does not reach a layer below the object including the depressed portion. Also, the bottom of the depressed portion is not in contact with the layer below the object including the depressed portion. In other words, the layer below the object including the depressed portion is not exposed. To put it differently, the layer below the object including the depressed portion is not in contact with a layer with which the depressed portion is filled. Further, the layer below the object including the depressed portion is not in contact with a layer provided inside the depressed portion.

Here, an opening portion is referred to as a void or a portion that exposes a lower layer through an opening portion. In other words, the layer below the object including the depressed portion is exposed. To put it differently, the layer below the object including the depressed portion is in contact with a layer with which the depressed portion is filled.

The first wiring is a gate wiring. The second wiring is a source wiring. The thin film transistor is formed at the intersection of the first wiring and the second wiring.

The first wiring and the first common line are formed at the same time; therefore, the first wiring and the first common line are formed over the same layer. The second wiring and the second common line are formed at the same time; therefore, the second wiring and the second common line are formed over the same layer. The first wiring and the first common line are formed at the same time; therefore, the first wiring and the first common line are formed using the same material. The second wiring and the second common line are formed at the same time; therefore, the second wiring and the second common line are formed using the same material.

When one of the first common line and the second wiring projects into a side of the other of the first common line and the second wiring at the intersection of the first common line and the second wiring and high potential is applied to the second wiring, a dielectric breakdown occurs in the insulating film formed between the first common line and the second wiring, and current flows into the first common line. In addition, when one of the second common line and the first wiring projects into a side of the other of the second common line and the first wiring at the intersection of the second common line and the first wiring and high potential is applied to the first wiring, a dielectric breakdown occurs in the insulating film formed between the second common line and the first wiring, and current flows into the second common line. As a result, charge electrification and short circuit associated therewith in the thin film transistor in the pixel portion and at the intersection of the first wiring and the second wiring can be reduced.

In the above structure, a display device including the first wiring which serves as a scan line, the second wiring which serves as a signal line, and a switching element connected to a pixel electrode at the intersection of the scan line and the signal line may be formed. A protection circuit is formed between the scan line and the second common line that is formed at the same time as formation of the signal line. In addition, a protection circuit is formed between the signal line and the first common line that is formed at the same time as formation of the scan line.

Examples of the display device include a light-emitting device and a liquid crystal display device. The light-emitting device includes a light-emitting element, and the liquid crystal display device includes a liquid crystal element. The light-emitting element includes, in its category, an element whose luminance is controlled by current or voltage, and specifically includes organic electroluminescence (EL) and inorganic electroluminescence (EL).

In addition, the display device includes a panel in which a display element is sealed, and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or other states.

Note that a display device in this specification means an image display device, a light-emitting device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

Note that the terms first, second, third, to Nth (N is a natural number) which are used in this specification are used to avoid confusion among components, and the terms do not limit the components numerically. Spatially relative terms, such as "beneath", "below", "lower", "above", "upper", and the like may be used in this specification in order to simply describe one element or feature's relationship to another element(s) or feature(s) as illustrated in the drawings. It will be understood that the spatially relative terms are intended to include different orientations of the device in use or operation as well as the orientation illustrated in the drawings. For example, when the device in the drawings is turned over, elements described as "below" or "beneath" other elements or features would then be oriented "above" the other elements or features. Thus, the exemplary term "below" can include both an orientation of above and below. The device may be otherwise oriented (rotated 90° or at other orientations) and the spatially relative descriptors used herein interpreted accordingly. As used herein, the singular forms "a", "an", and "the" are intended to also include the plural forms, unless the context clearly indicates otherwise.

By forming the protection circuit at the intersection of two wirings (e.g., the wiring and the common line), an occupied area of the protection circuit can be reduced. In addition, the reliability of the display device having the switching element can be increased. Further, the frame of the display device can be narrowed.

DETAILED DESCRIPTION OF THE INVENTION

Embodiment Modes

Figure 1:
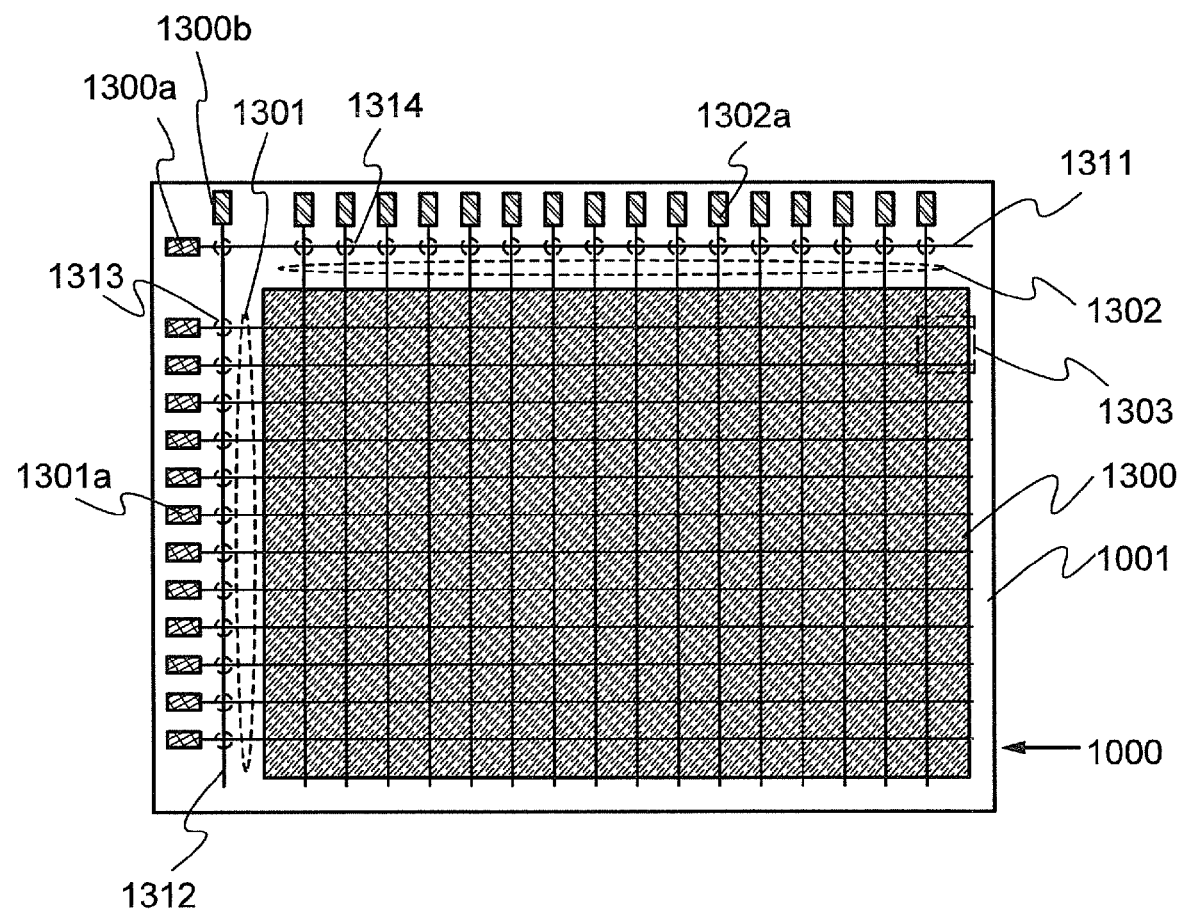
FIG. 1 is a plan view illustrating an element substrate having a protection circuit of an embodiment mode.

Hereinafter, embodiment modes will be described with reference to the drawings. Note that the embodiment modes are not limited to the following description, and it is easily understood by those skilled in the art that the modes and details disclosed herein can be modified in various ways without departing from the spirit and scope of the embodiment modes. Thus, the embodiment modes should not be taken as being limited to the following description of the embodiment modes. Note that the same reference numeral is commonly used to denote the same component among the different drawings in the structure of the embodiment modes described below.

(Embodiment Mode 1)

Here, a structure of a protection circuit is described. Note that in an element substrate 1000 illustrated in FIG. 1, a plurality of first wirings which extends in a first direction and is lined up in a second direction intersecting the first direction is referred to as scan lines, while a plurality of second wirings which extends in the second direction and is lined up in the first direction is referred to as signal lines. In a pixel provided in a pixel portion, the scan line is connected to a gate electrode in the case of an active matrix display device provided with a switching element that controls potential of a pixel electrode. Alternatively, part of the scan line functions as a gate electrode. Therefore, the first wiring is referred to as a gate wiring 1301 hereinafter. In addition, since the signal line is connected to a source of the switching element, the second wiring is referred to as a source wiring 1302 hereinafter. However, when the second wiring is connected to a drain of the switching element, the second wiring can be referred to as a drain wiring.

In this embodiment mode, in the element substrate 1000 illustrated in FIG. 1, a plurality of gate wirings 1301, a plurality of source wirings 1302 intersecting the plurality of gate wirings, a switching element provided at each intersection of the gate wirings 1301 and the source wirings 1302, and a pixel electrode connected to the switching element are formed. In addition, a pixel 1303 is formed using the switching element and the pixel electrode. An area where the pixels are arranged in matrix is a pixel portion 1300. The end portion of the gate wiring 1301 is provided with a gate wiring input terminal portion 1301a, and an end portion of the source wiring 1302 is provided with a source wiring input terminal portion 1302a. A first common line 1311 which is lined up along the gate wiring 1301 and intersects the source wiring with an insulating film interposed therebetween, and a second common line 1312 which is lined up along the source wiring 1302 and intersects the gate wiring with the insulating film interposed therebetween are formed between the gate wiring input terminal portion 1301a and the source wiring input terminal portion 1302a and the pixel portion. The end portion of the first common line 1311 is provided with a first common line input terminal portion 1300a (also simply referred to as a terminal portion 1300a), and the end portion of the second common line 1312 is provided with a second common line input terminal portion 1300b (also simply referred to as a terminal portion 1300a). In addition, the pixel is provided with a liquid crystal element or a light-emitting element. An IC (a semiconductor integrated circuit) or an FPC for input of a signal into the gate wiring is connected to the gate wiring input terminal portion 1301a. In addition, an IC (a semiconductor integrated circuit) or an FPC for input of a signal into the source wiring is connected to the source wiring input terminal portion 1302a. The first common line input terminal portion 1300a and the second common line input terminal portion 1300b are connected to respective FPCs, and constant potential is input to the first common line input terminal portion 1300a and the second common line input terminal portion 1300b. Further, current that flows into the first wiring and the second wiring is input to the FPCs. Note that the first common line input terminal portion 1300a and the second common line input terminal portion 1300b may be connected to ground potential and have fixed potential.

In a peripheral portion of the pixel portion 1300, a protection circuit 1313 is provided at each intersection of the gate wirings 1301 and the second common line 1312, and a protection circuit 1314 is provided at each intersection of the source wirings 1302 and the first common line 1311.

Next, a structure of the protection circuit 1313 is described.

Figure 2A:
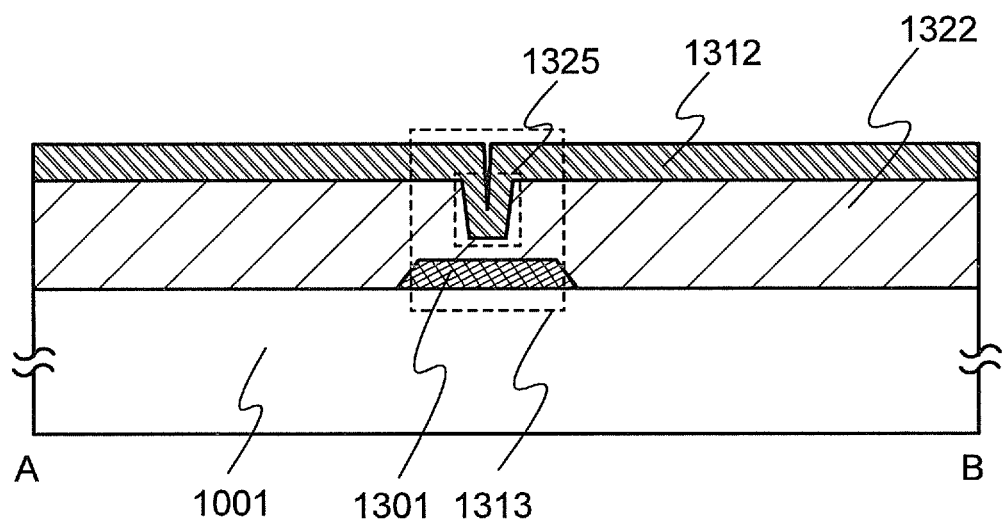
FIGS. 2A and 2B are a cross-sectional view and a plan view each illustrating a protection circuit of an embodiment mode.
Figure 2B:
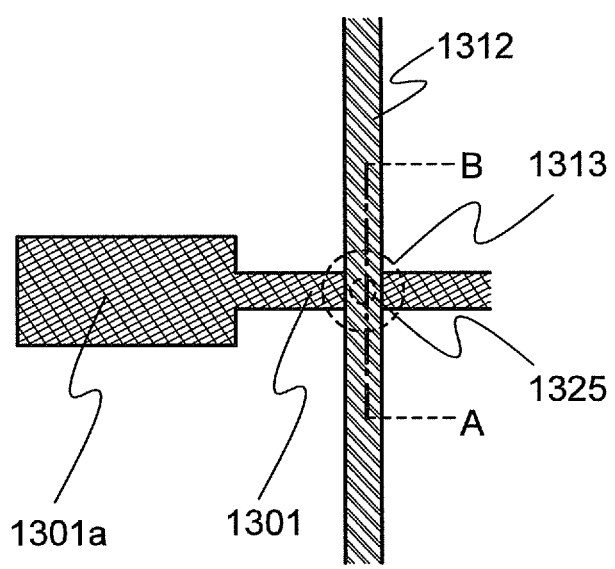

FIGS. 2A and 2B are a cross-sectional view and a plan view of the protection circuit 1313 described in this embodiment mode. FIG. 2A is a cross-sectional view taken along line A-B in the plan view of the intersection of the gate wiring 1301 and the second common line 1312 illustrated in FIG. 2B.

As illustrated in FIG. 2A, the gate wiring 1301 is formed over a substrate 1001, and an insulating film 1322 is formed to cover the gate wiring 1301. In addition, the insulating film 1322 is provided with a depressed portion 1325, which overlaps the gate wiring 1301. The second common line 1312 is formed over the insulating film 1322. The depressed portion 1325 in the insulating film 1322 is filled with a material that forms the second common line 1312; therefore, the second common line 1312 projects into the gate wiring 1301 side. In other words, the material that forms the second common line 1312 is provided inside the depressed portion 1325 in the insulating film 1322; therefore, the second common line 1312 projects into the gate wiring 1301 side. The protection circuit 1313 is formed using the gate wiring 1301, the insulating film 1322 having the depressed portion, and the second common line 1312.

When high voltage is applied to the gate wiring 1301, a dielectric breakdown occurs between the gate wiring 1301 and the second common line 1312, and current flows into the second common line 1312 in the protection circuit 1313 described in this embodiment mode. As a result, charge electrification and short circuit associated therewith in a thin film transistor in the pixel portion and at the intersection of the gate wiring 1301 and the source wiring 1302 can be reduced. Since the protection circuit is formed at the intersection of the gate wiring 1301 and the second common line 1312, an occupied area of the protection circuit in a plane can be reduced compared with a protection circuit in which discharge occurs between conductive films that face each other in a plane.

At this time, the second common line 1312 is preferably tapered toward the gate wiring 1301 side. That is, it is preferable that the depressed portion in the insulating film 1322 be a cone, a truncated cone, a pyramid with the polygon as its base, or a truncated polygonal pyramid which has an apex on the gate wiring 1301 side. When the second common line 1312 is formed in the depressed portion having such a shape, a dielectric breakdown easily occurs between the gate wiring 1301 and the second common line 1312, and charge electrification and short circuit associated therewith in the thin film transistor in the pixel portion and at the intersection of the gate wiring 1301 and the source wiring 1302 can be reduced.

As the substrate 1001, a plastic substrate having heat resistance that can withstand a processing temperature of this manufacturing process or the like as well as a non-alkaline glass substrate manufactured by a fusion method or a float method such as a substrate of barium borosilicate glass, aluminoborosilicate glass, or aluminosilicate glass, or a ceramic substrate can be used. Alternatively, a metal substrate such as a stainless steel alloy substrate, provided with an insulating film over its surface, may also be used.

The gate wiring 1301 and the first common line 1311 are formed using a metal material. As the metal material, aluminum, chromium, titanium, tantalum, molybdenum, copper, or the like is applied. For example, the gate wiring 1301 and the first common line 1311 are preferably formed using aluminum or a stacked structure of aluminum and a barrier metal. As the barrier metal, a refractory metal such as titanium, molybdenum, or chromium is applied. The barrier metal is preferably provided for preventing hillocks and oxidation of aluminum.

The gate wiring 1301 and the first common line 1311 are formed to have a thickness of equal to or more than 50 nm and equal to or less than 300 nm. The gate wiring 1301 and the first common line 1311 may be formed to have a thickness of equal to or more than 50 nm and equal to or less than 100 nm, whereby disconnection of a microcrystalline semiconductor film and a wiring which are to be formed later can be prevented. Further, the gate wiring 1301 and the first common line 1311 may be formed to have a thickness of equal to or more than 150 nm and equal to or less than 300 nm, whereby the resistivity of the gate wiring 1301 and the first common line 1311 can be reduced and an area can be increased.

Note that because a semiconductor film and a wiring are formed over the gate wiring 1301 and the first common line 1311, it is preferable that the gate wiring 1301 and the first common line 1311 be processed so that the end portions thereof are tapered in order to prevent disconnection. Further, although not illustrated, a capacitor wiring can also be formed in this step.

The insulating film 1322 can be formed using a silicon oxide film; a silicon nitride film; a silicon oxynitride film; a silicon nitride oxide film; an aluminum nitride film; another inorganic insulating film; an organic insulating film of polyimide, an epoxy resin, an acrylic resin, or the like. Here, the insulating film 1322 is formed with a single layer; however, it may have a stacked structure.

The second common line 1312 and the source wiring 1302 are preferably formed with a single layer or stacked layers using aluminum; copper; or an aluminum alloy to which a migration prevention metal, an element for improving heat resistance property, or an element for preventing hillocks, such as copper, silicon, titanium, neodymium, scandium, or molybdenum is added. Alternatively, a film formed using titanium, tantalum, molybdenum, tungsten, or a nitride of any of these elements and an aluminum film or an aluminum alloy film may be formed in this order on the insulating film 1322 side of each of the second common line 1312 and the source wiring 1302. Further alternatively, top and bottom surfaces of aluminum or an aluminum alloy may be each covered with titanium, tantalum, molybdenum, tungsten, or a nitride of any of these elements to form a stacked structure.

Figure 3A:
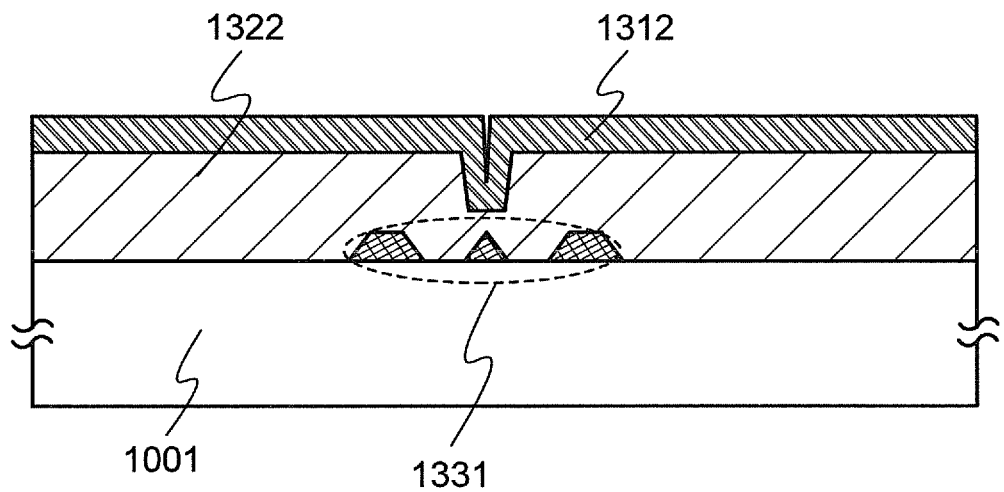
FIGS. 3A to 3C are a cross-sectional view and plan views each illustrating a protection circuit of an embodiment mode.
Figure 3B:
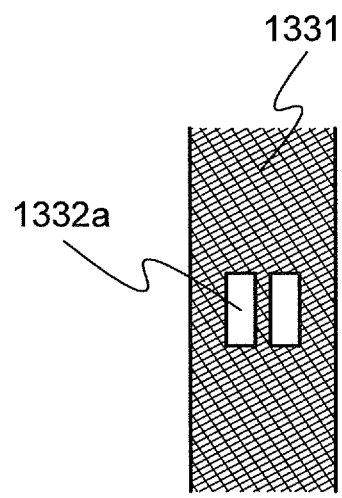
Figure 3C:
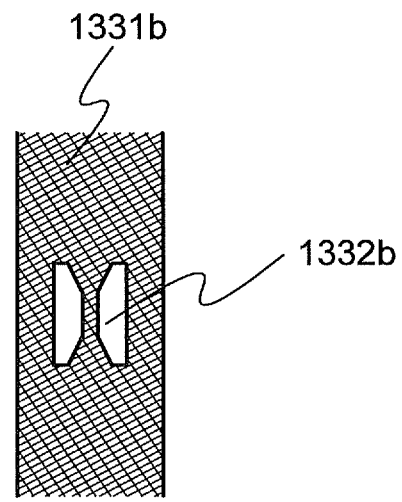

As illustrated in FIGS. 3A to 3C, a gate wiring 1331 may have a plurality of opening portions at an intersection with the second common line 1312. FIG. 3B illustrates a mode in which two rectangular opening portions 1332a are provided in a gate wiring 1331a, and FIG. 3C illustrates a mode in which two polygonal opening portions 1332b are provided in a gate wiring 1331b. When the opening portions are provided in the gate wiring 1331, the width of the gate wiring in a region between the opening portions is small, whereby the gate wiring has a projection shape. When a side surface of the gate wiring 1331 is formed to have a slant, as illustrated in FIG. 3A, the cross section of the gate wiring 1331 in the region between the opening portions has a projection shape tapered toward the second common line 1312 side. Therefore, the gate wiring 1331 and the second common line 1312 project each other with an insulating film interposed therebetween, whereby a dielectric breakdown easily occurs. Thus, charge electrification and short circuit associated therewith in the thin film transistor in the pixel portion and at the intersection of the gate wiring 1331 and the source wiring 1302 can be reduced.

In FIGS. 2A and 2B and FIGS. 3A to 3C, in a region where the gate wirings 1301 and 1331 and the second common line 1312 overlap each other, the insulating film having the depressed portion is formed. However, in FIGS. 2A and 2B, and FIGS. 3A to 3C, a first insulating film and a second insulating film are formed in a region where the gate wiring 1301 and the second common line 1312 overlap each other. One of the first insulating film and the second insulating film is separated into a plurality of films, and there is a separation portion 1328a between the separated films, as illustrated in FIGS. 4A to 4D. In the separation portion 1328a, the second common line 1312 can project into the gate wiring 1301 side.

Figure 4A:
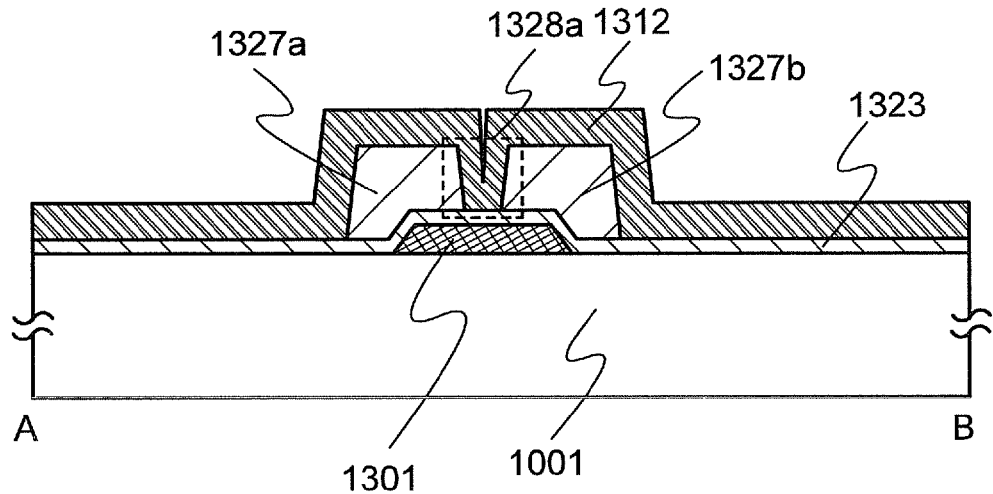
FIGS. 4A to 4D are a cross-sectional view and plan views each illustrating a protection circuit of an embodiment mode.

As illustrated in FIG. 4A, the gate wiring 1301 is formed over the substrate 1001 and a first insulating film 1323 is formed over the gate wiring 1301. In a region which is located over the first insulating film 1323 and overlaps part of the gate wiring 1301, second insulating films 1327a and 1327b are separated, and there is the separation portion 1328a between the second insulating films 1327a and 1327b. That is, the second insulating films 1327a and 1327b are provided with a constant distance above the gate wiring 1301. In addition, the second common line 1312 is formed over the first insulating film 1323, and the second insulating films 1327a and 1327b. The second common line 1312 is in contact with side surfaces of the separated second insulating films 1327a and 1327b. The second common line 1312 projects into the gate wiring 1301 side in the separation portion 1328a where the second insulating films 1327a and 1327b are separated from each other. Therefore, when high voltage is applied to the gate wiring 1301 due to static electricity or the like via the gate wiring input terminal portion 1301a, or when static electricity is generated in the switching element, a dielectric breakdown occurs between the gate wiring 1301 and the second common line 1312, and current flows into the second common line 1312. As a result, charge electrification and short circuit associated therewith in the switching element in the pixel portion and at the intersection of the gate wiring 1301 and the source wiring 1302 can be reduced.

It is preferable that side surfaces of the second insulating films 1327a and 1327b have a slant. As a result, the separation portion 1328a is tapered toward the gate wiring 1301 side. Therefore, when high voltage is applied to the gate wiring 1301, a dielectric breakdown easily occurs in the gate wiring 1301 and the second common line 1312, and short circuit at the intersection of the gate wiring 1301 and the source wiring and in the thin film transistor can be reduced.

Here, the case is described in which the second insulating films are separated, and the gate wiring and the second common line are separated from each other using the first insulating film. However, the case may be used in which the first insulating film is separated and the gate wiring and the second common line are insulated using the second insulating film.

The first insulating film 1323 or the second insulating films 1327a and 1327b can be formed using the inorganic insulating film and the organic insulating film which are used for an insulating film 1322, as appropriate. Note that as illustrated in FIGS. 4A to 4D, when the separated second insulating films are formed over the first insulating film, it is preferable that a material of each insulating film be selected so that the second insulating films are etched selectively. As an example, the first insulating film can be formed using an inorganic insulating film, and the second insulating films can be formed using organic insulating films.

Figure 4B:
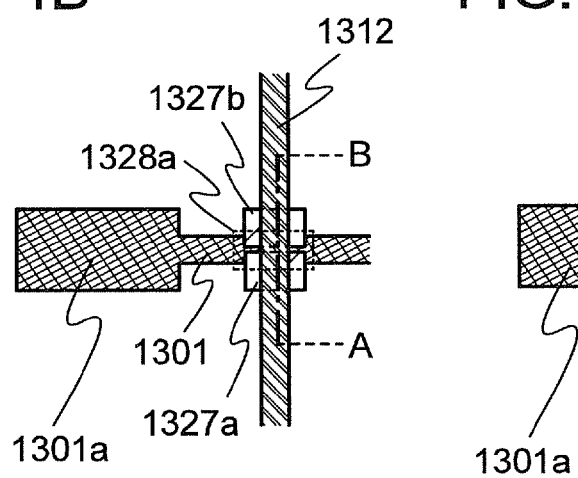
Figure 4C:
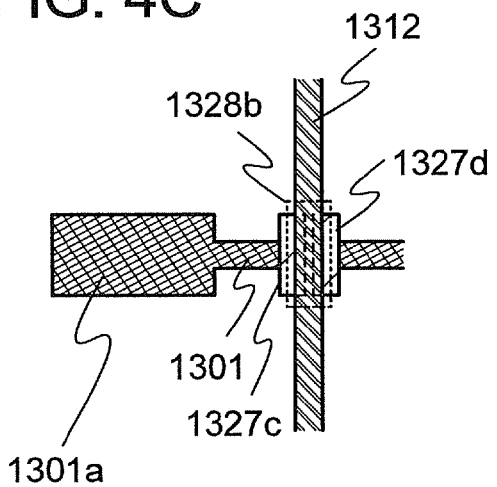
Figure 4D:
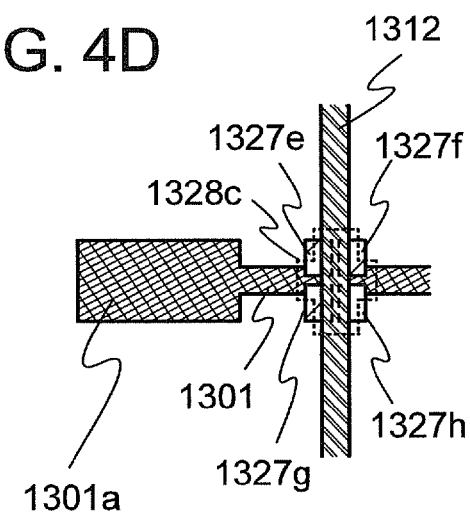

Note that in FIGS. 4A and 4B, the insulating film is separated in the direction along which the gate wiring extends (the separation portion 1328a). Instead of this, as illustrated in FIG. 4C, the insulating film may be separated in the direction along which the second common line 1312 extends (a separation portion 1328b). At this time, insulating layers 1327c and 1327d are formed. Further, as illustrated in FIG. 4D, the insulating film may be separated in both a direction along which the gate wiring 1301 extends and a direction along which the second common line 1312 extends (a separation portion 1328c). In this case, a cross-shaped separation portion is formed. In addition, insulating layers 1327e to 1327h are formed.

Note that here, the protection circuit 1313 is formed in the region where the gate wiring 1301 and the second common line 1312 overlap each other. The protection circuit 1314 formed in a region where the first common line 1311 and the source wiring 1302 overlap each other also has a shape similar to the structure of the protection circuit illustrated in FIGS. 2A and 2B and FIGS. 3A to 3C. In this case, the gate wirings 1301 and 1331 illustrated in FIGS. 2A and 2B, FIGS. 3A to 3C, and FIGS. 4A to 4D may be the first common line 1311, and the second common line 1312 illustrated in FIGS. 2A and 2B, FIGS. 3A to 3C, and FIGS. 4A to 4D may be the source wiring 1302. As a result, when the insulating film having a depressed portion is formed between the first common line 1311 and the source wiring 1302, and the source wiring is formed in the depressed portion, whereby a dielectric breakdown between the first common line 1311 and the source wiring 1302 easily occurs. Thus, charge electrification and short circuit associated therewith in the switching element in the pixel portion and at the intersection of the gate wiring 1301 and the source wiring 1302 can be reduced.

Note that this embodiment mode is described based on a mode of an active matrix display device provided with the switching element which controls potential of the pixel electrode in the pixel provided in the pixel portion. However, the protection circuit described in this embodiment mode can be provided in a mode of a passive matrix display device without a switching element in a pixel. In this case, a plurality of first wirings which extends in the first direction and is lined up in the second direction intersecting with the first direction can be referred to as one of a row wiring and a column wiring, while a plurality of second wirings which extends in the second direction and is lined up in the first direction can be referred to as the other of the row wiring and the column wiring.

The protection circuit of this embodiment mode is a protection circuit having a structure in which a dielectric breakdown can occur in directions above and below the substrate, that is, in the film thickness direction of a film formed over the substrate. Thus, the occupied area of the protection circuit can be reduced.

(Embodiment Mode 2)

In this embodiment mode, a method of manufacturing the protection circuit illustrated in FIGS. 2A and 2B and FIGS. 4A to 4D described in Embodiment Mode 1 will be described with reference to FIGS. 5A to 5D and FIGS. 6A to 6D.

Figure 5A:
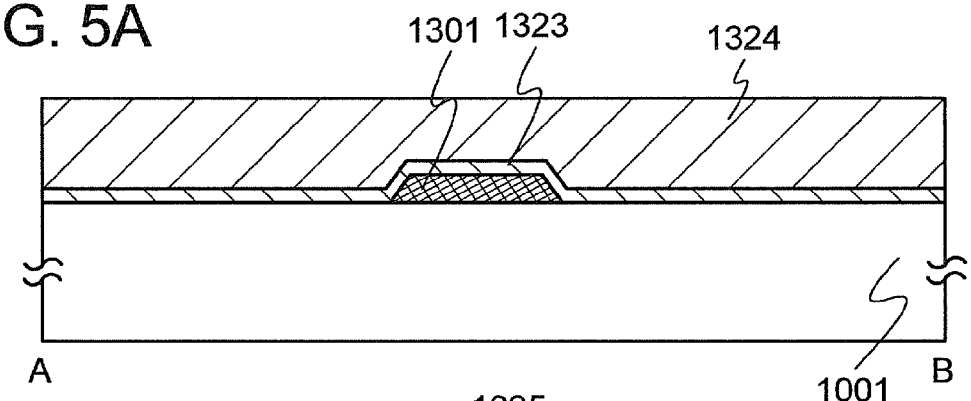
FIGS. 5A to 5D are cross-sectional views and a plan view illustrating a manufacturing process of a protection circuit of an embodiment mode.
Figure 5B:
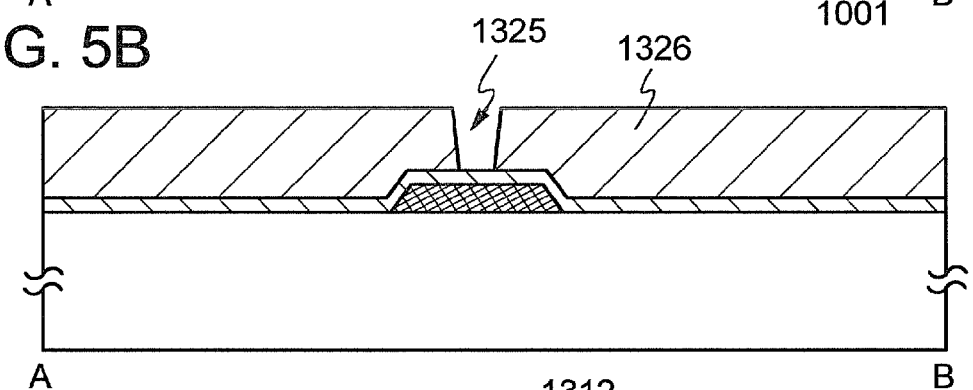
Figure 5C:
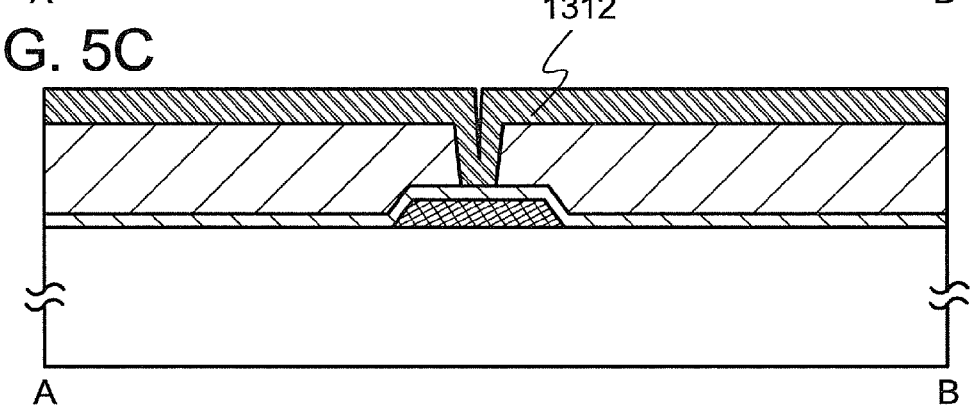
Figure 5D:
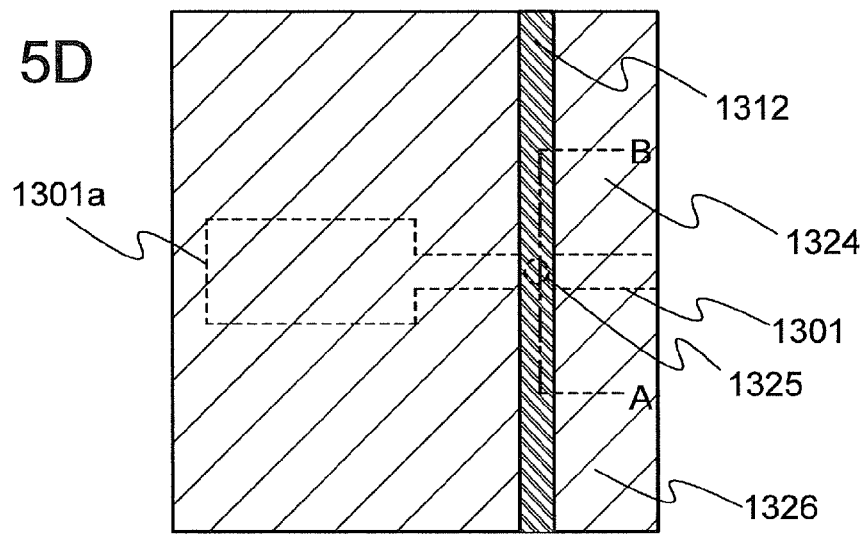

FIG. 5D is a plan view at the intersection of the gate wiring 1301 and the second common line 1312, and FIG. 5C illustrates a cross-sectional view taken along line A-B of FIG. 5D.

As illustrated in FIG. 5A, the gate wiring 1301 is formed over the substrate 1001. Next, the first insulating film 1323 is formed over the gate wiring 1301. Then, the second insulating film 1324 is formed over the first insulating film 1323. The first insulating film 1323 and the second insulating film 1324 may be formed using an insulating material, as appropriate.

However, it is preferable that a combination in which only the second insulating film 1324 can be selectively etched be used. For example, the first insulating film 1323 is formed using an inorganic insulating film, and the second insulating film 1324 is formed using a photosensitive resin. In this case, as the inorganic insulating film, there are silicon nitride, silicon oxide, silicon nitride oxide, silicon oxynitride, aluminum nitride, aluminum oxynitride, and the like. As the photosensitive resin, there are an acrylic resin, polyimide, siloxane polymer, and the like. With such a combination, the second insulating film 1324 is exposed to light to have a desired shape, and then the second insulating film 1324 is developed, whereby a depressed portion which exposes the first insulating film 1323 can be formed. Alternatively, the first insulating film 1323 may be formed using an inorganic insulating film, and the second insulating film 1324 may be formed using a non-photosensitive resin such as an acrylic resin, polyimide, or siloxane polymer. As a result, the second insulating film 1324 can be selectively subjected to dry etching or wet etching.

Next, as illustrated in FIG. 5B, the second insulating film 1324 is selectively etched, and the depressed portion 1325 which exposes the first insulating film 1323 is formed. That is, a second insulating film 1326 having an opening portion is formed.

Next, as illustrated in FIG. 5C, the second common line 1312 is formed over the exposed portion of the first insulating film 1323 and the second insulating film 1326. As a result, the second common line 1312 which projects into the gate wiring 1301 side can be formed. Since the second common line 1312 projects into the gate wiring 1301 side, a dielectric breakdown can occur at the intersection of the gate wiring 1301 and the second common line 1312. Therefore, even if high voltage is applied to the gate wiring 1301, current can flow into the second common line 1312, whereby short circuit in the switching element in the pixel portion or at the intersection of wirings can be reduced.

Note that in FIG. 5D, the top surface of the opening portion has a circular shape; however, an oval, a polygon, or the like can be used.

Next, a method of manufacturing the protection circuit illustrated in FIGS. 4A to 4D is described with reference to FIGS. 6A to 6D. FIGS. 6A to 6D are different from FIGS. 5A to 5D in that the second insulating films 1327a and 1327b are separated from each other.

Figure 6A:
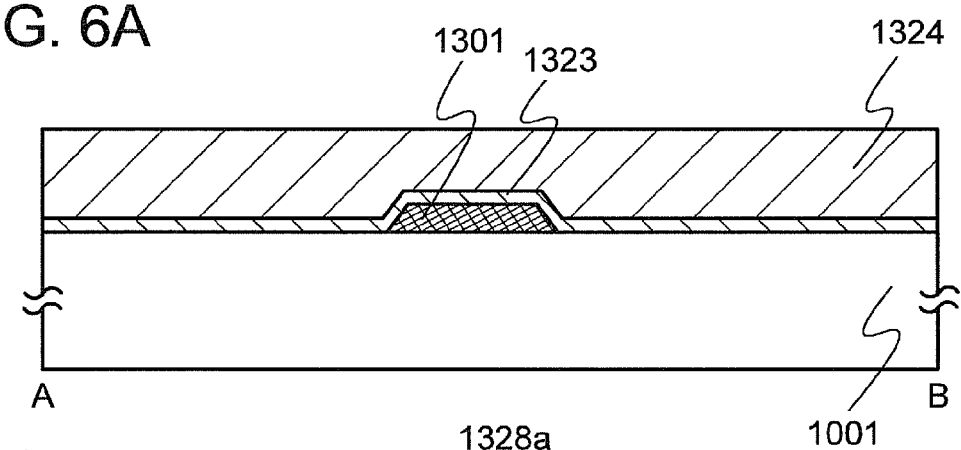
FIGS. 6A to 6D are cross-sectional views and a plan view illustrating a manufacturing process of a protection circuit of an embodiment mode.
Figure 6B:
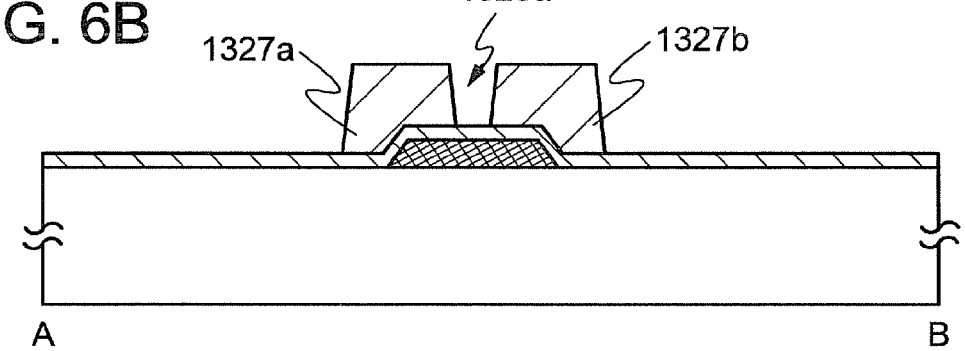
Figure 6C:
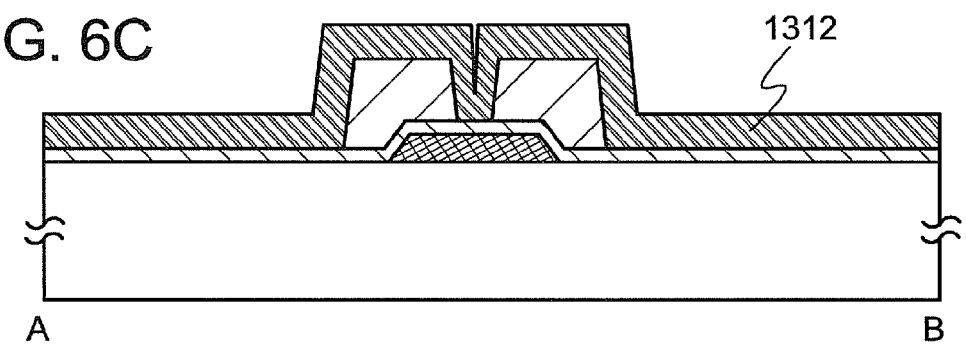
Figure 6D:
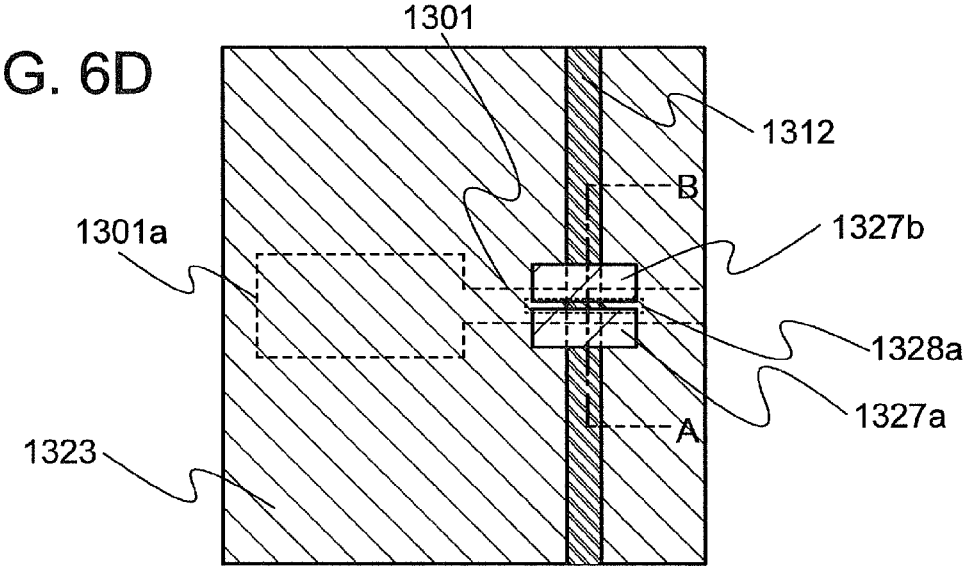

FIG. 6C is a cross-sectional view taken along line A-B of FIG. 6D.

As illustrated in FIG. 6A, the gate wiring 1301 is formed over the substrate 1001. Next, the first insulating film 1323 is formed over the gate wiring 1301. Then, the second insulating film 1324 is formed over the first insulating film 1323.

Next, as illustrated in FIG. 6B, the second insulating film 1324 is selectively etched, and the second insulating films 1327a and 1327b which are separated from each other are formed. The second insulating films 1327a and 1327b are separated from each other, and there is the separation portion 1328a over the gate wiring 1301 between the second insulating films 1327a and 1327b. Note that here, part of the second insulating film 1324 is removed, and the second insulating films 1327a and 1327b are formed; however, a composition may be selectively discharged by a droplet discharge method (ink-jet method) and burned to form the second insulating films 1327a and 1327b.

Next, as illustrated in FIG. 6C, the second common line 1312 is formed over the exposed portion of the first insulating film 1323 and the second insulating films 1327a and 1327b. As a result, the second common line 1312 which projects into the gate wiring 1301 side can be formed. Since the second common line 1312 projects into the gate wiring 1301 side, a dielectric breakdown can occur at the intersection of the gate wiring 1301 and the second common line 1312. Therefore, even if high voltage is applied to the gate wiring 1301, current can flow into the second common line 1312, whereby short circuit in the thin film transistor in the pixel portion or at the intersection of wirings can be reduced.

Note that in FIGS. 6A to 6D, the insulating film is separated in the direction along which the gate wiring extends (the separation portion 1328a). Instead of this, as illustrated in FIG. 4C, the insulating film may be separated in the direction along which the second common line 1312 extends (the separation portion 1328b). Further alternatively, as illustrated in FIG. 4D, the insulating film may be separated in both the direction along which the gate wiring 1301 extends and the direction along which the second common line 1312 extends (the separation portion 1328c). In this case, a cross-shaped separation portion is formed.

Here, the protection circuit is formed in the region where the gate wiring 1301 and the second common line 1312 overlap each other. The protection circuit formed in the region where the first common line 1311 and the source wiring 1302 overlap each other also has a shape similar to the structure of the protection circuit illustrated in FIGS. 2A and 2B and FIGS. 3A to 3C. In this case, the gate wiring 1301 illustrated in FIGS. 5A to 5D and FIGS. 6A to 6D may be the first common line 1311, and the second common line 1312 illustrated in FIGS. 5A to 5D and FIGS. 6A to 6D may be the source wiring 1302. As a result, when the insulating film having a depressed portion is formed between the first common line 1311 and the source wiring 1302, and when the source wiring is formed in the depressed portion, a dielectric breakdown between the first common line 1311 and the source wiring 1302 easily occurs. Thus, charge electrification and short circuit associated therewith in the thin film transistor in the pixel portion and at the intersection of the gate wiring 1301 and the source wiring 1302 can be reduced.

Through the above steps, the protection circuit can be formed in which a dielectric breakdown can occur in directions above and below the substrate, that is, in the film thickness direction of a film formed over the substrate. As a result, a protection circuit with a small occupied area can be formed.

(Embodiment Mode 3)

In this embodiment mode, a structure of a protection circuit will be described with reference to FIGS. 7A to 7C, FIG. 8, FIG. 9, FIGS. 10A to 10C, FIGS. 11A to 11C, and FIGS. 12A to 12C. In the protection circuit, a semiconductor film that has a depressed portion or is separated is formed above a gate wiring; a second common line is formed above the semiconductor film; and an insulating film that insulates the gate wiring and the second common line is formed between the gate wiring and the second common line.

Figure 7A:
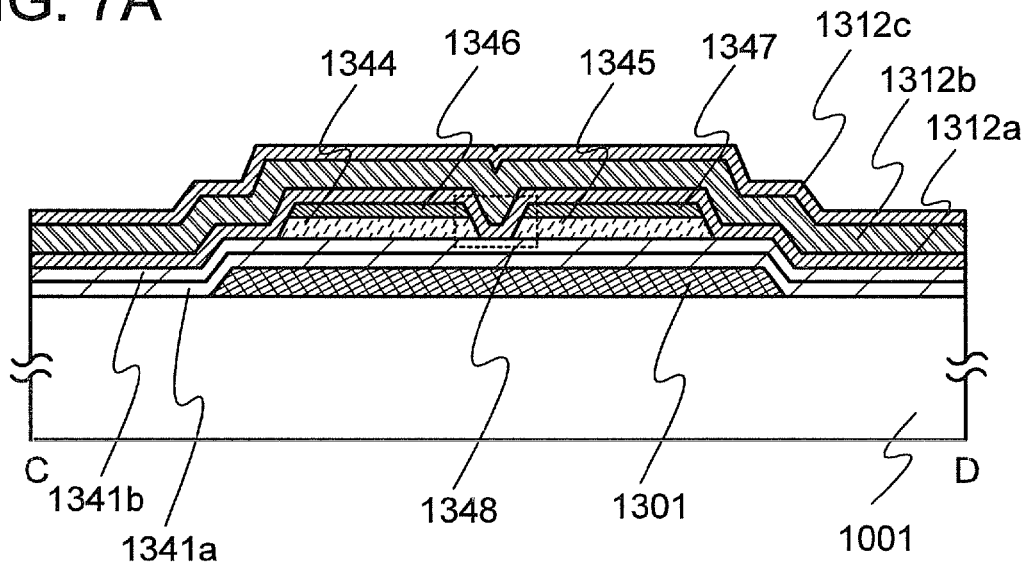
FIGS. 7A to 7C are a cross-sectional view and plan views illustrating a protection circuit of an embodiment mode.
Figure 7B:
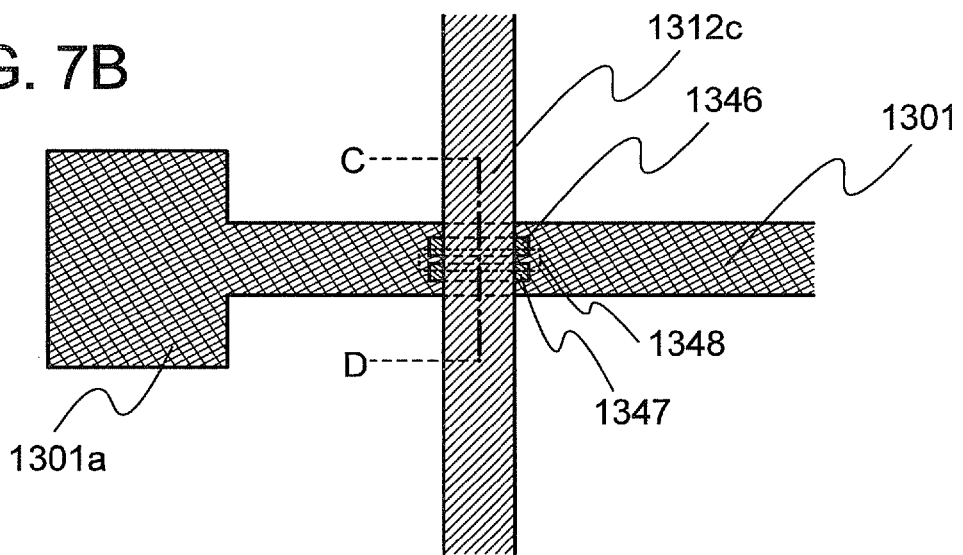
Figure 7C:
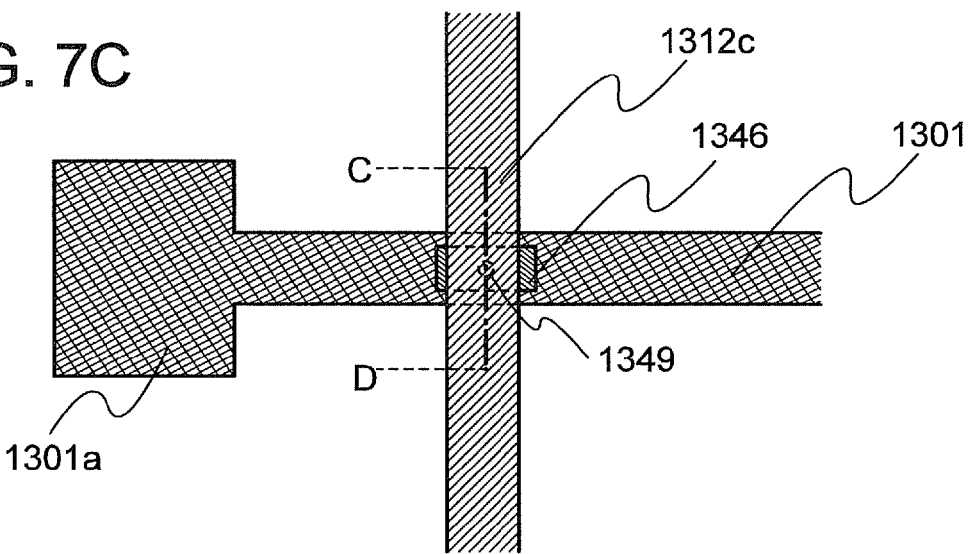

FIGS. 7B and 7C are plan views at the intersection of the gate wiring 1301 and the second common line 1312, and FIG. 7A illustrates a cross-sectional view taken along line C-D of FIG. 7B.

The gate wiring 1301 is formed over the substrate 1001, and insulating films 1341a and 1341b are formed to cover the gate wiring 1301. Over the insulating film 1341b, separated stacks of semiconductor films are formed. Here, a stack of an amorphous semiconductor film 1344 and a semiconductor film 1346 to which an impurity element imparting one conductivity type is added, and a stack of an amorphous semiconductor film 1345 and a semiconductor film 1347 to which an impurity element imparting one conductivity type is added are separated from each other (a separation portion 1348). In addition, the separation portion 1348 is formed over the gate wiring 1301. Note that the shapes of the separation portions 1328a to 1328c illustrated in FIGS. 4B to 4D described in Embodiment Mode 1 can be applied to the shape of the separation portion 1348.

Second common lines 1312a to 1312c are formed over the stacks of the semiconductor films and the insulating film 1341b. The separation portion 1348 in which the stacks of the semiconductor films are separated is filled with a material that forms the second common lines 1312a to 1312c, whereby the second common lines 1312a to 1312c project into the gate wiring 1301 side. Further, the gate wiring 1301 and the second common lines 1312a to 1312c are insulated from each other by the insulating films 1341a and 1341b.

The material which is used for the insulating film 1322 described in Embodiment Mode 1 can be used for the insulating films 1341a and 1341b, as appropriate.

When a thin film transistor or a diode is formed as a switching element of a pixel electrode formed in a pixel over a substrate, the amorphous semiconductor films 1344 and 1345 can be formed at the same time as formation of an amorphous semiconductor film of the thin film transistor or the diode. The amorphous semiconductor films 1344 and 1345 are formed using an amorphous silicon film, an amorphous silicon germanium film, an amorphous germanium film, or the like.

The semiconductor films 1346 and 1347 to which an impurity element imparting one conductivity type is added can be formed as the switching element of the pixel electrode formed in the pixel over the substrate, at the same time as formation of a source region and drain region of a thin film transistor. In the case where an n-channel thin film transistor is formed, phosphorus may be added as a typical impurity element to the semiconductor films 1346 and 1347 to which an impurity element imparting one conductivity type is added, and an impurity gas such as $PH_3$ may be added to silicon hydride. In addition, in the case where a p-channel thin film transistor is formed, boron may be added as a typical impurity element, and an impurity gas such as $B_2H_6$ may be added to silicon hydride. When phosphorus or boron concentration is set at $1\times10^{19}$ atoms/cm$^3$ to $1\times10^{21}$ atoms/cm$^3$, ohmic contact with the second common lines 1312a to 1312c can be made. The pair of the semiconductor films 1346 and 1347 to which an impurity element imparting one conductivity type is added can be formed using a microcrystalline semiconductor or an amorphous semiconductor. The semiconductor films 1346 and 1347 to which an impurity element imparting one conductivity type is added are formed to a thickness of equal to or more than 2 nm and equal to or less than 50 nm. By reduction in the thicknesses of the pair of the semiconductor films to which an impurity element imparting one conductivity type is added, throughput can be improved. Note that when a diode is used as the switching element, an n-type semiconductor film to which phosphorus is added or a p-type semiconductor film to which boron is added can be formed as the semiconductor films 1346 and 1347 to which an impurity element imparting one conductivity type is added.

Note that in FIG. 7B, the protection circuit is formed in the separation portion 1348; however, stacks of semiconductor films may be provided with an opening portion 1349 as illustrated in FIG. 7C, and the opening portion 1349 may be filled with the material that forms the second common lines 1312a to 1312c. As a result, the second common lines 1312a to 1312c project into the gate wiring 1301 side in the opening portion 1349 of the stacks of semiconductor films, whereby a protection circuit can be formed.

The second common lines 1312a to 1312c project into the gate wiring 1301 side in the separation portion 1348 or the opening portion 1349. Therefore, when high voltage is applied to the gate wiring 1301, a dielectric breakdown occurs between the gate wiring 1301 and the second common line 1312, and current generated at this time flows into the second common line 1312. As a result, charge electrification and short circuit associated therewith in the switching element in the pixel portion and at the intersection of the gate wiring 1301 and the source wiring 1302 can be reduced.

When a thin film transistor or a diode is used as the switching element in the pixel portion, a protection circuit can be formed at the same time as formation of the thin film transistor or the diode; accordingly, a display device can be formed through a small number of steps and with high yield.

A protection circuit having a stacked structure of stacks of semiconductor films, which is different from that in FIGS. 7A to 7C, is described with reference to FIG. 8.

Figure 8:
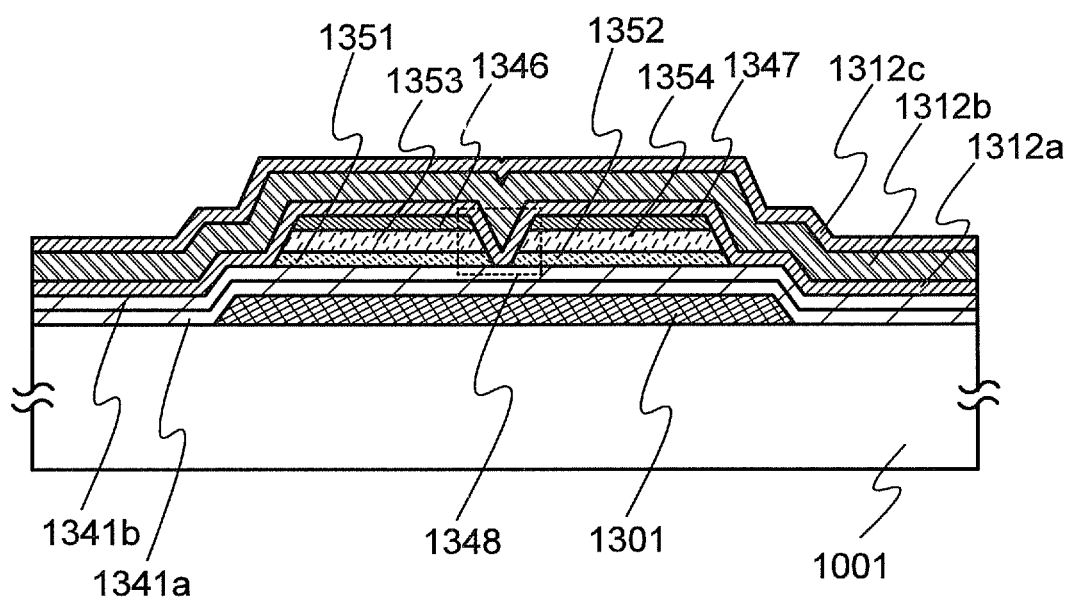
FIG. 8 is a cross-sectional view illustrating a protection circuit of an embodiment mode.

A protection circuit illustrated in FIG. 8 is different from that in FIGS. 7A to 7C in that stacks of semiconductor films which are formed between the insulating film 1341b and the second common lines 1312a to 1312c are formed using a stack including a microcrystalline semiconductor film 1351, an amorphous semiconductor film 1353, and the semiconductor film 1346 to which an impurity element imparting one conductivity type is added, and a stack including a microcrystalline semiconductor film 1352, an amorphous semiconductor film 1354, and the semiconductor film 1347 to which an impurity element imparting one conductivity type is added. Note that here, the mode in which there is the separation portion 1348 between the stacks is described; however, instead of the separated stacks of the semiconductor films, stacks of semiconductor films having an opening portion may be formed as illustrated in FIG. 7C.

The microcrystalline semiconductor films 1351 and 1352 are formed using a microcrystalline silicon film, a microcrystalline silicon germanium film, a microcrystalline germanium film, or the like.

The microcrystalline semiconductor film is a film including a semiconductor having an intermediate structure between amorphous and crystalline (including single crystal and polycrystal) structures. This semiconductor is a semiconductor which has a third state that is stable in terms of free energy, and is a crystalline semiconductor which has short-range order and lattice distortion, and column-like or needle-like crystals with a grain size of 0.5 nm to 20 nm grown in the direction of a normal line with respect to the surface of the substrate. Further, there is a non-single-crystal semiconductor between a plurality of microcrystalline semiconductors. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline silicon includes hydrogen or halogen of at least 1 at. % to terminate dangling bonds. Moreover, a noble gas element such as helium, argon, krypton, or neon may be included to further promote lattice distortion, so that stability is enhanced and a favorable microcrystalline semiconductor film can be obtained. Such description about a microcrystalline semiconductor film is disclosed in, for example, U.S. Pat. No. 4,409,134.

The microcrystalline semiconductor films 1351 and 1352 are formed with a thickness of more than or equal to 5 nm and less than or equal to 200 nm, preferably more than or equal to 5 nm and less than or equal to 100 nm, more preferably more than or equal to 10 nm and less than or equal to 50 nm, still more preferably more than or equal to 10 nm and less than or equal to 25 nm.

Further, it is preferable that the concentration of oxygen and the concentration of nitrogen in the microcrystalline semiconductor films 1351 and 1352 each be typically lower than $3\times10^{19}$ atoms/cm$^3$, preferably lower than $3\times10^{18}$ atoms/cm$^3$; and that the concentration of carbon be equal to or less than $3\times10^{18}$ atoms/cm$^3$. Lower concentration of oxygen, nitrogen, or carbon mixed in the microcrystalline semiconductor films can suppress generation of defects in the microcrystalline semiconductor films 1351 and 1352. Furthermore, oxygen or nitrogen in the microcrystalline semiconductor films hinders crystallization. Therefore, the microcrystalline semiconductor films 1351 and 1352 include oxygen and nitrogen at relatively low concentrations, whereby the crystallinity of the microcrystalline semiconductor films 1351 and 1352 can be improved.

By adding an impurity element which serves as an acceptor to the microcrystalline semiconductor films 1351 and 1352 at the same time as or after formation of the microcrystalline semiconductor films 1351 and 1352, the threshold value can be controlled. A typical example of the impurity element which serves as an acceptor is boron, and an impurity gas such as $B_2H_6$ or $BF_3$ is preferably mixed into silicon hydride at from 1 ppm to 1000 ppm, preferably from 1 ppm to 100 ppm. Further, the concentration of boron is preferably set to be approximately one tenth that of the impurity element which serves as a donor, e.g., from $1\times10^{14}$ atoms/cm$^3$ to $6\times10^{16}$ atoms/cm$^3$.

The amorphous semiconductor films 1353 and 1354 are formed using an amorphous semiconductor film. Alternatively, an amorphous semiconductor film which includes a halogen such as fluorine or chlorine is used. The amorphous semiconductor films 1353 and 1354 each have a thickness of 50 nm to 200 nm. Examples of the amorphous semiconductor film are an amorphous silicon film, an amorphous silicon film including germanium, and the like.

When the amorphous semiconductor films 1353 and 1354 are in contact with the microcrystalline semiconductor films 1351 and 1352, the oxidation of the microcrystalline semiconductor films can be reduced.

Through the above steps, the second common lines 1312a to 1312c project into the gate wiring 1301 side in the separation portion or the depressed portion of the stacks of the semiconductor films, whereby a protection circuit can be formed.

Next, a protection circuit having a stacked structure of stacks of semiconductor films, which is different from those in FIGS. 7A to 7C and FIG. 8, is described with reference to FIG. 9.

Figure 9:
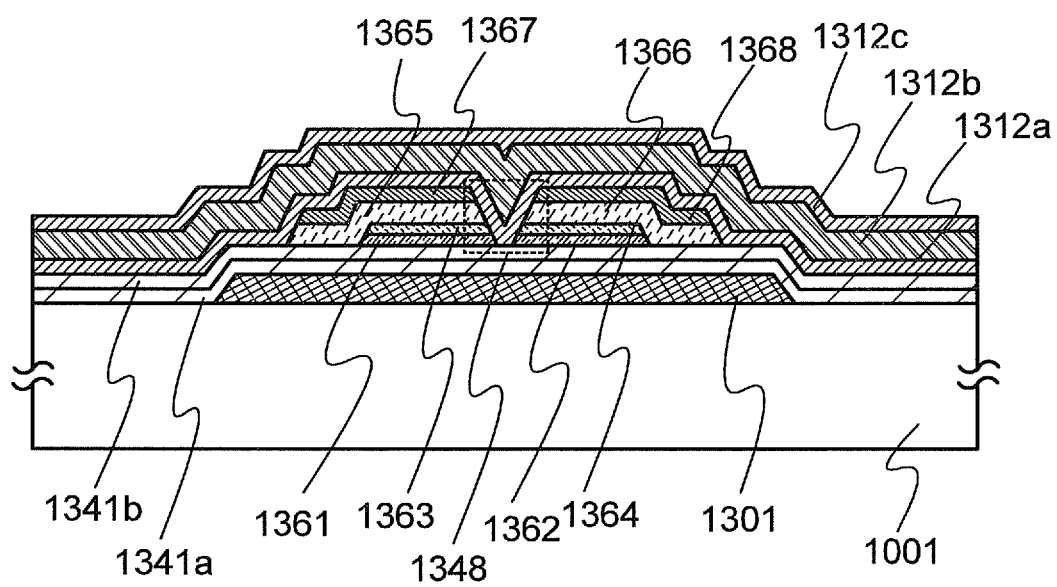
FIG. 9 is a cross-sectional view illustrating a protection circuit of an embodiment mode.

A protection circuit illustrated in FIG. 9 is different from those in FIGS. 7A to 7C and FIG. 8 in that stacks of semiconductor films which are formed between the insulating film 1341b and the second common lines 1312a to 1312c are formed using a stack including a microcrystalline semiconductor film 1361 to which an impurity element that serves as a donor is added, an amorphous semiconductor film 1363, an amorphous semiconductor film 1365, and a semiconductor film 1367 to which an impurity element imparting one conductivity type is added, and a stack including a microcrystalline semiconductor film 1362 to which an impurity element that serves as a donor is added, an amorphous semiconductor film 1364, an amorphous semiconductor film 1366, and a semiconductor film 1368 to which an impurity element imparting one conductivity type is added. Note that here, the mode in which the stacks are separated (the separation portion 1348) is described; however, instead of the separated stacks of the semiconductor films, stacks of semiconductor films having an opening portion may be formed as illustrated in FIG. 7C.

The microcrystalline semiconductor films 1361 and 1362 to which an impurity element that serves as a donor is added are formed using the microcrystalline semiconductor films 1351 and 1352 illustrated in FIG. 8 to which an impurity element that serves as a donor is added. Further, examples of the impurity element which serves as a donor are phosphorus, arsenic, antimony, and the like.

The concentration of the impurity element which serves as a donor is more than or equal to $6\times10^{15}$ atoms/cm$^3$ and less than or equal to $3\times10^{18}$ atoms/cm$^3$, preferably more than or equal to $1\times10^{16}$ atoms/cm$^3$ and less than or equal to $3\times10^{18}$ atoms/cm$^3$, more preferably more than or equal to $3\times10^{16}$ atoms/cm$^3$ and less than or equal to $3\times10^{17}$ atoms/cm$^3$. The concentration of the impurity element which serves as a donor and is included in the microcrystalline semiconductor films is set to be in the above range, whereby crystallinity of the microcrystalline semiconductor films at the interface between the insulating film 1341b and the microcrystalline semiconductor films 1361 and 1362 to which an impurity element that serves as a donor is added can be improved, and resistance of the microcrystalline semiconductor films 1361 and 1362 to which an impurity element that serves as a donor is added can be reduced.

The side surfaces of the microcrystalline semiconductor films 1361 and 1362 to which an impurity element that serves as a donor is added in a region which is in contact with the separation portion 1348 are in contact with the second common lines 1312a to 1312c; however, side surfaces other than the region are covered with the amorphous semiconductor films 1365 and 1366.

Through the above steps, the second common lines 1312a to 1312c project into the gate wiring 1301 side in the separation portion 1348 or the depressed portion of the stacks of the semiconductor films, whereby a protection circuit can be formed.

A cross-sectional structure and planar structure of a protection circuit which can be applied to FIGS. 7A to 7C, FIG. 8, and FIG. 9 are described with reference to FIGS. 10A to 10C. Here, the cross-sectional structure and the planar structure are described based on the structure of FIGS. 7A to 7C in which the stack including the amorphous semiconductor film 1344 and the semiconductor film 1346 to which an impurity element imparting one conductivity type is added, and the stack including the amorphous semiconductor film 1345 and the semiconductor film 1347 to which an impurity element imparting one conductivity type is added are separated from each other. The cross-sectional structure and the planar structure are applicable to FIG. 8 and FIG. 9, as appropriate.

Figure 10A:
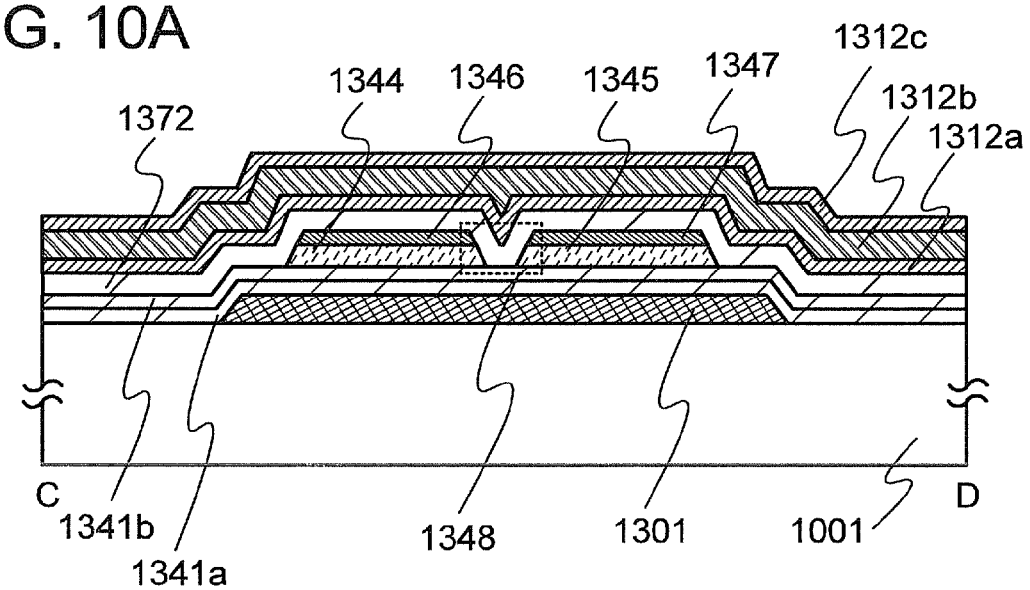
FIGS. 10A to 10C are a cross-sectional view and plan views each illustrating a protection circuit of an embodiment mode.
Figure 10B:
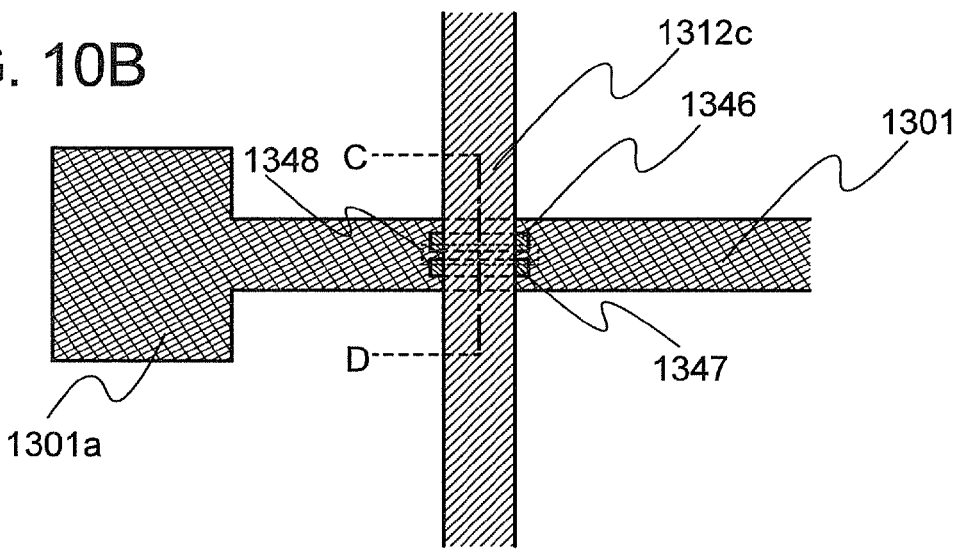

FIG. 10A is a cross-sectional view taken along line C-D in a plan view illustrated in FIG. 10B. As illustrated in FIG 10A, the gate wiring 1301 is formed over the substrate 1001; the insulating films 1341a and 1341b are formed over the gate wiring 1301; and stacks of semiconductor films are formed over the insulating film 1341b. In addition, an insulating film 1372 is formed over the stacks of the semiconductor films and the insulating film 1341b. Further, the second common lines 1312a to 1312c are formed over the insulating film 1372. By using the insulating films 1341a and 1341b and the insulating film 1372, the gate wiring 1301 and the second common lines 1312a to 1312c are insulated. In addition, by using the insulating film 1372, the second common lines 1312a to 1312c and the stacks of the semiconductor films are insulated. The stacks of the semiconductor films are separated, and the second common lines 1312*a* to 1312*c* project into the gate wiring 1301 side in the separation portion 1348.

Through the above steps, the second common lines 1312*a* to 1312*c* project into the gate wiring 1301 side in the separation portion or the depressed portion of the stacks of the semiconductor films, whereby a protection circuit can be formed.

Figure 10C:
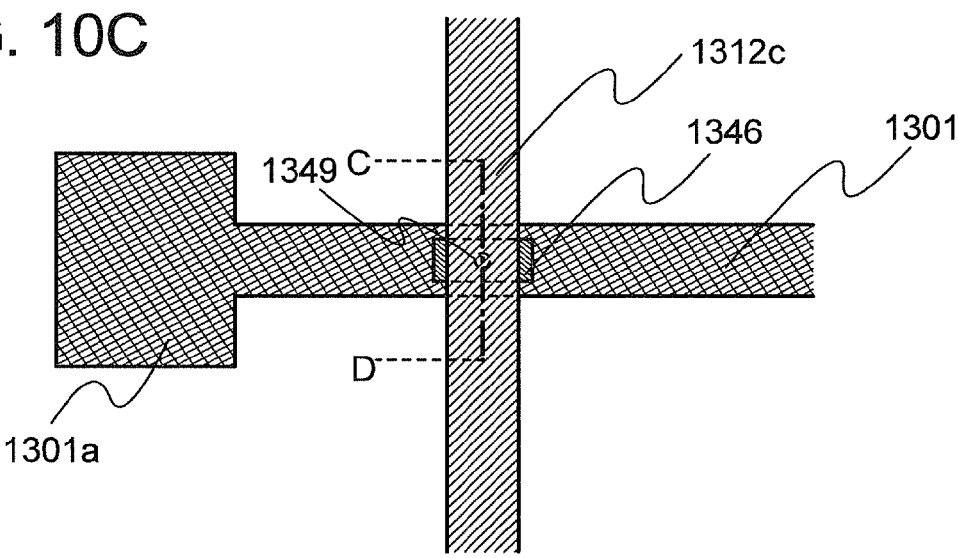

Note that in FIG 10B, the second common lines 1312*a* to 1312*c* project into the gate wiring 1301 side in the separation portion 1348 of the stacks of the semiconductor films; however, as illustrated in FIG. 10C, the stacks of the semiconductor films can be provided with the opening portion 1349, and the second common lines 1312*a* to 1312*c* project into the gate wiring 1301 side in the region, whereby a protection circuit can be formed.

In the protection circuit illustrated in FIGS. 10A to 10C, the insulating films 1341*a* and 1341*b* formed between the gate wiring 1301 and the stacks of the semiconductor films are not necessarily provided. This structure is described with reference to FIGS. 11A to 11C.

Figure 11A:
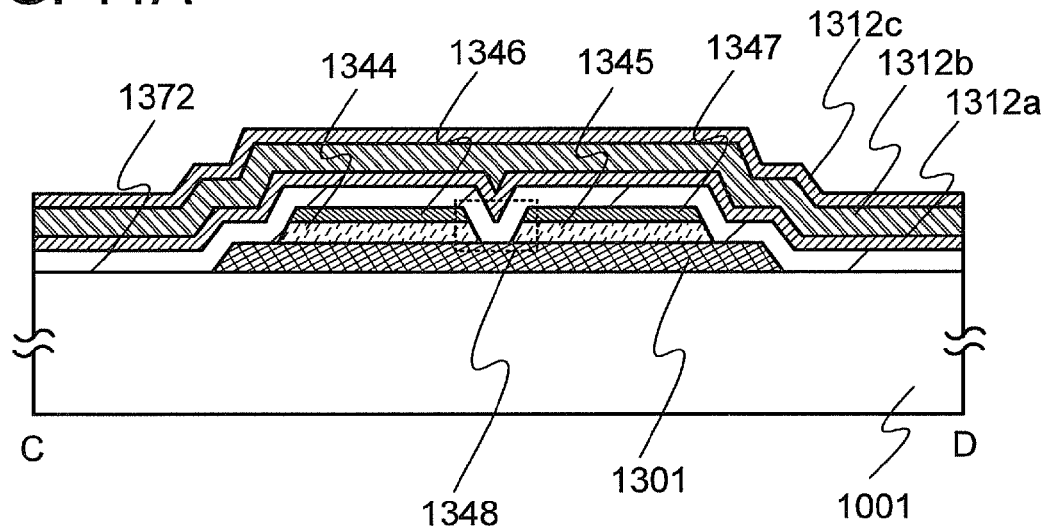
FIGS. 11A to 11C are a cross-sectional view and plan views each illustrating a protection circuit of an embodiment mode.
Figure 11B:
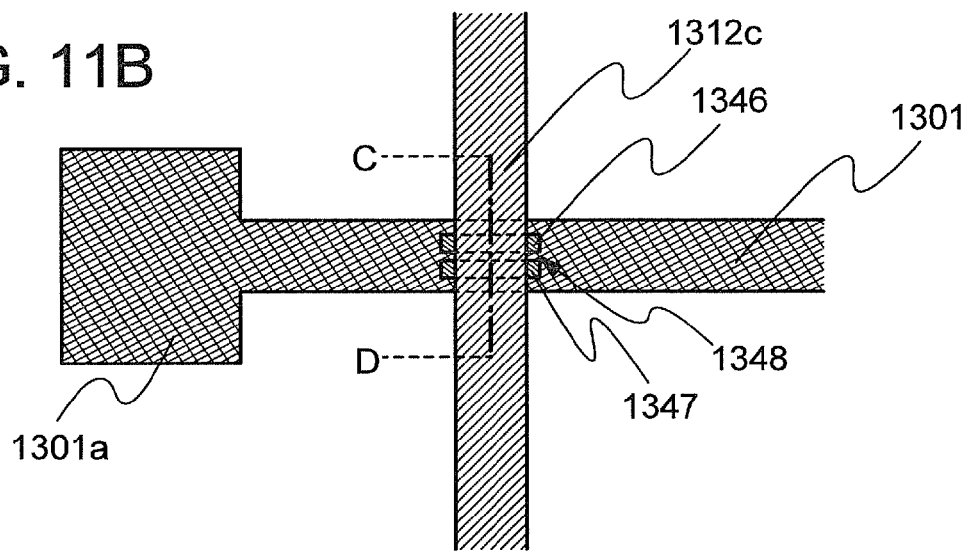

FIG. 11A is a cross-sectional view taken along line C-D in a plan view illustrated in FIG. 11B. FIG. 11A is different from FIG. 10A in that stacks of semiconductor films are in contact with the gate wiring 1301 without an insulating film interposed therebetween. That is, the insulating film 1372 is formed over the stacks of the semiconductor films and the gate wiring 1301. The gate wiring 1301 and the second common lines 1312*a* to 1312*c* are insulated by the insulating film 1372. In addition, the second common lines 1312*a* to 1312*c* and the stacks of the semiconductor films are insulated by the insulating film 1372. Further, the second common lines 1312*a* to 1312*c* project into the gate wiring 1301 side in the separation portion 1348 of the stacks of the semiconductor films, whereby a protection circuit can be formed.

Figure 11C:
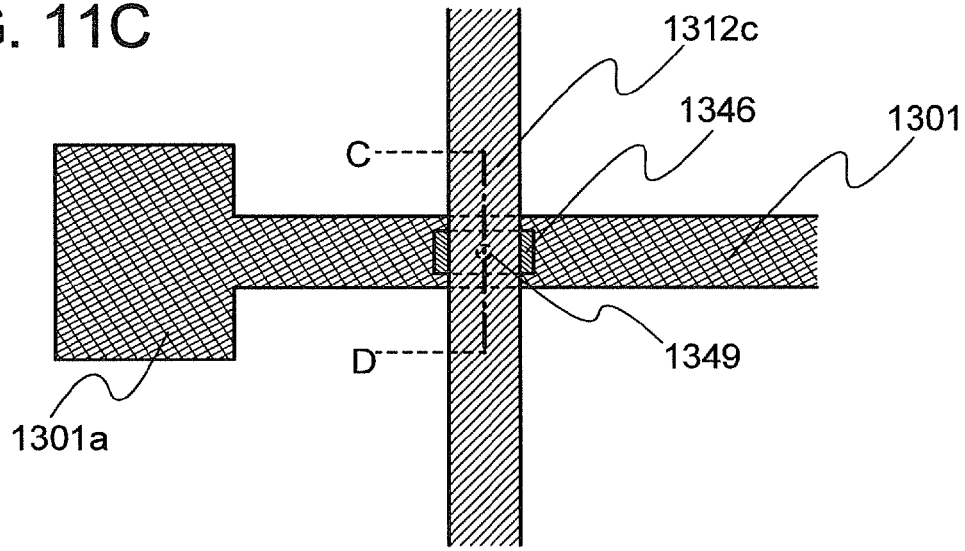

Note that in FIG. 11B, the second common lines 1312*a* to 1312*c* project into a gate wiring 1301 side in the separation portion 1348 of the stacks of the semiconductor films. As illustrated in FIG. 11C, the stacks of the semiconductor films are provided with the opening portion 1349, and the second common lines 1312*a* to 1312*c* project into the gate wiring 1301 side in the region, whereby a protection circuit can be formed.

Figure 12A:
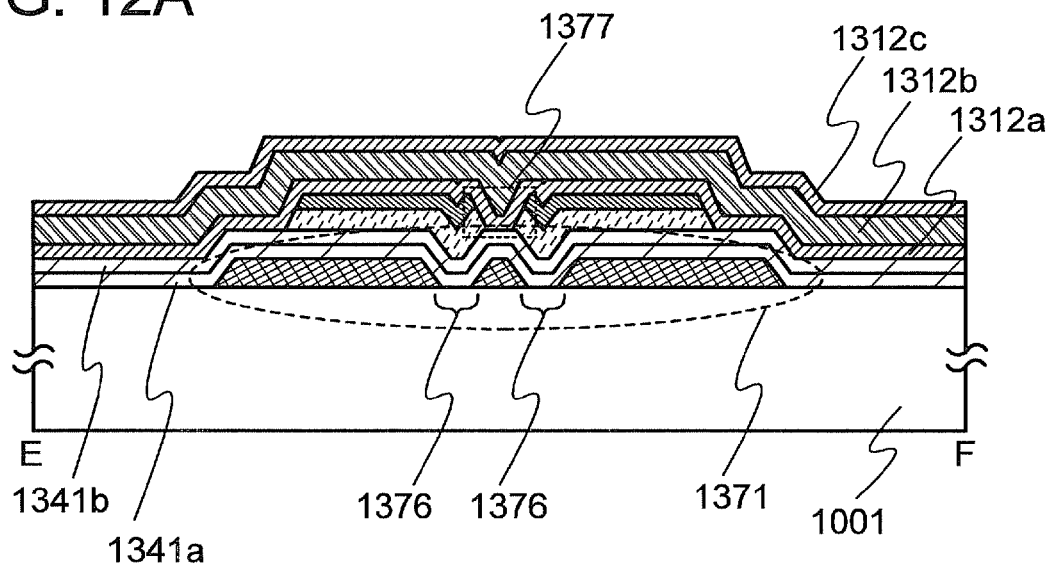
FIGS. 12A to 12C are a cross-sectional view and plan views each illustrating a protection circuit of an embodiment mode.
Figure 12B:
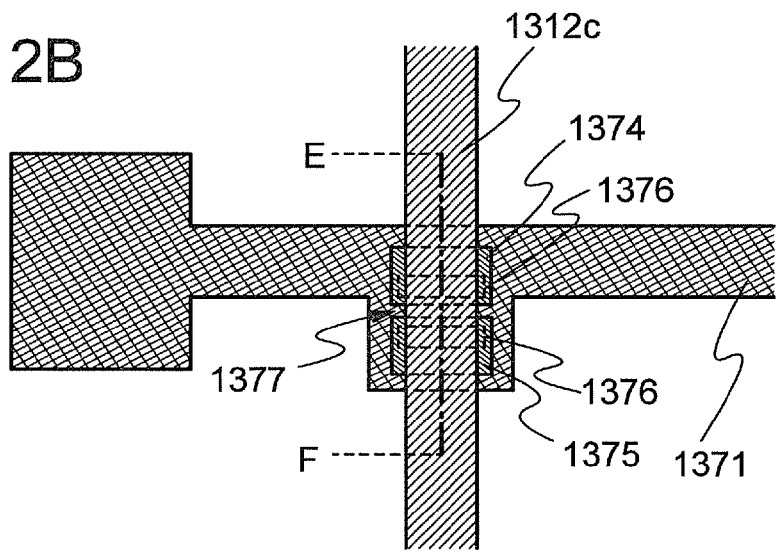
Figure 12C:
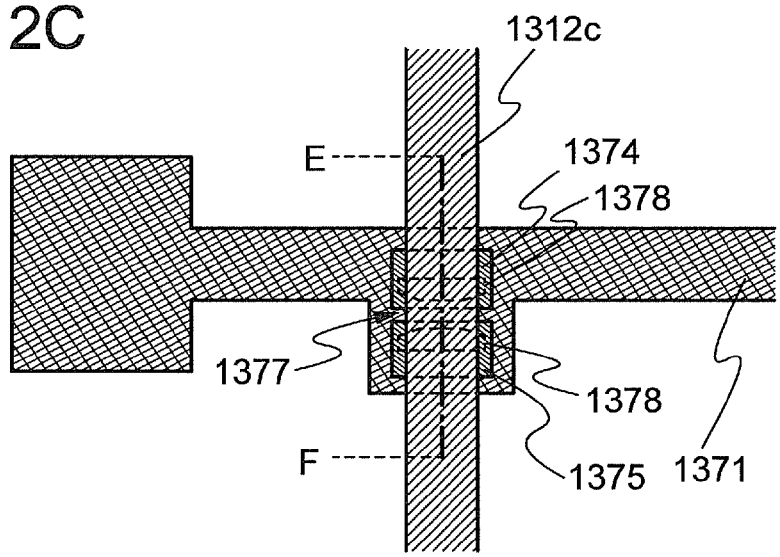

Next, a structure that can be applied to the protection circuit illustrated in FIGS. 7A to 7C, FIG. 8, FIG. 9, FIGS. 10A to 10C, and FIGS. 11A to 11C is described with reference to FIGS. 12A to 12C. As illustrated in FIG. 12A, the gate wiring 1371 may have a plurality of opening portions 1376 at an intersection with the second common lines 1312*a* to 1312*c*. FIG. 12B illustrates a mode in which two rectangular opening portions 1376 are provided in the gate wiring 1371, and FIG. 12C illustrates a mode in which two polygonal opening portions 1378 are provided in the gate wiring 1371. When the opening portions are provided in the gate wiring 1371, the width of the gate wiring in a region between the opening portions is small, whereby the gate wiring has a projection shape. When a side surface of the gate wiring 1371 is formed to have a slant, as illustrated in FIG. 12A, the cross section of the gate wiring 1371 in the region between the opening portions has a projection shape tapered toward the second common lines 1312*a* to 1312*c* side. Therefore, the gate wiring 1371 and the second common lines 1312*a* to 1312*c* project with the insulating films interposed therebetween, whereby a dielectric breakdown easily occurs. Thus, charge electrification and short circuit associated therewith in the thin film transistor in the pixel portion and at the intersection of the gate wiring 1371 and the source wiring 1302 can be reduced.

Note that here, the gate wiring and the second common lines project in a separation portion 1377 of the stacks of the semiconductor films. Instead of this, a structure may be used in which a depressed portion is provided in the stacks of the semiconductor films and the gate wiring and the second common lines project in the region.

(Embodiment Mode 4)

In this embodiment mode, a process of forming the protection circuit described in Embodiment Mode 3 at the same time as formation of a thin film transistor will be described hereinafter. Note that a mode in which the thin film transistor and the protection circuit are formed using the same gate wiring is described in this embodiment mode.

A manufacturing process of the protection circuit illustrated in FIG. 8 and the thin film transistor is described with reference to FIGS. 13A to 13F. Note that a cross section of a region where the protection circuit is formed is illustrated on the left side of FIGS. 13A to 13F, and a cross section of a region where the thin film transistor is formed as a switching element in a pixel is illustrated on the right side of FIGS. 13A to 13F. In addition, the right side of FIGS. 13A to 13F is also a cross-sectional view taken along line Q-R illustrated in FIG. 14. Note that in this embodiment mode, the thin film transistor is described as the switching element formed in the pixel. Instead of the thin film transistor, a diode, a metal-insulator-metal (MIM), or micro electro mechanical systems (MEMS) can also be used.

Figure 13A:
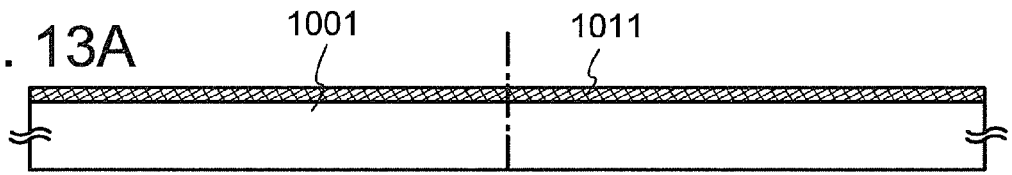
FIGS. 13A to 13F are cross-sectional views illustrating a manufacturing process of a protection circuit of an embodiment mode.
Figure 14:
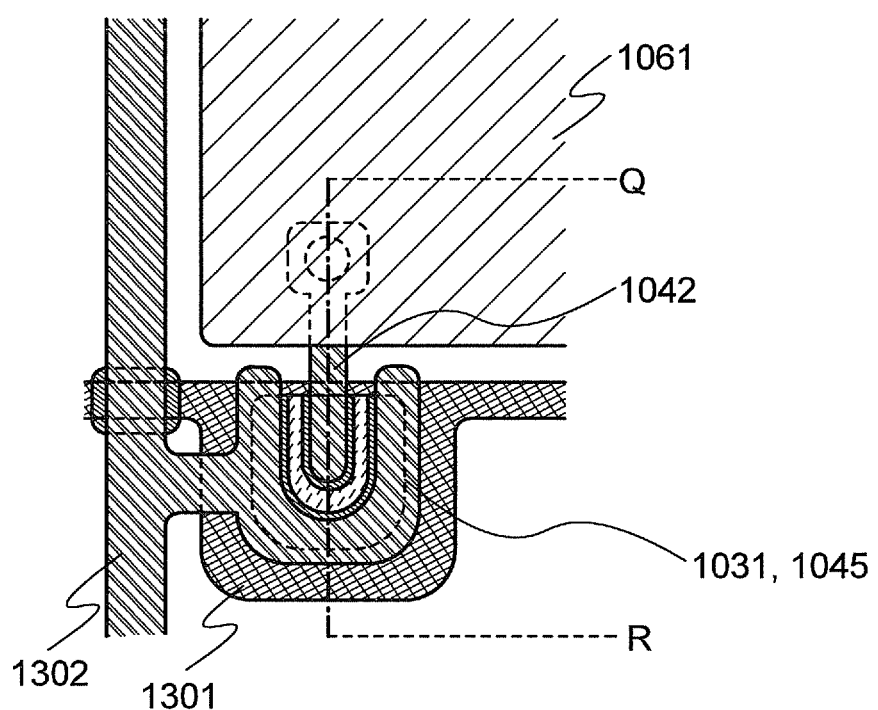
FIG. 14 is a plan view illustrating a manufacturing process of a protection circuit of an embodiment mode.

As illustrated in FIG. 13A, a conductive film 1011 is formed over the substrate 1001. The conductive film 1011 can be formed using the material given as a material for the gate wiring 1301 and the first common line 1311 described in Embodiment Mode 1. The conductive film 1011 is formed by a sputtering method, a CVD method, a plating method, a printing method, a droplet discharge method, or the like.

Figure 13B:
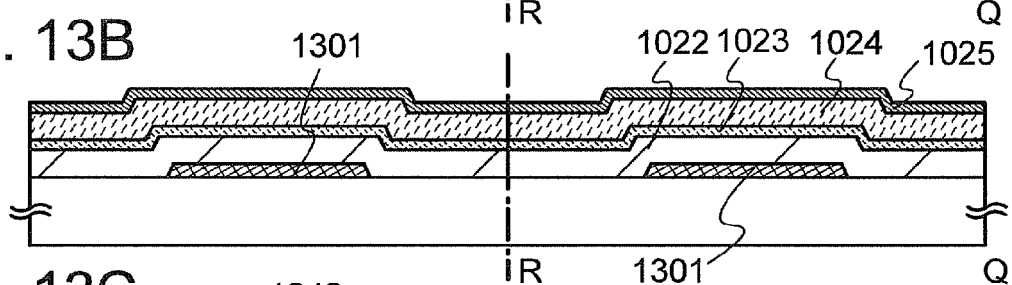

Then, after a resist is applied to the conductive film 1011, the conductive film 1011 is etched into a desired shape by using a resist mask formed by a photolithography step. Thus, as illustrated in FIG. 13B, the gate wiring 1301 is formed. Then, the resist mask is removed.

Next, a gate insulating film 1022 is formed over the gate wiring 1301 and the substrate 1001. The gate insulating film 1022 can be formed using the material given as a material for the insulating films 1341*a* and 1341*b* described in Embodiment Mode 1. The gate insulating film 1022 is formed by a CVD method, a sputtering method, or the like.

Subsequently, a semiconductor film is formed over the gate insulating film 1022. Here, as the semiconductor film, a microcrystalline semiconductor film 1023 and an amorphous semiconductor film 1024 are stacked. In a reaction chamber of a plasma CVD apparatus, a deposition gas including silicon or germanium is mixed with hydrogen, and the microcrystalline semiconductor film 1023 is formed by glow discharge plasma. Hydrogen is diluted so that the flow rate of hydrogen is 10 times to 2000 times, preferably 50 times to 200 times that of the deposition gas including silicon or germanium, and the microcrystalline semiconductor film is formed. A temperature for heating the substrate is from 100° C. to 300° C., preferably from 120° C. to 220° C.

In the film formation processing of the microcrystalline semiconductor film, helium may be added to a reaction gas, in addition to silane and hydrogen. Helium has the highest ionization energy among all the gases, which is 24.5 eV, and has a metastable state at about 20 eV, which is a little lower than the ionization energy. Therefore, only about 4 eV, which corresponds to the difference therebetween, is necessary for ionization while the discharging continues. Therefore, a discharge starting voltage of helium shows the lowest value in all gases. By such characteristics, plasma can be held stably with helium. In addition, uniform plasma can be formed so that plasma density is uniform even when the area of the substrate on which a microcrystalline semiconductor film is deposited is increased.

As the amorphous semiconductor film 1024, an amorphous semiconductor film can be formed by a plasma CVD method using a deposition gas including silicon or germanium. Alternatively, by dilution of a deposition gas including silicon or germanium with one or plural kinds of noble gas elements selected from among helium, argon, krypton, and neon, an amorphous semiconductor film can be formed. Further alternatively, a hydrogen-containing amorphous semiconductor film can be formed using hydrogen with a flow rate of greater than or equal to 1 time and less than or equal to 10 times, more preferably, greater than or equal to 1 time and less than or equal to 5 times as high as that of a silane gas. In addition, a halogen such as fluorine, chlorine, bromine, or iodine may be added to the above hydrogenated semiconductor film.

In the formation step of the microcrystalline semiconductor film 1023 and the amorphous semiconductor film 1024, glow discharge plasma is generated by applying high-frequency power with a frequency of 1 MHz to 20 MHz, typically 13.56 MHz or 27.12 MHz, or high-frequency power with a frequency of 20 MHz to about 120 MHz, typically 60 MHz.

Also, as the amorphous semiconductor film 1024, an amorphous semiconductor film can be formed by sputtering with hydrogen or a noble gas, using a semiconductor such as silicon or germanium as a target.

Note that after formation of the microcrystalline semiconductor film 1023, the amorphous semiconductor film 1024 is preferably deposited at a temperature of 300° C. to 400° C. by a plasma CVD method. By this film formation processing, hydrogen is supplied to the microcrystalline semiconductor film 1023, and the same effect as hydrogenizing the microcrystalline semiconductor film 1023 can be obtained. That is, the amorphous semiconductor film 1024 is deposited over the microcrystalline semiconductor film 1023, whereby hydrogen is dispersed in the microcrystalline semiconductor film 1023, so that dangling bonds can be terminated.

Formation of the amorphous semiconductor film 1024 or the amorphous semiconductor film including hydrogen, nitrogen, or halogen on a surface of the microcrystalline semiconductor film 1023 can prevent surfaces of crystal grains included in the microcrystalline semiconductor film 1023 from being native oxidized. In particular, in a region where an amorphous semiconductor is in contact with microcrystalline grains, a crack is likely to be caused due to local stress. If this crack is exposed to oxygen, the crystal grains are oxidized to form silicon oxide. However, an amorphous semiconductor film is formed on the surface of the microcrystalline semiconductor film 1023, whereby oxidation of microcrystalline grains can be prevented. In a display device including a thin film transistor to which high voltage (e.g., about 15 V) is applied, typically, in a liquid crystal display device, if the amorphous semiconductor film is formed to have a large thickness, drain withstand voltage is increased, so that deterioration of the thin film transistor can be prevented even if high voltage is applied to the thin film transistor.

The energy gap of the amorphous semiconductor film 1024 is larger than that of the microcrystalline semiconductor film 1023; the resistivity of the amorphous semiconductor film 1024 is higher than that of the microcrystalline semiconductor film 1023; and the mobility of the amorphous semiconductor film 1024 is as low as $1/5$ to $1/10$ of that of the microcrystalline semiconductor film 1023. Therefore, in a thin film transistor to be formed later, the amorphous semiconductor film 1024 formed between the microcrystalline semiconductor film 1023 and each of source and drain regions functions as a high-resistance region, whereas the microcrystalline semiconductor film 1023 functions as a channel formation region. Accordingly, the off current of the thin film transistor can be reduced. When the thin film transistor is used as a switching element of a display device, the contrast of the display device can be improved.

Note that here, as the semiconductor film, a structure in which the microcrystalline semiconductor film 1023 and the amorphous semiconductor film 1024 are stacked is used; however, a single layer of a microcrystalline semiconductor film or an amorphous semiconductor film may be used. Further alternatively, a crystalline semiconductor film may be formed with a single layer. A single layer of an amorphous semiconductor film can be formed as a semiconductor film, whereby the protection circuit illustrated in FIGS. 7A to 7C can be formed.

Next, a semiconductor film 1025 to which an impurity element imparting one conductivity type is added is formed over the semiconductor film (see FIG. 13B). The semiconductor film 1025 to which an impurity element imparting one conductivity type is added is formed by a plasma CVD method using phosphine and a deposition gas including silicon or germanium.

Figure 13C:
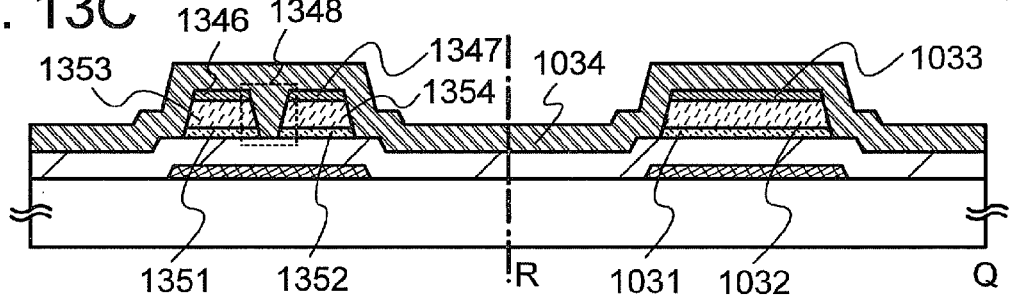

Then, after a resist is applied to the semiconductor film 1025 to which an impurity element imparting one conductivity type is added, the semiconductor film 1025 to which an impurity element imparting one conductivity type is added, the amorphous semiconductor film 1024, and the microcrystalline semiconductor film 1023 are etched into a desired shape by using a resist mask formed by a photolithography step. As illustrated in FIG. 13C, a microcrystalline semiconductor film 1031, an amorphous semiconductor film 1032, and a semiconductor film 1033 to which an impurity element imparting one conductivity type is added are formed in the region where the thin film transistor is formed.

In the region where the protection circuit is formed, the microcrystalline semiconductor films 1351 and 1352, the amorphous semiconductor films 1353 and 1354, and the semiconductor films 1346 and 1347 to which an impurity element imparting one conductivity type is added are formed. Note that a stack including the microcrystalline semiconductor film 1351, the amorphous semiconductor film 1353, and the semiconductor film 1346 to which an impurity element imparting one conductivity type is added, and a stack including the microcrystalline semiconductor film 1352, the amorphous semiconductor film 1354, and the semiconductor film 1347 to which an impurity element imparting one conductivity type is added are separated from each other by the separation portion 1348. Note that instead of separating the stacks of the semiconductor films, a depressed portion which is formed by partly etching the stacks, may be provided. Then, the resist mask is removed.

Next, a conductive film 1034 is formed over the stacks of the semiconductor films and the gate insulating film 1022. The conductive film 1034 can be formed using the material given as a material for the source wiring and the second common lines 1312a to 1312c described in Embodiment Mode 1. The conductive film 1034 is formed by a CVD method, a sputtering method, a printing method, a droplet discharge method, or the like.

Figure 13D:
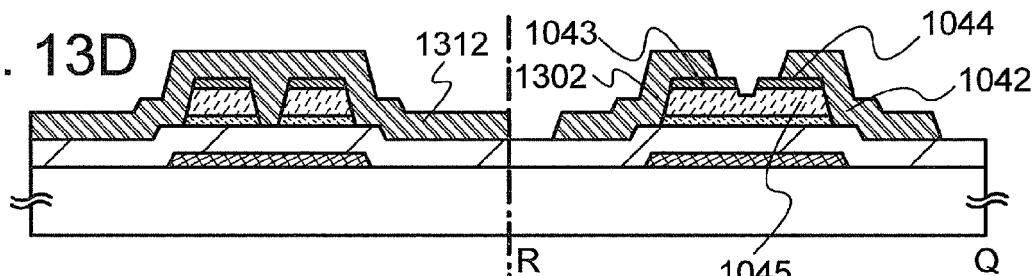

Then, after a resist is applied to the conductive film 1034, the conductive film 1034 is etched into a desired shape by using a resist mask formed by a photolithography step. As illustrated in FIG. 13D, the source wiring 1302 and a drain electrode 1042 are formed in the region where the thin film transistor is formed. In addition, in the region where the protection circuit is formed, the second common line 1312 is formed.

Next, the semiconductor film to which an impurity element imparting one conductivity type is added is etched using a resist mask to form source and drain regions 1043 and 1044. Note that in the etching step, the amorphous semiconductor film 1032 is also partly etched. The amorphous semiconductor film 1032 that is partly etched and has a depressed portion is referred to as an amorphous semiconductor film 1045. The source and drain regions and the depressed portion of the amorphous semiconductor film can be formed in the same step. The depth of the depressed portion in the amorphous semiconductor film 1045 is set to be half to one third the thickness of the thickest region in the amorphous semiconductor film 1045, so that the source and drain regions can have a distance therebetween. Therefore, leakage current between the source and drain regions can be reduced. Then, the resist mask is removed.

Next, dry etching may be performed under such a condition that the amorphous semiconductor film which is exposed is not damaged and an etching rate with respect to the amorphous semiconductor film is low. Through this step, an etching residue on the amorphous semiconductor film 1045 between the source and drain regions, a residue of the resist mask, and a contamination source in an apparatus used for removal of the resist mask can be removed, whereby the source and drain regions can be surely insulated. As a result, leakage current of the thin film transistor can be reduced, so that a thin film transistor with small off current and high withstand voltage can be manufactured. A gas containing chlorine, a gas containing fluorine, or the like can be used for an etching gas, for example.

Through the above steps, the thin film transistor is formed in the pixel portion. In the peripheral portion, the protection circuit can be formed.

Figure 13E:
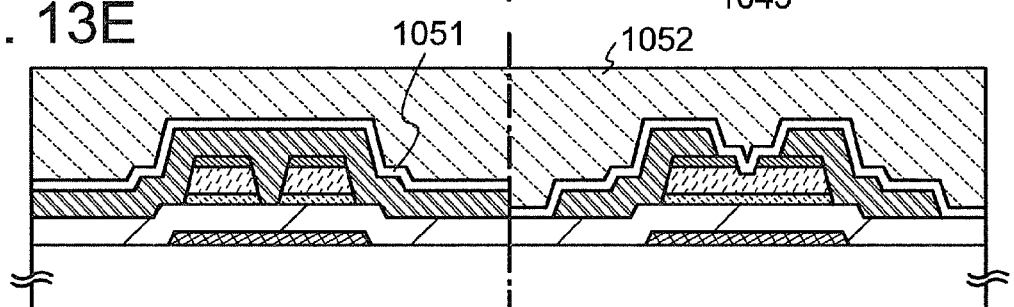

Next, as illustrated in FIG. 13E, a protective insulating film 1051 is formed over the second common line 1312, the source wiring 1302, the drain electrode 1042, and the gate insulating film 1022. The protective insulating film 1051 can be formed using a silicon nitride film, a silicon nitride oxide film, a silicon oxide film, or a silicon oxynitride film. The protective insulating film 1051 prevents entry of a contaminating impurity such as an organic matter, a metal, or water vapor included in the air; thus, a dense film is preferably used for the protective insulating film 1051.

Figure 13F:
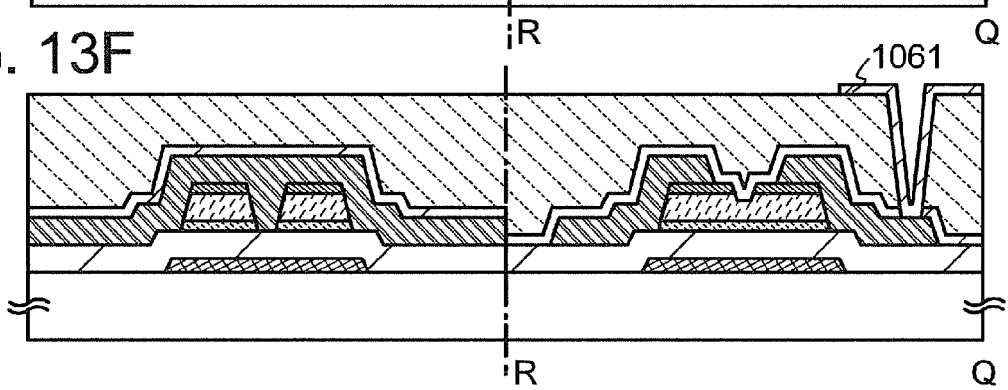

Next, a planarization film 1052 may be formed over the protective insulating film 1051. The planarization film 1052 can be formed using an organic insulating film such as a film of an acrylic resin, polyimide, an epoxy resin, or siloxane polymer. The planarization film 1052 is formed using a photosensitive organic resin here. Then, after the planarization film 1052 is exposed to light and developed, the protective insulating film 1051 is exposed, as illustrated in FIG. 13F. Next, the protective insulating film 1051 is etched using the planarization film 1052 as a mask, and a contact hole which exposes part of the drain electrode 1042 is formed.

Next, a pixel electrode 1061 is formed in the contact hole. Here, after a conductive film is formed over the planarization film 1052, a resist is applied to the conductive film. Next, the conductive film is etched using a resist mask formed by a photolithography step with the use of a photomask, and the pixel electrode 1061 is formed. Note that the right side of FIG. 13F corresponds to the cross-sectional view taken along line Q-R of FIG. 14.

The pixel electrode 1061 can be formed using a light-transmitting conductive material such as an indium oxide containing tungsten oxide, an indium zinc oxide containing tungsten oxide, an indium oxide containing titanium oxide, an indium tin oxide containing titanium oxide, an indium tin oxide (hereinafter, also referred to as "ITO"), an indium zinc oxide, or an indium tin oxide to which silicon oxide is added.

Alternatively, the pixel electrode 1061 can be formed using a conductive composition containing a conductive high-molecular compound (also referred to as a conductive polymer). The pixel electrode formed using the conductive composition preferably has a sheet resistance which is equal to or less than 10000 Ω/square and a transmittance which is greater than or equal to 70% at a wavelength of 550 nm. Further, the resistance of the conductive polymer included in the conductive composition is preferably equal to or less than 0.1 Ω·cm.

As the conductive polymer, a so-called π-electron conjugated conductive polymer can be used. As examples thereof, polyaniline or a derivative thereof, polypyrrole or a derivative thereof, polythiophene or a derivative thereof, a copolymer of more than two kinds of them, and the like can be given.

Here, an ITO film is formed as the pixel electrode 1061 by a sputtering method, and then a resist is applied to the ITO film. Next, the resist is exposed to light and developed using a photomask, thereby forming a resist mask. Then, the ITO film is etched using the resist mask to form the pixel electrode 1061. Then, the resist mask is removed.

As described above, the protection circuit illustrated in FIG. 8 can be formed at the same time as formation of the thin film transistor. Accordingly, through a small number of steps, an element substrate which has the protection circuit and the thin film transistor and can be used for a display device can be formed. In addition, an element substrate whose frame can be narrowed can be formed.

Next, a manufacturing process of the protection circuit illustrated in FIG. 9 and a thin film transistor is described with reference to FIGS. 13A to 13F, FIGS. 15A to 15E, and FIG. 16. Note that a cross section of a region where the protection circuit is formed is illustrated on the left side of FIGS. 15A to 15E, and a cross section of a region where the thin film transistor is formed as a switching element in a pixel is illustrated on the right side of FIGS. 15A to 15E. In addition, the right side of FIGS. 15A to 15E is a cross-sectional view taken along line Q-R illustrated in FIG. 16.

Figure 15A:
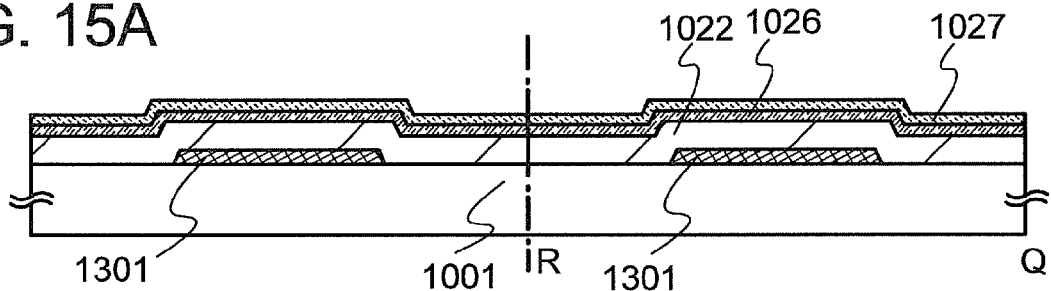
FIGS. 15A to 15E are cross-sectional views illustrating a manufacturing process of a protection circuit of an embodiment mode.

Through the step of FIG. 13A, the gate wiring 1301 is formed over the substrate 1001, as illustrated in FIG. 15A.

Next, the gate insulating film 1022 is formed over the gate wiring 1301 and the substrate 1001.

Subsequently, a semiconductor film is formed over the gate insulating film 1022. Here, as the semiconductor film, a microcrystalline semiconductor film 1026 to which an impurity element that serves as a donor is added and an amorphous semiconductor film 1027 are stacked. A method of forming the microcrystalline semiconductor film 1026 to which an impurity element that serves as a donor is added is described hereinafter.

In a reaction chamber of a plasma CVD apparatus, a deposition gas including silicon or germanium, and hydrogen are mixed, and the microcrystalline semiconductor film 1026 to which an impurity element that serves as a donor is added is formed by glow discharge plasma. Hydrogen is diluted so that the flow rate of hydrogen is 10 times to 2000 times, preferably 50 times to 200 times that of the deposition gas including silicon or germanium, and the microcrystalline semiconductor film is formed. A temperature for heating the substrate is from 100° C. to 300° C., preferably from 120° C. to 220° C. In addition, the microcrystalline semiconductor film 1026 to which an impurity element that serves as a donor is added can be formed by mixing a gas including phosphorus, arsenic, antimony, or the like with the above source gas. Here, phosphine can be mixed with silane and hydrogen and/or a noble gas, and a microcrystalline silicon film including phosphorus can be formed by glow discharge plasma as the microcrystalline semiconductor film 1026 to which an impurity element that serves as a donor is added.

In the formation step of the microcrystalline semiconductor film 1026 to which an impurity element that serves as a donor is added, glow discharge plasma is generated by applying high-frequency power with a frequency of 1 MHz to 20 MHz, typically 13.56 MHz or 27.12 MHz, or high-frequency power with a frequency of 20 MHz to about 120 MHz, typically 60 MHz.

As a typical example of the deposition gas including silicon or germanium, $SiH_4$, $Si_2H_6$, $GeH_4$, $Ge_2H_6$, and the like can be given.

Note that instead of forming the microcrystalline semiconductor film 1026 to which an impurity element that serves as a donor is added, an insulating film to which an impurity element that serves as a donor is added may be formed as the gate insulating film 1022 and a semiconductor film that does not include an impurity element that serves as a donor may be formed thereover. For example, a silicon oxide film, a silicon nitride film, a silicon oxynitride film, or a silicon nitride oxide film including an impurity element (phosphorus, arsenic, or antimony) that serves as a donor can be formed as a gate insulating film. In addition, when the gate insulating film 1022 has a stacked structure, an impurity element that serves as a donor may be added to a layer which is in contact with the microcrystalline semiconductor film or a layer which is in contact with the substrate 1001.

As a method of forming an insulating film to which an impurity element that serves as a donor is added as the gate insulating film 1022, a gate insulating film may be formed using a gas including an impurity element that serves as a donor as well as a source gas of the gate insulating film. For example, a silicon nitride film including phosphorus can be formed by a plasma CVD method using silane, ammonium, and phosphine. In addition, a silicon oxynitride film including phosphorus can be formed by a plasma CVD method using silane, dinitrogen monoxide, ammonium, and phosphine.

Before the gate insulating film 1022 is formed, a gas including an impurity element that serves as a donor may be supplied to a reaction chamber of a film formation apparatus, and the surface of the gate insulating film 1022 and an inner wall of the reaction chamber may adsorb the impurity element that serves as a donor. After that, the gate insulating film 1022 is formed, and then a microcrystalline semiconductor film is formed. Since the gate insulating film 1022 and the microcrystalline semiconductor film are deposited while taking in the impurity element that serves as a donor, the microcrystalline semiconductor film 1026 to which an impurity element that serves as a donor is added can be formed.

Alternatively, before the microcrystalline semiconductor film 1026 to which an impurity element that serves as a donor is added is formed, a gas including an impurity element that serves as a donor may be supplied to the reaction chamber of the film formation apparatus so that the impurity element that serves as a donor may be adsorbed onto the gate insulating film 1022 and the inner wall of the reaction chamber. Then, by depositing the microcrystalline semiconductor film, the microcrystalline semiconductor film is deposited while taking in the impurity element that serves as a donor; therefore, the microcrystalline semiconductor film 1026 to which an impurity element that serves as a donor is added can be formed.

Note that here, the amorphous semiconductor film is formed over the microcrystalline semiconductor film 1026 to which the impurity element that serves as a donor is added; however, a microcrystalline semiconductor film to which an impurity element that serves as a donor is added may be formed with a single layer.

Figure 15B:
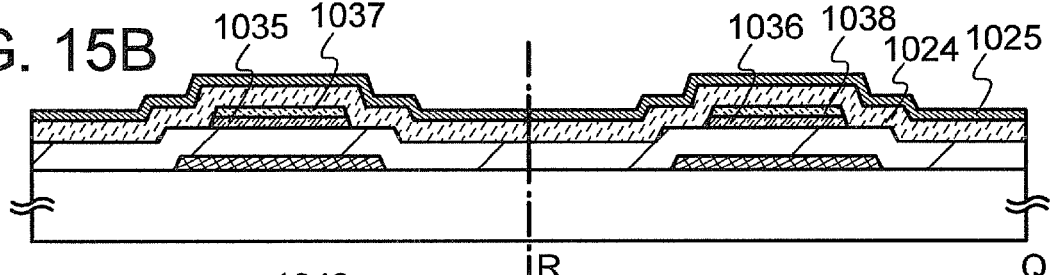

Then, after a resist is applied to the amorphous semiconductor film, the amorphous semiconductor film 1027 and the microcrystalline semiconductor film 1026 to which an impurity element that serves as a donor is added are etched into a desired shape by using a resist mask formed by a photolithography step. As illustrated in FIG. 15B, a microcrystalline semiconductor film 1036 to which an impurity element that serves as a donor and an amorphous semiconductor film 1038 are formed in the region where the thin film transistor is formed. In addition, a microcrystalline semiconductor film 1035 to which an impurity element that serves as a donor is added and an amorphous semiconductor film 1037 are formed in the region where the protection circuit is formed. Then, the resist mask is removed.

Next, the amorphous semiconductor film 1024 is formed over the stacks of the semiconductor films and the gate insulating film. Then, the semiconductor film 1025 to which an impurity element imparting one conductivity type is added is formed over the amorphous semiconductor film 1024.

Figure 15C:
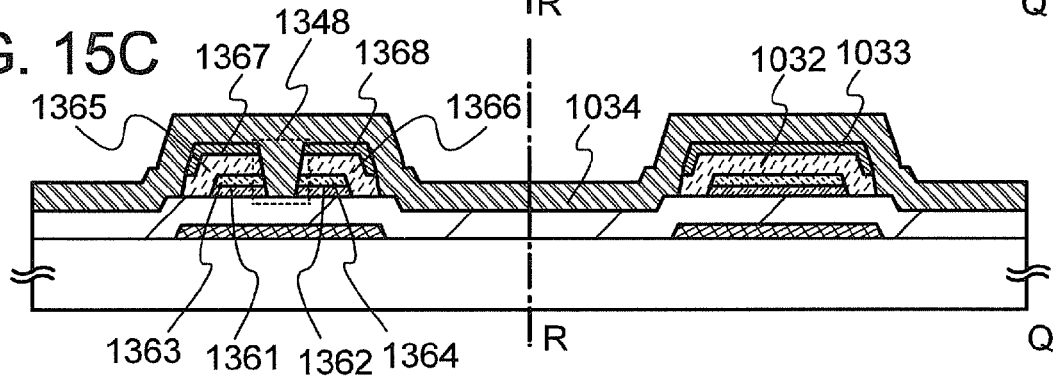

Then, after a resist is applied to the semiconductor film 1025 to which an impurity element imparting one conductivity type is added, the semiconductor film 1025 to which an impurity element imparting one conductivity type is added, the amorphous semiconductor film 1024, the amorphous semiconductor film 1037, and the microcrystalline semiconductor film 1035 to which an impurity element that serves as a donor is added are etched into a desired shape by using a resist mask formed by a photolithography step. As illustrated in FIG. 15C, the amorphous semiconductor film 1032 and the semiconductor film 1033 to which an impurity element imparting one conductivity type is added are formed in the region where the thin film transistor is formed. Note that the amorphous semiconductor film 1032 and the semiconductor film 1033 to which an impurity element imparting one conductivity type is added overlap the microcrystalline semiconductor film 1036 to which an impurity element that serves as a donor is added and the amorphous semiconductor film 1038, as illustrated in FIG. 15C. In addition, a side surface of the microcrystalline semiconductor film 1036 to which an impurity element that serves as a donor is added is covered with the amorphous semiconductor film 1032.

In the region where the protection circuit is formed, the microcrystalline semiconductor films 1361 and 1362 to which an impurity element that serves as a donor is added, the amorphous semiconductor films 1363 and 1364, the amorphous semiconductor films 1365 and 1366, and the semiconductor films 1367 and 1368 to which an impurity element imparting one conductivity type is added are formed. Note that a stack including the microcrystalline semiconductor film 1361 to which an impurity element that serves as a donor is added, the amorphous semiconductor film 1363, the amorphous semiconductor film 1365, and the semiconductor film 1367 to which an impurity element imparting one conductivity type is added, and a stack including the microcrystalline semiconductor film 1362 to which an impurity element that serves as a donor is added, the amorphous semiconductor film 1364, the amorphous semiconductor film 1366, and the semiconductor film 1368 to which an impurity element imparting one conductivity type is added are separated from each other (the separation portion 1348). Note that instead of separating the stacks of the semiconductor films, a depressed portion which is formed by partly etching the stacks, may be provided. Then, the resist mask is removed.

Next, the conductive film 1034 is formed over the stacks of the semiconductor films and the gate insulating film 1022.

Figure 15D:
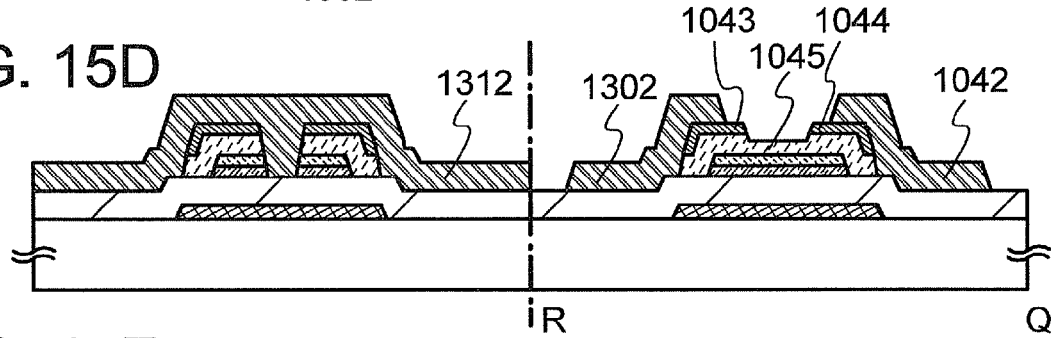

Then, after a resist is applied to the conductive film 1034, the conductive film 1034 is etched into a desired shape by using a resist mask formed by a photolithography step. As illustrated in FIG. 15D, the source wiring 1302 and the drain electrode 1042 are formed in the region where the thin film transistor is formed. In addition, in the region where the protection circuit is formed, the second common line 1312 is formed.

Next, the semiconductor film to which an impurity element imparting one conductivity type is added is etched using a resist mask to form the source and drain regions 1043 and 1044. In the etching step, part of the amorphous semiconductor film 1032 is also etched. The amorphous semiconductor film 1032 that is partly etched and has a depressed portion is referred to as the amorphous semiconductor film 1045. The source and drain regions and the depressed portion of the amorphous semiconductor film can be formed in the same step. Then, the resist mask is removed.

Next, dry etching may be performed under such a condition that the amorphous semiconductor film 1045 which is exposed is not damaged and an etching rate with respect to the amorphous semiconductor film 1045 is low.

Through the above steps, the thin film transistor is formed in the pixel portion. In the peripheral portion, the protection circuit can be formed.

Figure 15E:
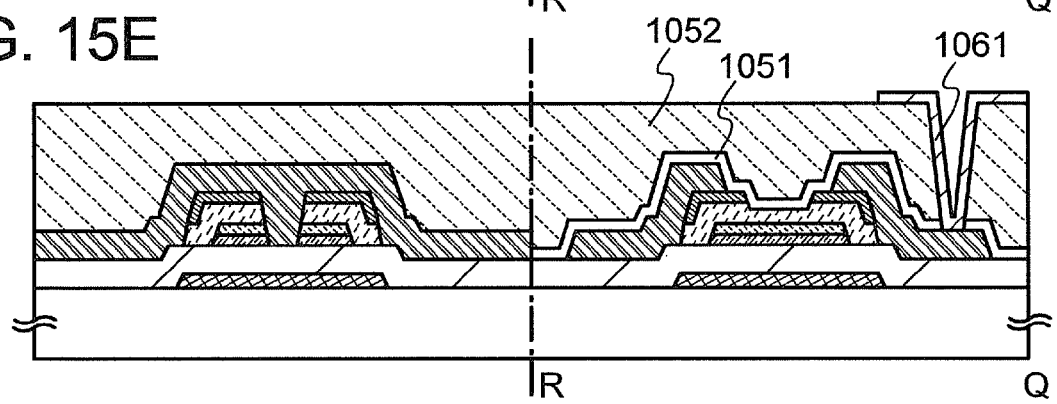
Figure 16:
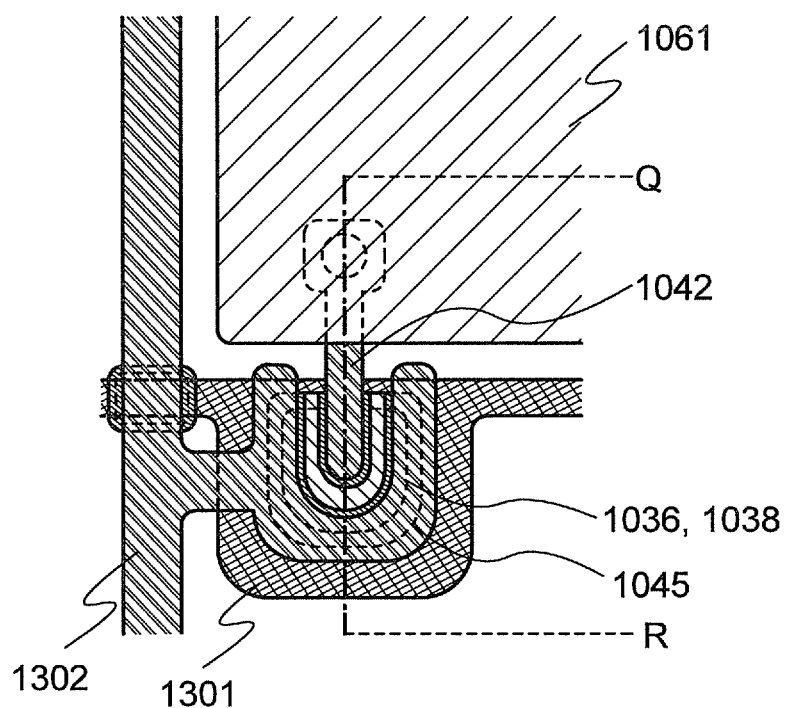
FIG. 16 is a plan view illustrating a manufacturing process of a protection circuit of an embodiment mode.

Next, through the steps illustrated in FIGS. 13E and 13F, the protective insulating film 1051, the planarization film 1052, and the pixel electrode 1061 to be connected to the drain electrode are formed as illustrated in FIG. 15E. Note that the right side of FIG. 15E corresponds to the cross-sectional view taken along line Q-R in FIG. 16.

Through the above steps, the protection circuit illustrated in FIG. 9 can be formed at the same time as formation of the thin film transistor. Accordingly, through a small number of steps, an element substrate which has the protection circuit and the thin film transistor and can be used for a display device can be formed. In addition, an element substrate whose frame can be narrowed can be formed.

Next, a manufacturing process of the protection circuit illustrated in FIGS. 10A to 10C and a thin film transistor is described with reference to FIGS. 13A to 13F, FIGS. 17A to 17D, and FIGS. 18A to 18F. Note that a cross section of a region where the protection circuit is formed is illustrated on the left side of FIGS. 17A to 17D, and a cross section of a region where the thin film transistor is formed as a switching element in a pixel is illustrated on the right side of FIGS. 17A to 17D.

Figure 17A:
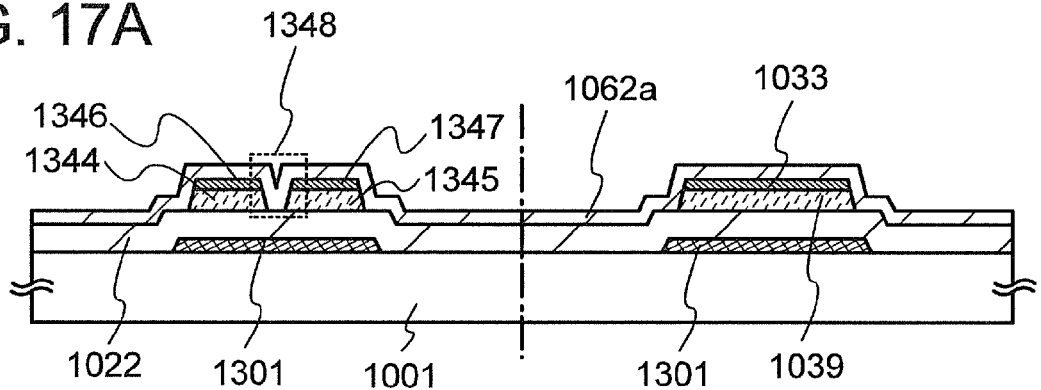
FIGS. 17A to 17D are cross-sectional views illustrating a manufacturing process of a protection circuit of an embodiment mode.

Through the step of FIG. 13A, the gate wiring 1301 is formed over the substrate 1001, as illustrated in FIG. 17A.

Next, the gate insulating film 1022 is formed over the gate wiring 1301 and the substrate 1001.

Subsequently, a semiconductor film is formed over the gate insulating film 1022. Here, an amorphous semiconductor film is formed as the semiconductor film. Note that here, the amorphous semiconductor film is formed with a single layer as the semiconductor film; however, a microcrystalline semiconductor film or a crystalline semiconductor film may be formed with a single layer as the semiconductor film. Alternatively, a microcrystalline semiconductor film and an amorphous semiconductor film maybe stacked as illustrated in FIGS. 13A to 13F.

Next, a semiconductor film to which an impurity element imparting one conductivity type is added is formed over the semiconductor film. Then, after a resist is applied to the semiconductor film to which an impurity element imparting one conductivity type is added, the amorphous semiconductor film and the semiconductor film to which an impurity element imparting one conductivity type is added are etched into a desired shape by using a resist mask formed by a photolithography step. An amorphous semiconductor film 1039 and the semiconductor film 1033 to which an impurity element imparting one conductivity type is added are formed in the region where the thin film transistor is formed. In addition, the amorphous semiconductor films 1344 and 1345 and the semiconductor films 1346 and 1347 to which an impurity element imparting one conductivity type is added are formed in the region where the protection circuit is formed. Note that the stack including the amorphous semiconductor film 1344 and the semiconductor film 1346 to which an impurity element imparting one conductivity type is added, and the stack including the amorphous semiconductor film 1345 and the semiconductor film 1347 to which an impurity element imparting one conductivity type is added are separated from each other (the separation portion 1348). Note that instead of separating the stacks of the semiconductor films, a depressed portion which is formed by partly etching the stacks, may be provided. Then, the resist mask is removed.

Next, an insulating film 1062a is formed over the stacks of the semiconductor films and the gate insulating film. Note that the stack including the amorphous semiconductor film 1344 and the semiconductor film 1346 to which an impurity element imparting one conductivity type is added, and the stack including the amorphous semiconductor film 1345 and the semiconductor film 1347 to which an impurity element imparting one conductivity type is added are separated from each other (the separation portion 1348). In addition, the insulating film 1062a covers the separation portion 1348.

Figure 17B:
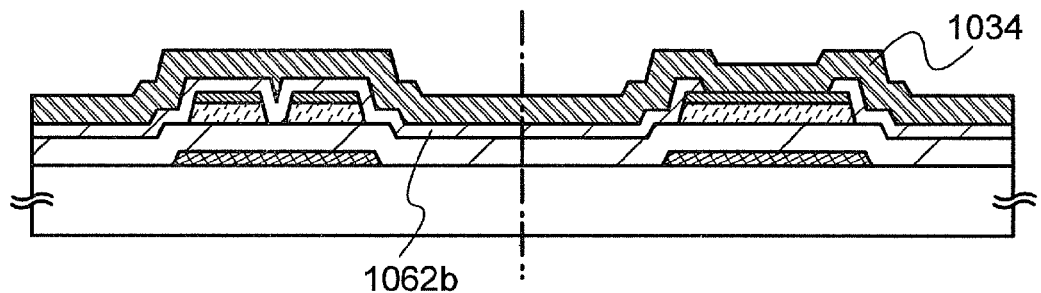

Then, after a resist is applied to the insulating film 1062a, the insulating film 1062a is etched into a desired shape by using a resist mask formed by a photolithography step. As illustrated in FIG. 17B, an insulating film 1062b is formed to expose part of the semiconductor film 1033 to which an impurity element imparting one conductivity type is added in the region where the thin film transistor is formed. Then, the resist mask is removed.

Next, the conductive film 1034 is formed over the insulating film 1062b and the exposed semiconductor film 1033 to which an impurity element imparting one conductivity type is added.

Figure 17C:
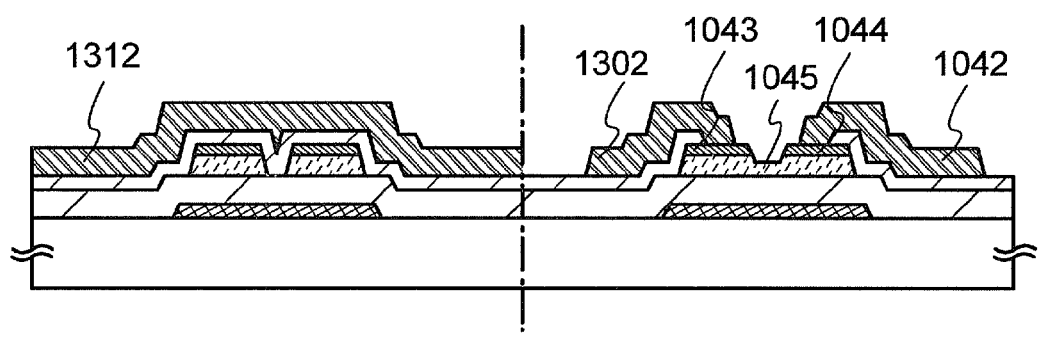

Then, after a resist is applied to the conductive film 1034, the conductive film 1034 is etched into a desired shape by using a resist mask formed by a photolithography step. As illustrated in FIG. 17C, the source wiring 1302 and the drain electrode 1042 are formed in the region where the thin film transistor is formed. In addition, in the region where the protection circuit is formed, the second common line 1312 is formed.

Next, the semiconductor film to which an impurity element imparting one conductivity type is added is etched using a resist mask to form the source and drain regions 1043 and 1044. In the etching step, part of the amorphous semiconductor film 1039 is also etched. The amorphous semiconductor film 1039 that is partly etched and has a depressed portion is referred to as the amorphous semiconductor film 1045. The source and drain regions and the depressed portion of the amorphous semiconductor film can be formed in the same step. Then, the resist mask is removed.

Through the above steps, the thin film transistor is formed in the pixel portion. In the peripheral portion, the protection circuit can be formed.

Figure 17D:
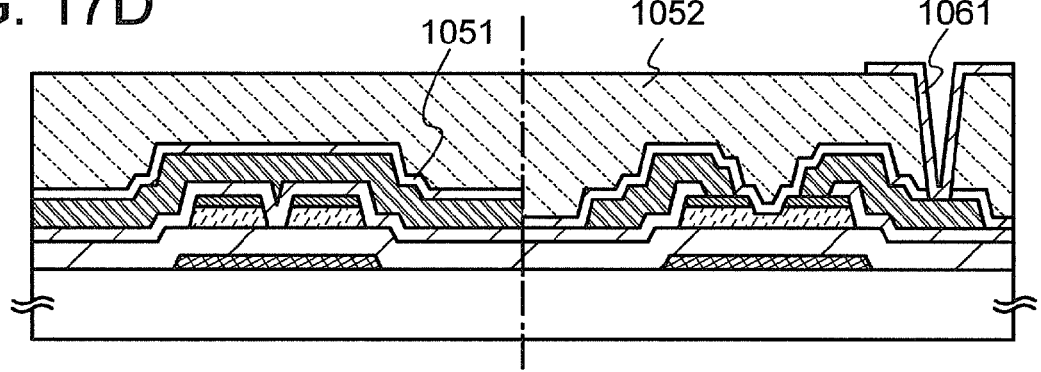

Next, through the steps illustrated in FIGS. 13E and 13F, the protective insulating film 1051, the planarization film 1052, and the pixel electrode 1061 to be connected to the drain electrode 1042 are formed as illustrated in FIG. 17D.

Through the above steps, the protection circuit illustrated in FIGS. 10A to 10C can be formed at the same time as formation of the thin film transistor. Accordingly, through a small number of steps, an element substrate which has the protection circuit and the thin film transistor and can be used for a display device can be formed. In addition, an element substrate whose frame can be narrowed can be formed.

Next, a manufacturing process of the protection circuit illustrated in FIGS. 11A to 11C and a thin film transistor is described with reference to FIGS. 13A to 13F, and FIGS. 18A to 18F. Note that a cross section of a region where the protection circuit is formed is illustrated on the left side of FIGS. 18A to 18F, and a cross section of a region where the thin film transistor is formed as a switching element in a pixel is illustrated on the right side of FIGS. 18A to 18F.

Through the step of FIG. 13A, the gate wiring 1301 is formed over the substrate 1001. Next, the gate insulating film 1022 is formed over the gate wiring 1301 and the substrate 1001.

Figure 18A:
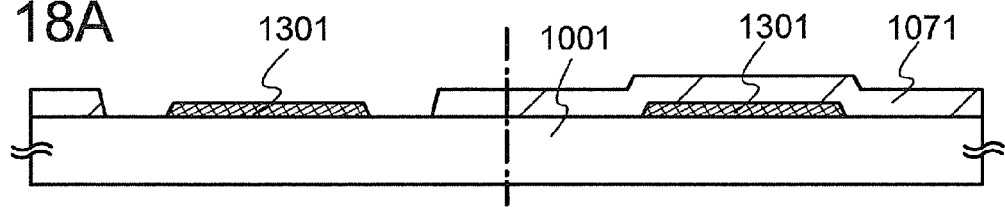
FIGS. 18A to 18F are cross-sectional views illustrating a manufacturing process of a protection circuit of an embodiment mode.

Then, after a resist is applied to the gate insulating film 1022, part of the gate insulating film 1022 is etched by using a resist mask formed by a photolithography step. As illustrated in FIG. 18A, a gate insulating film 1071 is formed. Here, in the region where the protection circuit is formed, the gate wiring 1301 is exposed. Then, the resist mask is removed.

Subsequently, a semiconductor film is formed over the gate insulating film 1071. Here, an amorphous semiconductor film 1029 is formed as the semiconductor film. Note that here, the amorphous semiconductor film is formed with a single layer as the semiconductor film; however, a microcrystalline semiconductor film or a crystalline semiconductor film may be formed with a single layer as the semiconductor film. As illustrated in FIGS. 13A to 13F, a microcrystalline semiconductor film and an amorphous semiconductor film may be stacked.

Figure 18B:
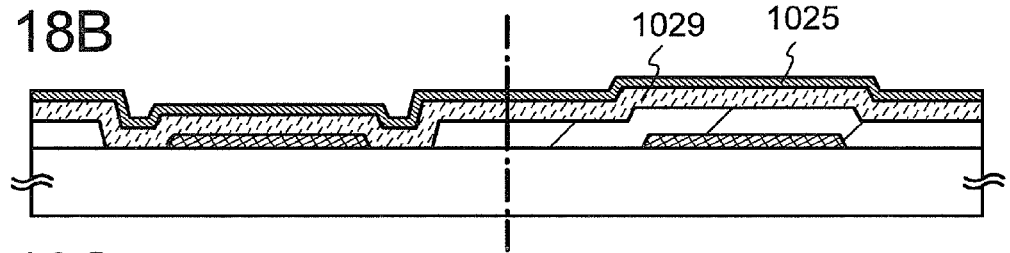

Subsequently, the semiconductor film 1025 to which an impurity element imparting one conductivity type is added is formed over the semiconductor film (see FIG. 18B). Then, after a resist is applied to the semiconductor film 1025 to which an impurity element imparting one conductivity type is added, the amorphous semiconductor film 1029 and the semiconductor film 1025 to which an impurity element imparting one conductivity type is added are etched into a desired shape by using a resist mask formed by a photolithography step. The amorphous semiconductor film 1039 and the semiconductor film 1033 to which an impurity element imparting one conductivity type is added are formed in the region where the thin film transistor is formed. In addition, the amorphous semiconductor films 1344 and 1345 and the semiconductor films 1346 and 1347 to which an impurity element imparting one conductivity type is added are formed in the region where the protection circuit is formed. Note that the stack including the amorphous semiconductor film 1344 and the semiconductor film 1346 to which an impurity element imparting one conductivity type is added, and the stack including the amorphous semiconductor film 1345 and the semiconductor film 1347 to which an impurity element imparting one conductivity type is added are separated from each other (the separation portion 1348). Note that instead of separating the stacks of the semiconductor films, a depressed portion which is formed by partly etching the stacks, may be provided. Then, the resist mask is removed.

Figure 18C:
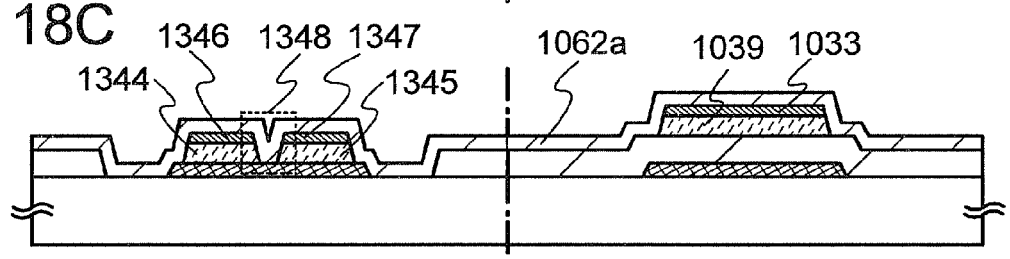

Next, the insulating film 1062a is formed over the stacks of the semiconductor films and the gate insulating film (see FIG. 18C). Note that the stack including the amorphous semiconductor film 1344 and the semiconductor film 1346 to which an impurity element imparting one conductivity type is added, and the stack including the amorphous semiconductor film 1345 and the semiconductor film 1347 to which an impurity element imparting one conductivity type is added are separated from each other (the separation portion 1348). In addition, the insulating film 1062a covers the separation portion 1348.

Figure 18D:
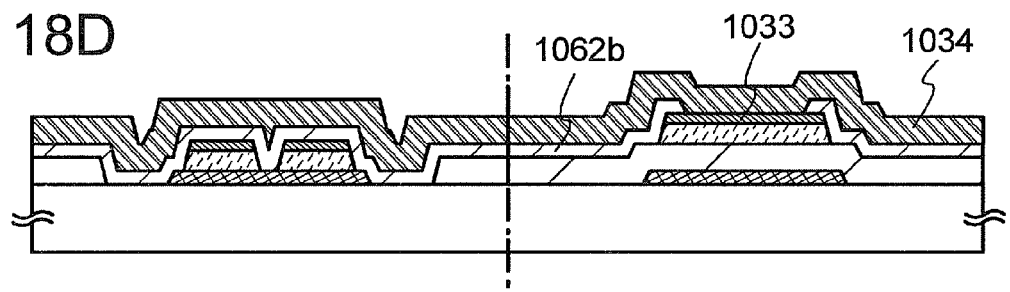

Then, after a resist is applied to the insulating film 1062a, the insulating film 1062a is etched into a desired shape by using a resist mask formed by a photolithography step. As illustrated in FIG. 18D, the insulating film 1062b is formed to expose part of the semiconductor film 1033 to which an impurity element imparting one conductivity type is added in the region where the thin film transistor is formed. Then, the resist mask is removed.

Next, the conductive film 1034 is formed over the insulating film 1062b and the exposed semiconductor film 1033 to which an impurity element imparting one conductivity type is added.

Figure 18E:
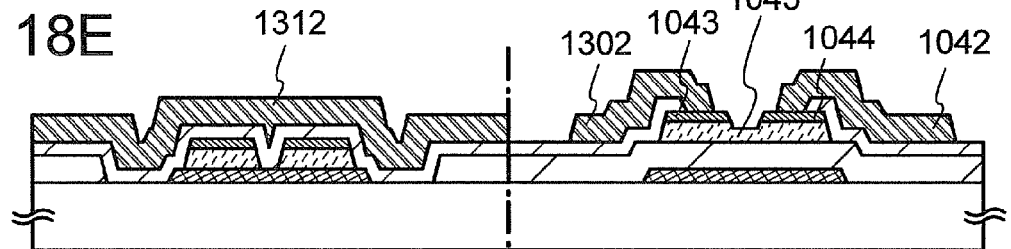

Then, after a resist is applied to the conductive film 1034, the conductive film 1034 is etched into a desired shape by using a resist mask formed by a photolithography step. As illustrated in FIG. 18E, the source wiring 1302 and the drain electrode 1042 are formed in the region where the thin film transistor is formed. In addition, in the region where the protection circuit is formed, the second common line 1312 is formed.

Next, the semiconductor film to which an impurity element imparting one conductivity type is added is etched using a resist mask to form the source and drain regions 1043 and 1044. In the etching step, part of the amorphous semiconductor film 1039 is also etched. The amorphous semiconductor film 1039 that is partly etched and has a depressed portion is referred to as the amorphous semiconductor film 1045. The source and drain regions and the depressed portion of the amorphous semiconductor film can be formed in the same step. Then, the resist mask is removed.

Next, dry etching may be performed under such a condition that the amorphous semiconductor film 1045 which is exposed is not damaged and an etching rate with respect to the amorphous semiconductor film 1045 is low.

Through the above steps, the thin film transistor is formed in the pixel portion. In the peripheral portion, the protection circuit can be formed.

Figure 18F:
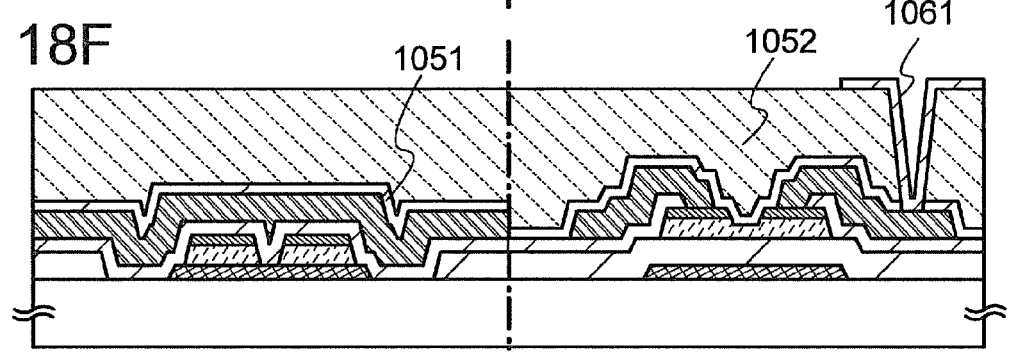

Next, through the steps illustrated in FIGS. 13E and 13F, the protective insulating film 1051, the planarization film 1052, and the pixel electrode 1061 to be connected to the drain electrode are formed as illustrated in FIG. 18F.

Through the above steps, the protection circuit illustrated in FIGS. 11A to 11C can be formed at the same time as formation of the thin film transistor. Accordingly, through a small number of steps, an element substrate which has the protection circuit and the thin film transistor and can be used for a display device can be formed. In addition, an element substrate whose frame can be narrowed can be formed.

Next, another method of manufacturing a thin film transistor, which is different from the above modes, is described with reference to FIGS. 13A to 13F, FIGS. 19A to 19E, FIGS.

Figure 21:
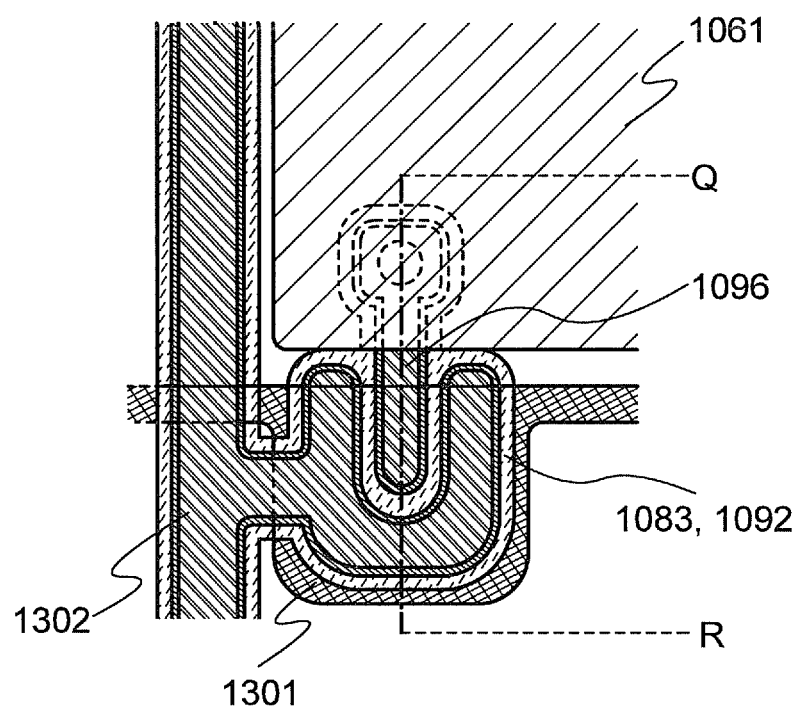
FIG. 21 is a plan view illustrating a manufacturing process of a protection circuit of an embodiment mode.

20A to 20D, and FIG. 21. Here, a manufacturing process of the thin film transistor using a multi-tone mask is described. Note that a cross section of a region where the protection circuit is formed is illustrated on the left side of FIGS. 19A to 19E, and a cross section of a region where the thin film transistor is formed as the switching element in the pixel is illustrated on the right side of FIGS. 19A to 19E. In addition, the right side of FIGS. 19A to 19E is a cross-sectional view taken along line Q-R illustrated in FIG. 21.

Through the step of FIG. 13A, the gate wiring 1301 is formed over the substrate 1001. Next, the gate insulating film 1022 is formed over the gate wiring 1301 and the substrate 1001.

Next, through the step of FIG. 13B, the microcrystalline semiconductor film 1023, the amorphous semiconductor film 1024, and the semiconductor film 1025 to which an impurity element imparting one conductivity type is added are sequentially stacked over the gate insulating film 1022. Note that instead of the microcrystalline semiconductor film 1023 and the amorphous semiconductor film 1024, a microcrystalline semiconductor film, an amorphous semiconductor film, or a crystalline semiconductor film may be formed with a single layer.

Then, after a resist is applied to the semiconductor film to which an impurity element imparting one conductivity type is added, the microcrystalline semiconductor film 1023, the amorphous semiconductor film 1024, and the semiconductor film 1025 to which an impurity element imparting one conductivity type is added are etched into a desired shape by using a resist mask formed by a photolithography step. A microcrystalline semiconductor film 1073, an amorphous semiconductor film 1074, and a semiconductor film 1075 to which an impurity element imparting one conductivity type is added are formed in the region where the thin film transistor is formed. In addition, the microcrystalline semiconductor films 1351 and 1352, the amorphous semiconductor films 1353 and 1354, and the semiconductor films 1346 and 1347 to which an impurity element imparting one conductivity type is added are formed in the region where the protection circuit is formed. Then, the resist mask is removed (see FIG. 19A).

Note that the stack including the microcrystalline semiconductor film 1351, the amorphous semiconductor film 1353, and the semiconductor film 1346 to which an impurity element imparting one conductivity type is added, and the stack including the microcrystalline semiconductor film 1352, the amorphous semiconductor film 1354, and the semiconductor film 1347 to which an impurity element imparting one conductivity type is added are separated from each other (the separation portion 1348) in the region where the protection circuit is formed. Note that instead of separating the stacks of the semiconductor films, a depressed portion which is formed by partly etching the stacks, may be provided.

Figure 19A:
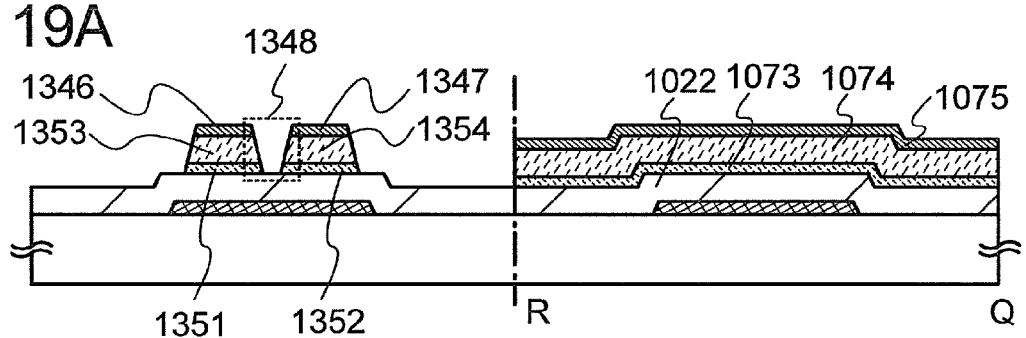
FIGS. 19A to 19E are cross-sectional views illustrating a manufacturing process of a protection circuit of an embodiment mode.
Figure 19B:
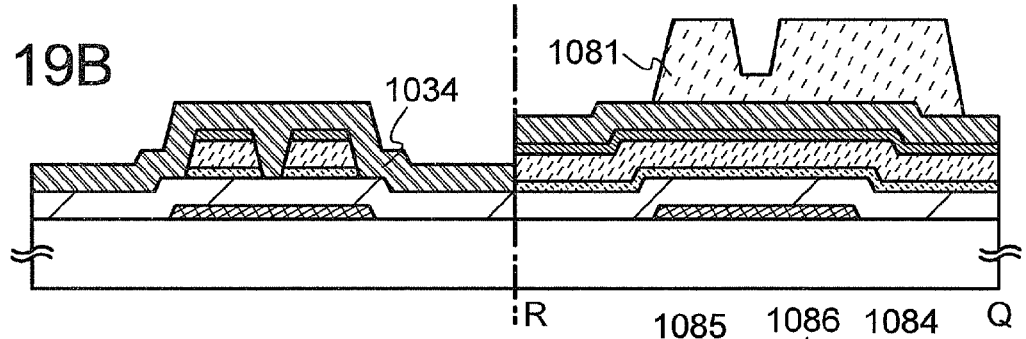

Next, as illustrated in FIG. 19B, the conductive film 1034 is formed over the gate insulating film 1022, the semiconductor films 1346, 1347, and 1075 to which an impurity element imparting one conductivity type is added.

Then, a resist is applied to the conductive film 1034. As the resist, a positive resist or a negative resist can be used. Here, a positive resist is used.

Next, a resist is irradiated with light using a multi-tone mask, and then the resist is developed, whereby a resist mask 1081 is formed.

Now, light exposure using the multi-tone masks 159a and 159b are described with reference to FIGS. 20A to 20D.

A multi-tone photomask can achieve three levels of light exposure to obtain an exposed portion, a half-exposed portion, and an unexposed portion; one-time exposure and development process allows a resist mask with regions of plural thicknesses (typically, two kinds of thicknesses) to be formed. Therefore, the use of a multi-tone photomask allows the number of photomasks to be reduced.

Figure 20A:
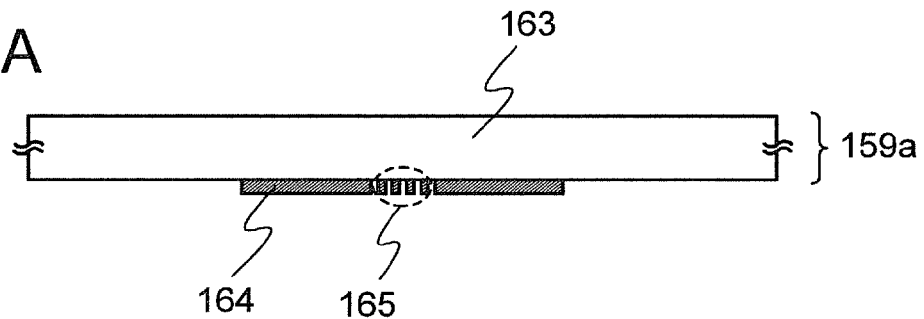
FIGS. 20A to 20D are diagrams illustrating a multi-tone photomask applicable to an embodiment mode.
Figure 20B:
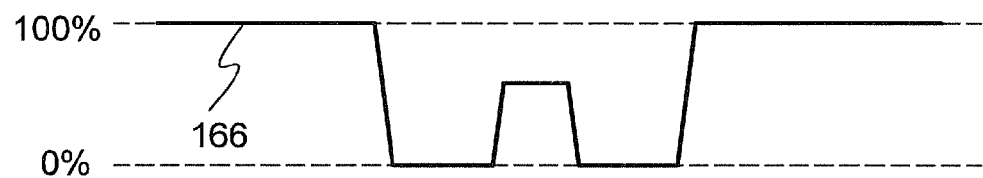
Figure 20C:
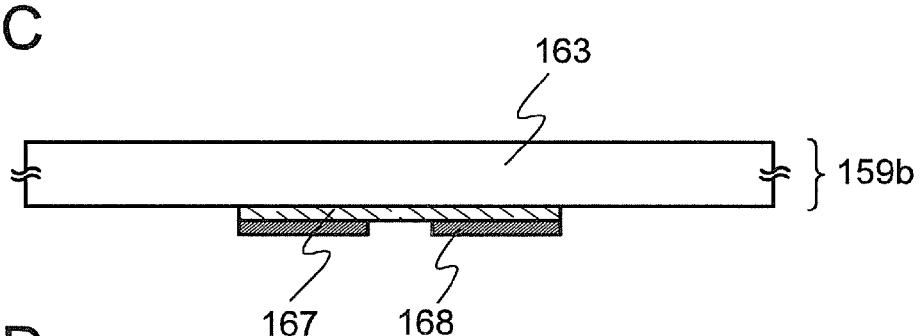

Typical examples of a multi-tone mask include a gray-tone mask 159a illustrated in FIG. 20A and a half-tone mask 159b illustrated in FIG. 20C.

As illustrated in FIG. 20A, the gray-tone mask 159a includes a light-transmitting substrate 163 provided with a light-blocking portion 164 and a diffraction grating 165. The light transmittance of the light-blocking portion 164 is 0%. The diffraction grating 165 has a light-transmitting portion in a slit form, a dot form, a mesh form, or the like with intervals which are equal to or less than the resolution limit for light used for the exposure; thus, the light transmittance can be controlled. The diffraction grating 165 can be in a slit form, a dot form, or a mesh form with regular intervals; or in a slit form, a dot form, or a mesh form with irregular intervals.

For the light-transmitting substrate 163, a light-transmitting substrate, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 is provided is 100%, as illustrated in FIG. 20B. The light transmittance of the diffraction grating 165 can be controlled in a range of 10% to 70%. The light transmittance of the diffraction grating 165 can be controlled with an interval or a pitch of slits, dots, or meshes of the diffraction grating 165.

As illustrated in FIG. 20C, the half-tone mask 159b includes the light-transmitting substrate 163 provided with a semi-transmissive portion 167 and a light-blocking portion 168. The semi-transmissive portion 167 can be formed using MoSiN, MoSi, MoSiO, MoSiON, CrSi, or the like. The light-blocking portion 168 can be formed using a light-blocking material such as chromium or chromium oxide, which absorbs light.

Figure 20D:
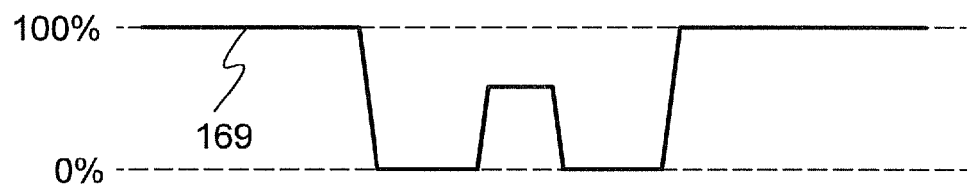

When the half-tone mask 159b is irradiated with light for exposure, a light transmittance 169 of the light-blocking portion 168 is 0% and that of a region where neither the light-blocking portion 168 nor the semi-transmissive portion 167 is provided is 100%, as illustrated in FIG. 20D. The light transmittance of the semi-transmissive portion 167 can be controlled in a range of 10% to 70%. The light transmittance of the semi-transmissive portion 167 can be controlled with the material of the semi-transmissive portion 167.

After the light exposure using the multi-tone mask is performed, development is carried out, whereby the resist mask 1081 having regions with different thicknesses can be formed, as illustrated in FIG. 19B. In the region where the protection circuit is formed, the resist mask 1081 for forming the second common line is formed.

Figure 19C:
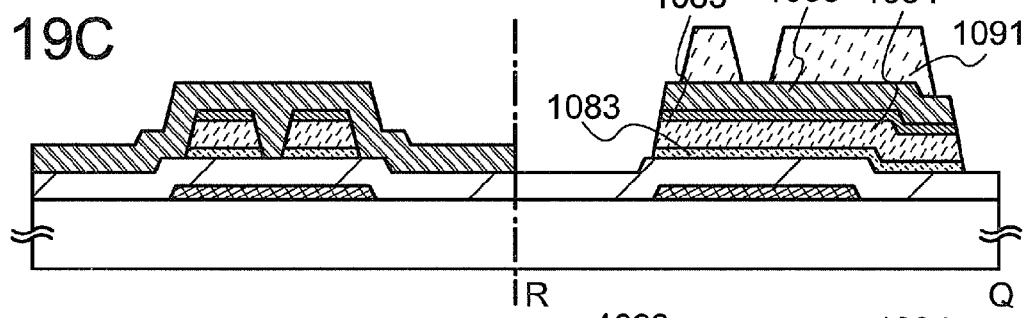

Next, with the resist mask 1081, the microcrystalline semiconductor film 1073, the amorphous semiconductor film 1074, the semiconductor film 1075 to which an impurity element imparting one conductivity type is added, and the conductive film 1034 are etched to be separated. As a result, a microcrystalline semiconductor film 1083, an amorphous semiconductor film 1084, a semiconductor film 1085 to which an impurity element imparting one conductivity type is added, and a conductive film 1086 can be formed as illustrated in FIG. 19C.

Next, the resist mask 1081 is ashed. As a result, the area and the thickness of the resist mask are reduced. At this time, the resist in a region with a small thickness (a region overlapping part of the gate wiring 1301) is removed to form a separated resist mask 1091, as illustrated in FIG. 19C.

Figure 19D:
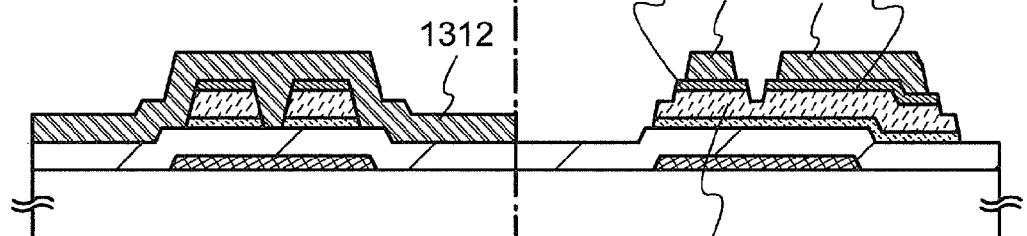

Next, the conductive film 1086 is etched to be separated using the resist mask 1091. As a result, the source wiring 1302 and a drain electrode 1096 can be formed as illustrated in FIG. 19D. When the conductive film 1086 is etched by wet etching using the resist mask 1091, the conductive film 1086 is isotropically etched. As a result, the source wiring 1302 and the drain electrode 1096 which have a smaller area than the resist mask 1091 can be formed. In addition, the conductive film is etched using the resist mask, and the second common line 1312 is formed.

Next, the semiconductor film 1085 to which an impurity element imparting one conductivity type is added is etched using the resist mask 1091 to form a pair of a source region 1093 and a drain region 1094. Note that part of the amorphous semiconductor film 1084 is also etched in the etching step. The amorphous semiconductor film that is partly etched is referred to as an amorphous semiconductor film 1092. Note that the amorphous semiconductor film 1092 is provided with a depressed portion. The source and drain regions and the depressed portion of the amorphous semiconductor film 1092 can be formed in the same step. Here, the amorphous semiconductor film 1084 is partly etched with use of the resist mask 1091 having a smaller area than the resist mask 1081, so that end portions of the amorphous semiconductor film 1092 are located outside the source region 1093 and the drain region 1094. In addition, the end portions of the source wiring 1302 and the drain electrode 1096 are not aligned with the end portions of the source region 1093 and the drain region 1094, and the end portions of the source region 1093 and the drain region 1094 are formed in the outside of the end portions of the source wiring 1302 and the drain electrode 1096. Then, the resist mask 1091 is removed.

Next, dry etching may be performed under such a condition that the amorphous semiconductor film 1092 which is exposed is not damaged and an etching rate with respect to the amorphous semiconductor film 1092 is low.

As illustrated in FIG. 19D, the end portions of the source wiring 1302 and the drain electrode 1096 are not aligned with those of the source region 1093 and the drain region 1094 respectively, whereby the end portions of the source wiring 1302 and the drain electrode 1096 can have a larger distance therebetween; thus, leakage current or short-circuit between wirings can be prevented. Accordingly, an inverted staggered thin film transistor can be manufactured.

Through the above steps, the thin film transistor is formed in the pixel portion. In the peripheral portion, the protection circuit can be formed.

Figure 19E:
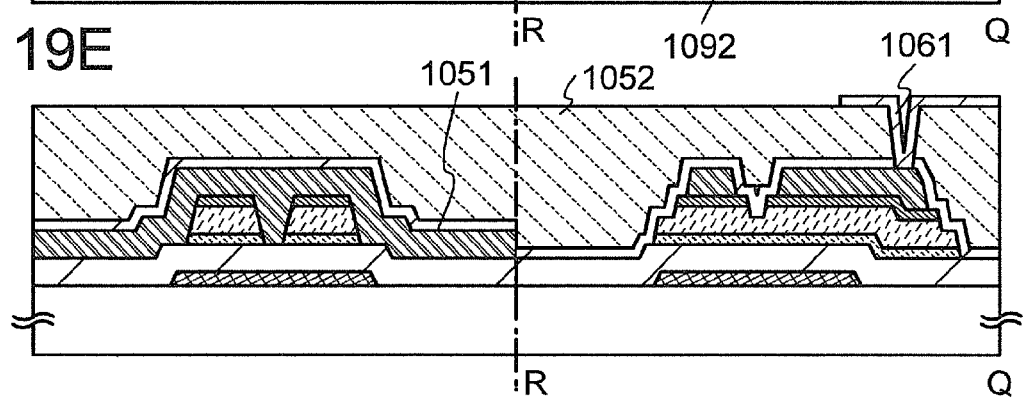

Next, through the steps illustrated in FIGS. 1 3E and 13F, the protective insulating film 1051, the planarization film 1052, and the pixel electrode 1061 to be connected to the drain electrode are formed as illustrated in FIG. 19E.

Through the above steps, the protection circuit can be formed at the same time as formation of the thin film transistor. Accordingly, through a small number of steps, an element substrate which has the protection circuit and the thin film transistor and can be used for a display device can be formed. In addition, an element substrate whose frame can be narrowed can be formed.

Note that in FIGS. 13A to 13F, FIG. 14, FIGS. 15A to 15E, FIG. 16, FIGS. 17A to 17D, FIGS. 18A to 18F, and FIGS. 19A to 19E, when the gate wiring 1301 is formed, a plurality of opening portions may be provided in a region intersecting the second common line 1312. As illustrated in FIGS. 12A to 12C, with such a structure, the gate wiring can have a projection part at the intersection of the gate wiring 1301 and the second common line 1312, whereby a structure in which a dielectric breakdown easily occurs can be formed between the gate wiring 1301 and the second common line 1312.

Note that in this embodiment mode, an inverted staggered thin film transistor is used as a thin film transistor. Instead of this, a top gate thin film transistor can be used. In that case, a gate wiring of a thin film transistor as well as a first common line lined up along the gate wiring may be formed, and a source wiring as well as a second common line lined up along the source wiring may be formed.

(Embodiment Mode 5)

Next, a structure of a display panel which is one mode of the display device will be described.

Figure 22A:
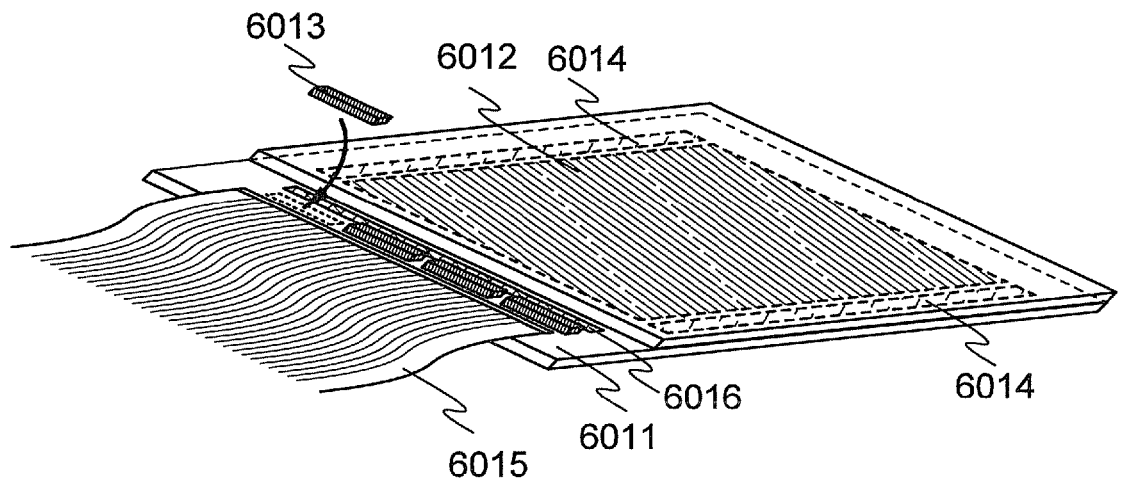
FIGS. 22A to 22C are perspective views each illustrating a display panel of an embodiment mode.

FIG. 22A illustrates a mode of a display panel in which a signal line driver circuit 6013 which is separately formed is connected to a pixel portion 6012 formed over a substrate 6011. An element substrate provided with the pixel portion 6012, a protection circuit 6016, and a scan line driver circuit 6014 is formed using the element substrate described in the above embodiment mode. When the signal line driver circuit is formed using a transistor in which higher field-effect mobility can be obtained compared with a thin film transistor in which an amorphous semiconductor film is used, an operation of the signal line driver circuit which demands higher driving frequency than that of the scan line driver circuit can be stabilized. Note that the signal line driver circuit 6013 may be formed using a transistor using a single crystal semiconductor for a channel formation region, a thin film transistor using a polycrystalline semiconductor for a channel formation region, or a transistor using an SOI for a channel formation region. The transistor using an SOI includes a transistor using a single crystal semiconductor layer provided over a glass substrate. The pixel portion 6012, the signal line driver circuit 6013, and the scan line driver circuit 6014 are each supplied with potential of a power source, a variety of signals, and the like via an FPC 6015. Further, the protection circuit described in the above embodiment mode may be provided between the signal line driver circuit 6013 and the FPC 6015 or between the signal line driver circuit 6013 and the pixel portion 6012. The protection circuit 6016 may be the protection circuit described in the above embodiment mode as well as a protection circuit formed using one or more elements selected from among a thin film transistor, a diode, a resistor, a capacitor, and the like.

Note that the signal driver circuit and the scan line driver circuit may both be formed over the same substrate as that of the pixel portion.

Figure 22B:
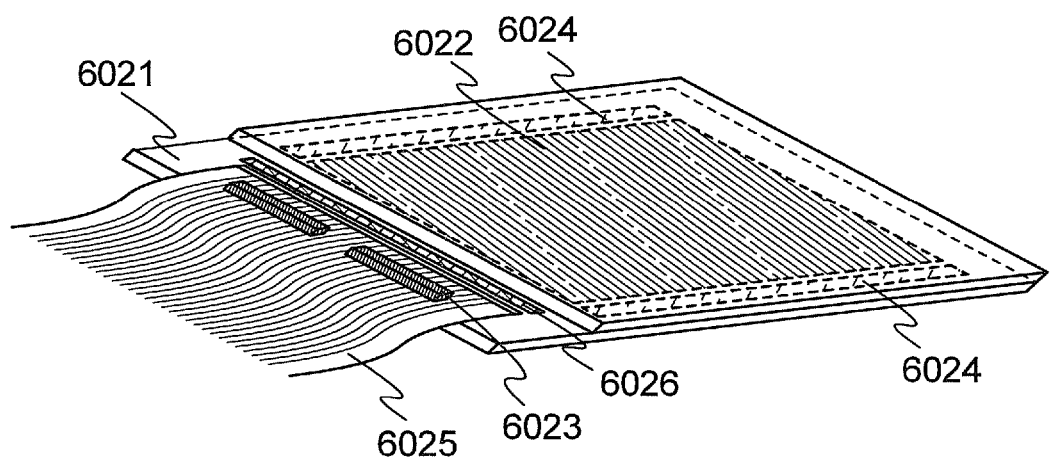

Also, when the driver circuit is separately formed, a substrate provided with the driver circuit is not always required to be attached to a substrate provided with the pixel portion, and may be attached to, for example, the FPC. FIG. 22B illustrates a mode of a panel of a display device in which a signal line driver circuit 6023 is separately formed and an element substrate in which a pixel portion 6022, a protection circuit 6026, and a scan line driver circuit 6024 are formed over a substrate 6021 is connected to an FPC 6025. The pixel portion 6022, the protection circuit 6026, and the scan line driver circuit 6024 are formed using the thin film transistor described in the above embodiment mode. The signal line driver circuit 6023 is connected to the pixel portion 6022 via the FPC 6025 and the protection circuit 6026. The pixel portion 6022, the signal line driver circuit 6023, and the scan line driver circuit 6024 are each supplied with potential of a power source, a variety of signals, and the like via the FPC 6025. The protection circuit 6026 described in the above embodiment mode is provided between the FPC 6025 and the pixel portion 6022.

The protection circuit 6026 may be the protection circuit described in the above embodiment mode as well as a protection circuit formed using one or more elements selected from among a thin film transistor, a diode, a resistor, a capacitor, and the like.

Figure 22C:
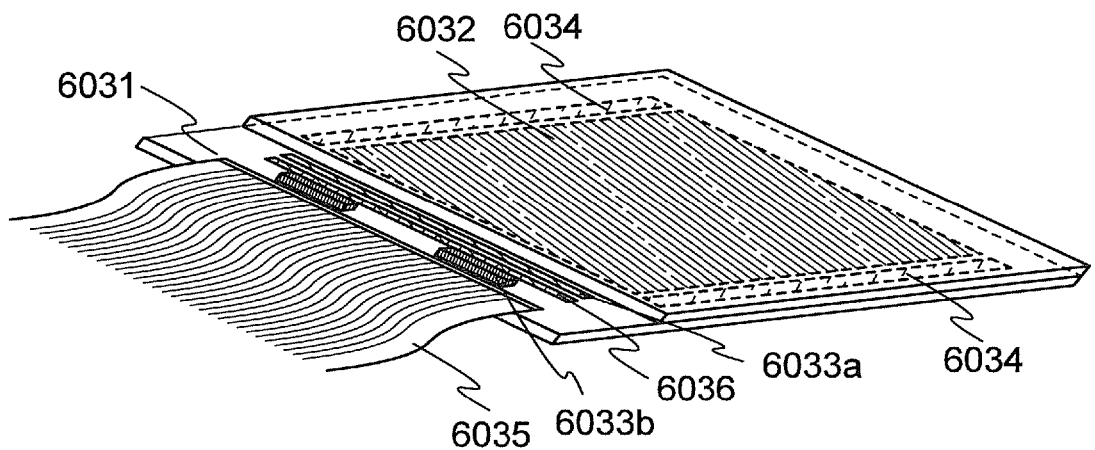

Furthermore, only part of the signal line driver circuit or only part of the scan line driver circuit may be formed over the same substrate as the pixel portion with use of the thin film transistor described in the above embodiment mode, and the rest may be formed separately and electrically connected to the pixel portion. FIG. 22C illustrates a mode of a panel of a display device in which an analog switch 6033a included in a signal line driver circuit is formed over a substrate 6031, over which a pixel portion 6032 and a scan line driver circuit 6034 are formed, and a shift register 6033b included in the signal line driver circuit is separately formed over a different substrate and attached to the substrate 6031. The pixel portion 6032, a protection circuit 6036, and the scan line driver circuit 6034 are formed using the thin film transistor described in the above embodiment mode. The shift register 6033b included in the signal line driver circuit is connected to the pixel portion 6032 via an FPC 6035 and the protection circuit 6036. The pixel portion 6032, the signal line driver circuit, and the scan line driver circuit 6034 are each supplied with potential of a power source, a variety of signals, and the like via the FPC 6035. The protection circuit 6036 described in the above embodiment mode is provided between the shift register 6033b and the analog switch 6033a. The protection circuit 6036 may be the protection circuit described in the above embodiment mode as well as a protection circuit formed using one or more elements selected from among a thin film transistor, a diode, a resistor, a capacitor, and the like.

As illustrated in FIGS. 22A to 22C, in display devices of this embodiment mode, all or part of the driver circuit can be formed over the same substrate as the pixel portion, using the thin film transistor described in the above embodiment mode.

Note that there are no particular limitations on a connection method of a separately formed substrate, and a known method such as a COG method, a wire bonding method, or a TAB method can be used. Further, a connection position is not limited to the positions illustrated in FIGS. 22A to 22C as long as electrical connection is possible. Also, a controller, a CPU, a memory, or the like may be formed separately and connected.

Note that the signal line driver circuit used here includes a shift register and an analog switch. In addition to the shift register and the analog switch, another circuit such as a buffer, a level shifter, or a source follower may be included. Also, the shift register and the analog switch are not always required to be provided, and for example, a different circuit such as a decoder circuit by which selection of signal line is possible may be used instead of the shift register, and a latch or the like may be used instead of the analog switch.

(Embodiment Mode 6)

The element substrate obtained according to the above embodiment mode, the display device and the like using the element substrate can be used for a panel of an active matrix display device. That is, the above embodiment mode can be implemented in any of electronic devices incorporating the element substrate or the display device using the element substrate in a display portion.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 23A to 23D illustrate examples of such electronic devices.

Figure 23A:
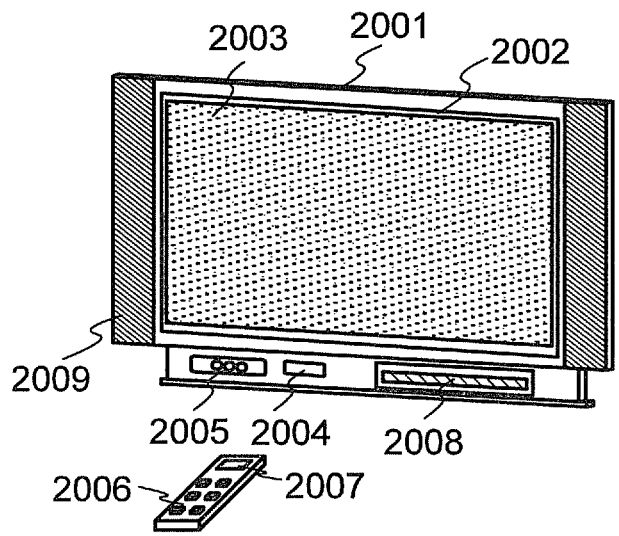
FIGS. 23A to 23D are perspective views each illustrating an electronic device using a display device of an embodiment mode.

FIG. 23A illustrates a television device. The television device can be completed by incorporating a display panel into a housing, as illustrated in FIG. 23A. A main screen 2003 is formed using the display panel, and other accessories such as a speaker portion 2009 and an operation switch are provided. In such a manner, a television device can be completed.

As illustrated in FIG. 23A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by using a switch built in the housing or a remote control unit 2006. Also, a display portion 2007 for displaying output information may also be provided in the remote control unit 2006.

Further, the television device may include a sub-screen 2008 formed using a second display panel for displaying channels, sound volume, and the like, in addition to the main screen 2003. In this structure, the main screen 2003 may be formed using a liquid crystal display panel, and the sub-screen 2008 may be formed using a light-emitting display panel. In addition, the structure may be set so that the main screen 2003 is formed using a light-emitting display panel and the sub-screen 2008 is formed using a light-emitting display panel, and the sub-screen 2008 is capable of being turned on or off.

Figure 24:
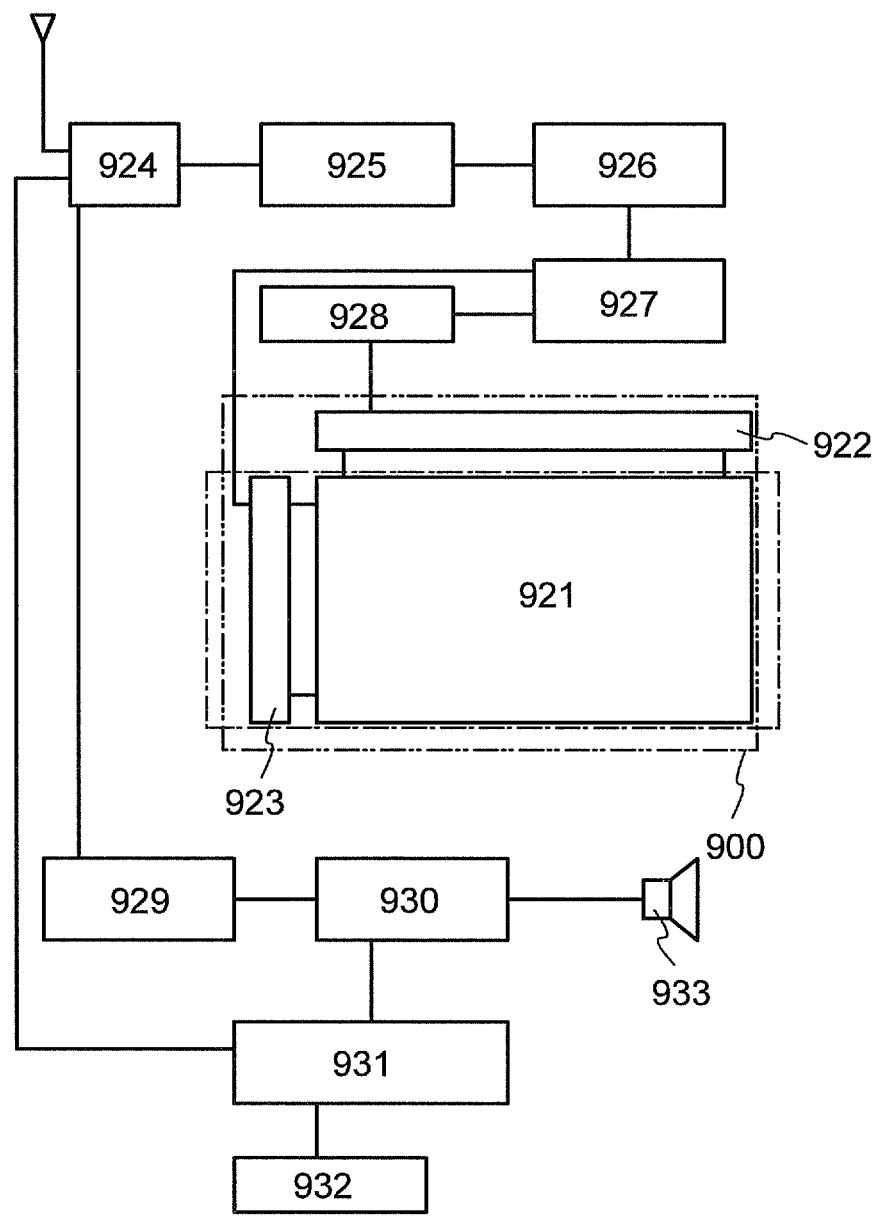
FIG. 24 is a diagram illustrating an electronic device using a display device of an embodiment mode.

FIG. 24 is a block diagram of a main structure of a television device. A display panel 900 is provided with a pixel portion 921. A signal line driver circuit 922 and a scan line driver circuit 923 may be mounted on the display panel 900 by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like on an input side of the video signal. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

This embodiment mode is certainly not limited to the television device and is also applicable to various usages such as a monitor of a personal computer and a display medium having a large area, for example, an information display board at a train station, an airport, or the like, or an advertisement display board on the street.

The element substrate and the display device including the element substrate which are described in the above embodiment mode are applied to the main screen 2003 and the sub-screen 2008, so that mass productivity of the television device in which image quality such as contrast or the like is improved can be increased. In addition, the size of the television device can be reduced.

Figure 23B:
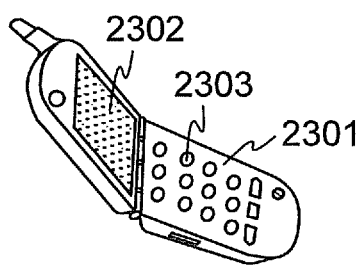

FIG. 23B illustrates an example of a cellular phone 2301. The cellular phone 2301 includes a display portion 2302, an operation portion 2303, and the like. The element substrate and the display device including the element substrate which are described in the above embodiment mode are applied to the display portion 2302, so that mass productivity of the cellular phone in which image quality such as contrast or the like is improved can be increased. In addition, the size of the cellular phone can be reduced.

Figure 23C:
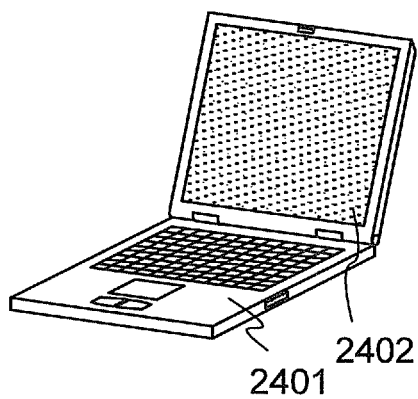

A portable computer illustrated in FIG. 23C includes a main body 2401, a display portion 2402, and the like. The element substrate and the display device including the element substrate which are described in the above embodiment mode are applied to the display portion 2402, so that mass productivity of the computer in which image quality such as contrast or the like is improved can be increased. In addition, the size of the computer can be reduced.

Figure 23D:
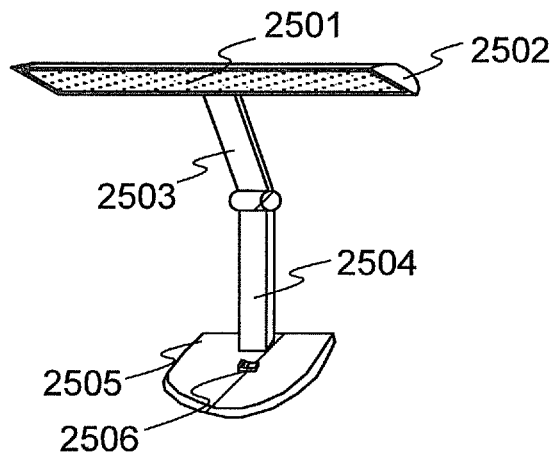

FIG. 23D illustrates a desk lamp including a lighting portion 2501, a shade 2502, an adjustable arm 2503, a support 2504, a base 2505, and a power supply switch 2506. The desk lamp is formed using the light-emitting device, which is described in the above embodiment mode, for the lighting portion 2501. Note that the term 'lighting appliance' also encompasses ceiling lights, wall lights, and the like. Use of the element substrate and the display device including the element substrate which are described in the above embodiment mode can increase mass productivity and provide inexpensive desk lamps. In addition, the size of the lighting appliance can be reduced.

Figure 25A:
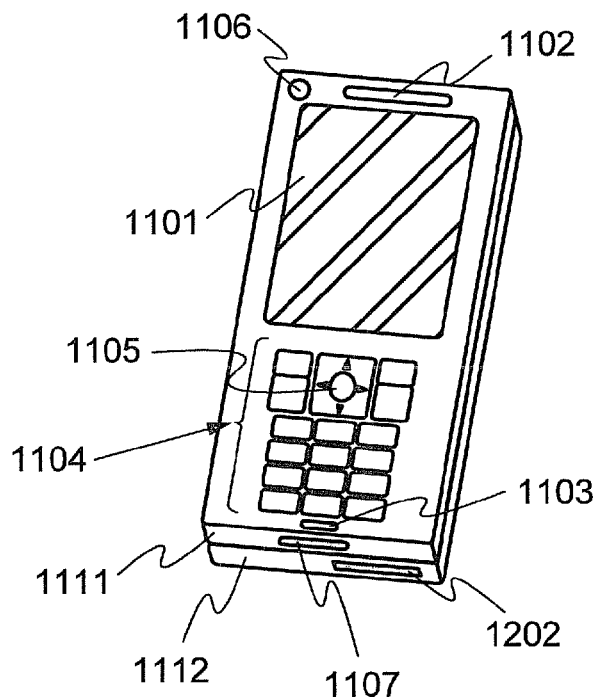
FIGS. 25A to 25C are perspective views each illustrating an electronic device using a display device of an embodiment mode.
Figure 25B:
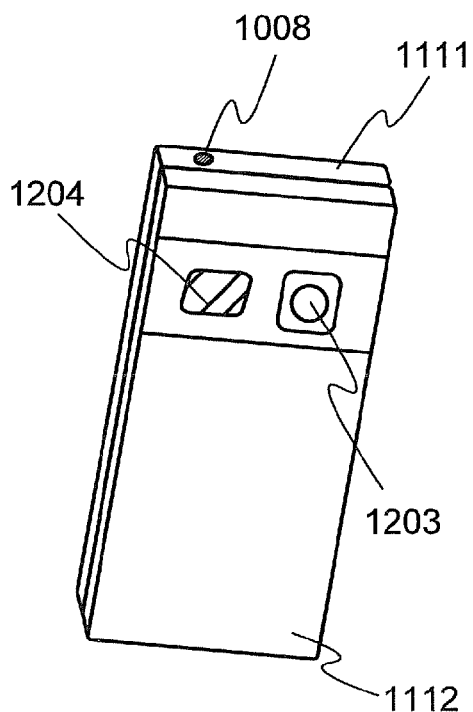
Figure 25C:
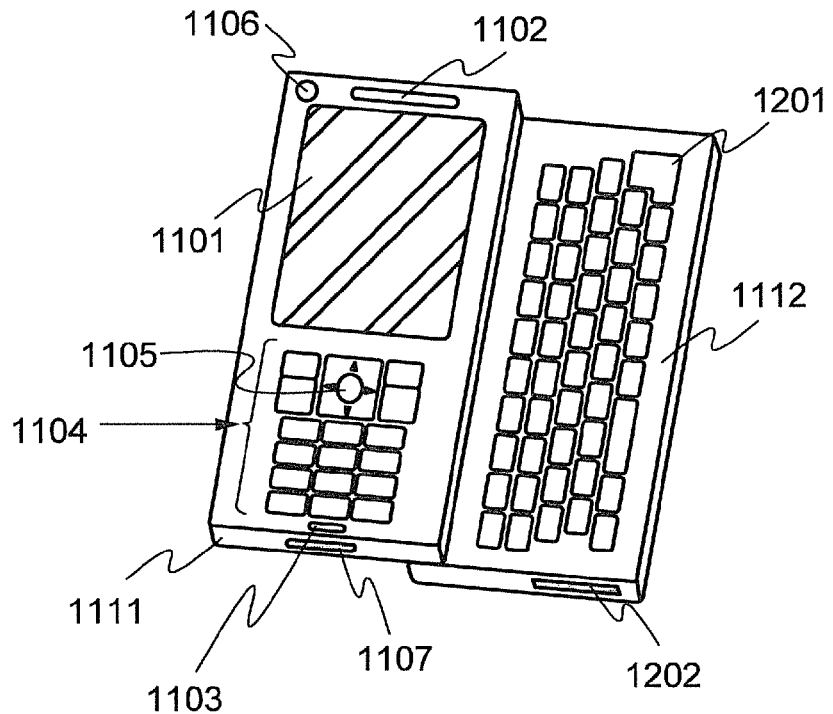

FIGS. 25A to 25C illustrate an example of a structure of a smartphone to which the above embodiment mode is applied. FIG. 25A is a front view, FIG. 25B is a rear view, and FIG. 25C is a development view. The smartphone has two housings 1111 and 1112. The smartphone has both a function of a cellular phone and a function of a portable information terminal, and incorporates a computer provided to conduct a variety of data processing in addition to verbal communication (voice calls).

The housing 1111 includes a display portion 1101, a speaker 1102, a microphone 1103, operation keys 1104, a pointing device 1105, a front camera lens 1106, a jack 1107 for an external connection terminal, an earphone terminal 1008, and the like, while the housing 1112 includes a keyboard 1201, an external memory slot 1202, a rear camera 1203, a light 1204, and the like. In addition, an antenna is incorporated in the housing 1111.

Further, in addition to the above structure, the smartphone may incorporate a non-contact IC chip, a small size memory device, or the like.

The housing 1111 and housing 1112 (FIG. 25A) which are put together to be lapped with each other are developed by sliding as illustrated in FIG. 25C. In the display portion 1101, the display device described in the above embodiment mode can be incorporated, and display direction can be changed depending on a use mode. Because the front camera lens 1106 is provided in the same plane as the display portion 1101, the smartphone can be used as a videophone.

The speaker 1102 and the microphone 1103 can be used for videophone, recording, playback, and the like without being limited to verbal communication. With use of the operation keys 1104, operation of incoming and outgoing calls, simple information input of electronic mails or the like, scrolling of a screen, cursor motion, and the like are possible.

If much information is needed to be treated, such as documentation, use as a portable information terminal, and the like, the use of the keyboard 1201 is convenient. When the housing 1111 and the housing 1112 which are put together to be lapped with each other (FIG. 25A) are developed by sliding as illustrated in FIG. 25C and the smartphone is used as a portable information terminal, smooth operation can be conducted by using the keyboard 1201 and the pointing device 1105. The jack 1107 for an external connection terminal can be connected to an AC adaptor and various types of cables such as a USB cable, and charging and data communication with a personal computer or the like are possible. Moreover, a recording medium is inserted in the external memory slot 1202, so that the smartphone can handle storage and movement of a larger amount of data.

In the rear surface of the housing 1112 (FIG. 25B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above-described functions and structures.

When the display device described in the above embodiment mode is used, mass productivity can be increased. In addition, the size of the smartphone can be reduced.

This application is based on Japanese Patent Application serial no. 2008-034724 filed with Japan Patent Office on Feb. 15, 2008, the entire contents of which are hereby incorporated by reference.

What is claimed is:

1. A display device comprising:
a thin film transistor over a substrate, the thin film transistor including a gate wiring, a gate insulating film over the gate wiring, and a source wiring and a drain wiring over the gate wiring;
a first wiring over the substrate, the first wiring comprising a same material as the gate wiring;
an insulating film over the first wiring, the insulating film comprising a same material as the gate insulating film; and
a second wiring over the insulating film, the second wiring comprising a same material as the source wiring and the drain wiring,
wherein the insulating film includes a depressed portion which is overlapped with the first wiring and the second wiring, wherein the first wiring is not in contact with a bottom of the depressed portion,
wherein part of the second wiring is provided inside the depressed portion, and
wherein the first wiring, the insulating film and the second wiring form a protection circuit.

2. The display device according to claim 1, further comprising a microcrystalline semiconductor film provided between the first wiring and the second wiring.

3. The display device according to claim 1, further comprising a pixel portion including the thin film transistor, and wherein one of the first wiring and the second wiring is electrically connected to the thin film transistor.

4. The display device according to claim 1, further comprising a pixel portion including the thin film transistor and a terminal portion connected to a semiconductor integrated circuit or a flexible printed circuit, and wherein the protection circuit is provided between the pixel portion and the terminal portion.

5. The display device according to claim 1, further comprising a pixel portion including the thin film transistor and a terminal portion connected to a semiconductor integrated circuit or a flexible printed circuit, and wherein the protection circuit, the pixel portion and the terminal portion are provided over the substrate.

6. The display device according to claim 1, wherein the display device is incorporated in one selected from the group consisting of a television device, a cellular phone, and a portable computer.

7. A display device comprising:
- a thin film transistor over a substrate, the thin film transistor including a gate wiring, a gate insulating film over the gate wiring, and a source wiring and a drain wiring over the gate wiring;
- a first wiring over the substrate, the first wiring comprising a same material as the gate wiring;
- an insulating film over the first wiring, the insulating film comprising a same material as the gate insulating film; and
- a second wiring over the insulating film, the second wiring comprising a same material as the source wiring and the drain wiring,
- wherein the insulating film includes a depressed portion which is overlapped with the first wiring and the second wiring, wherein the first wiring is not in contact with a bottom of the depressed portion,
- wherein the first wiring includes an opening portion which is overlapped with the depressed portion,
- wherein part of the second wiring is provided inside the depressed portion, and
- wherein the first wiring, the insulating film and the second wiring form a protection circuit.

8. The display device according to claim 7, further comprising a microcrystalline semiconductor film provided between the first wiring and the second wiring.

9. The display device according to claim 7, further comprising a pixel portion including the thin film transistor, and wherein one of the first wiring and the second wiring is electrically connected to the thin film transistor.

10. The display device according to claim 7, further comprising a pixel portion including the thin film transistor and a terminal portion connected to a semiconductor integrated circuit or a flexible printed circuit, and wherein the protection circuit is provided between the pixel portion and the terminal portion.

11. The display device according to claim 7, further comprising a pixel portion including the thin film transistor and a terminal portion connected to a semiconductor integrated circuit or a flexible printed circuit, and wherein the protection circuit, the pixel portion and the terminal portion are provided over the substrate.

12. The display device according to claim 7, wherein the display device is incorporated in one selected from the group consisting of a television device, a cellular phone, and a portable computer.

* * * * *